United States Patent
Callen et al.

(10) Patent No.: US 11,687,223 B2
(45) Date of Patent: Jun. 27, 2023

(54) CONFIGURING A LOAD CONTROL SYSTEM

(71) Applicant: Lutron Technology Company LLC, Coopersburg, PA (US)

(72) Inventors: John N. Callen, Center Valley, PA (US); Aditya Charan Dara, Allentown, PA (US); Duheng Liang, Bethlehem, PA (US); Justin J. Mierta, Allentown, PA (US); Christopher Spencer, Coopersburg, PA (US)

(73) Assignee: Lutron Technology Company, LLC, Coopersburg, PA (US)

( * ) Notice: Subject to any disclaimer, the term of this patent is extended or adjusted under 35 U.S.C. 154(b) by 4 days.

(21) Appl. No.: 15/870,317

(22) Filed: Jan. 12, 2018

(65) Prior Publication Data

US 2018/0203591 A1 Jul. 19, 2018

Related U.S. Application Data

(60) Provisional application No. 62/446,201, filed on Jan. 13, 2017.

(51) Int. Cl.
| | |
|---|---|
| *G06F 3/0484* | (2013.01) |
| *G06F 3/04847* | (2022.01) |
| *G05B 15/02* | (2006.01) |
| *G06F 3/0482* | (2013.01) |
| *G06F 3/04817* | (2022.01) |
| *G06F 3/04845* | (2022.01) |
| *H05B 47/19* | (2020.01) |
| *G06F 30/00* | (2020.01) |
| *G06F 30/13* | (2020.01) |

(Continued)

(52) U.S. Cl.
CPC ......... *G06F 3/04847* (2013.01); *G05B 15/02* (2013.01); *G06F 3/0482* (2013.01); *G06F 3/04817* (2013.01); *G06F 3/04845* (2013.01); *G06F 30/00* (2020.01); *G06F 30/13* (2020.01); *H05B 47/19* (2020.01); *G06F 3/0486* (2013.01); *G06F 3/04812* (2013.01)

(58) Field of Classification Search
CPC .................. G06F 3/04847; G06F 3/04812
See application file for complete search history.

(56) References Cited

U.S. PATENT DOCUMENTS

| | | | |
|---|---|---|---|
| 6,570,591 B1 * | 5/2003 | Crovetto | G06F 3/04847 |
| | | | 715/763 |
| 2006/0052989 A1 * | 3/2006 | Berwanger | G06F 30/00 |
| | | | 703/6 |

(Continued)

OTHER PUBLICATIONS

MinutesMatter. (Oct. 30, 2013). Minutes Matter Tutorial~Elevation Rendering [Video], YouTube. https://www.youtube.com/watch?v=ZEDzHiXnOjY&t=386s (Year: 2013).*

(Continued)

*Primary Examiner* — Matthew Ell
*Assistant Examiner* — David Tan
(74) *Attorney, Agent, or Firm* — Glen Farbanish; Philip Smith; Michael Czarnecki

(57) ABSTRACT

Systems and methods are disclosed for defining, designing, laying out, and/or configuring for a load control environment a load control system that may include window treatments including, for example, roller shades.

42 Claims, 31 Drawing Sheets

(51) Int. Cl.
G06F 3/0486 (2013.01)
G06F 3/04812 (2022.01)

(56) References Cited

U.S. PATENT DOCUMENTS

| | | | | |
|---|---|---|---|---|
| 2007/0262982 | A1* | 11/2007 | Ninomiya | G06T 19/20 345/419 |
| 2008/0027878 | A1 | 1/2008 | Street et al. | |
| 2008/0154572 | A1* | 6/2008 | Sims | G06F 30/00 703/22 |
| 2010/0268513 | A1* | 10/2010 | Loberg | G06F 30/13 703/1 |
| 2013/0113284 | A1* | 5/2013 | Altonen | H05B 47/105 307/31 |
| 2013/0212513 | A1* | 8/2013 | Loberg | G06F 30/18 715/771 |
| 2014/0349269 | A1* | 11/2014 | Canoy | G06N 20/00 434/322 |
| 2015/0285535 | A1* | 10/2015 | Hall | E06B 9/72 160/1 |
| 2016/0105331 | A1* | 4/2016 | Han | G06F 3/04842 715/736 |
| 2016/0173293 | A1* | 6/2016 | Kennedy | H04L 12/2814 709/222 |
| 2016/0179342 | A1 | 6/2016 | Sarao et al. | |

OTHER PUBLICATIONS

MasterSketchUp. (Mar. 20, 2012). Sketchup Tutorial for Beginners—Part One. YouTube. https://www.youtube.com/watch?v=UsHRGDvN4sM (Year: 2012).*

Anonymous: "Autodesk Homestyler Floor Planner", Jan. 12, 2017, http://www.homestyler.com Retrieved from the Internet: URL: https://web.archive.org/web/20170112114214/http://www.homestyler.com:80/ [retrieved on Mar. 28, 2018].

Anonymous: Elplan app version 3—Introduction:, Jan. 7, 2015, pp. 1-27, Retrieved from the Internet: URL: http://www.nautibus.de/EIB/Bilder/Elplan_v3_Manual.pdf [retrieved on Mar. 28, 2018].

* cited by examiner

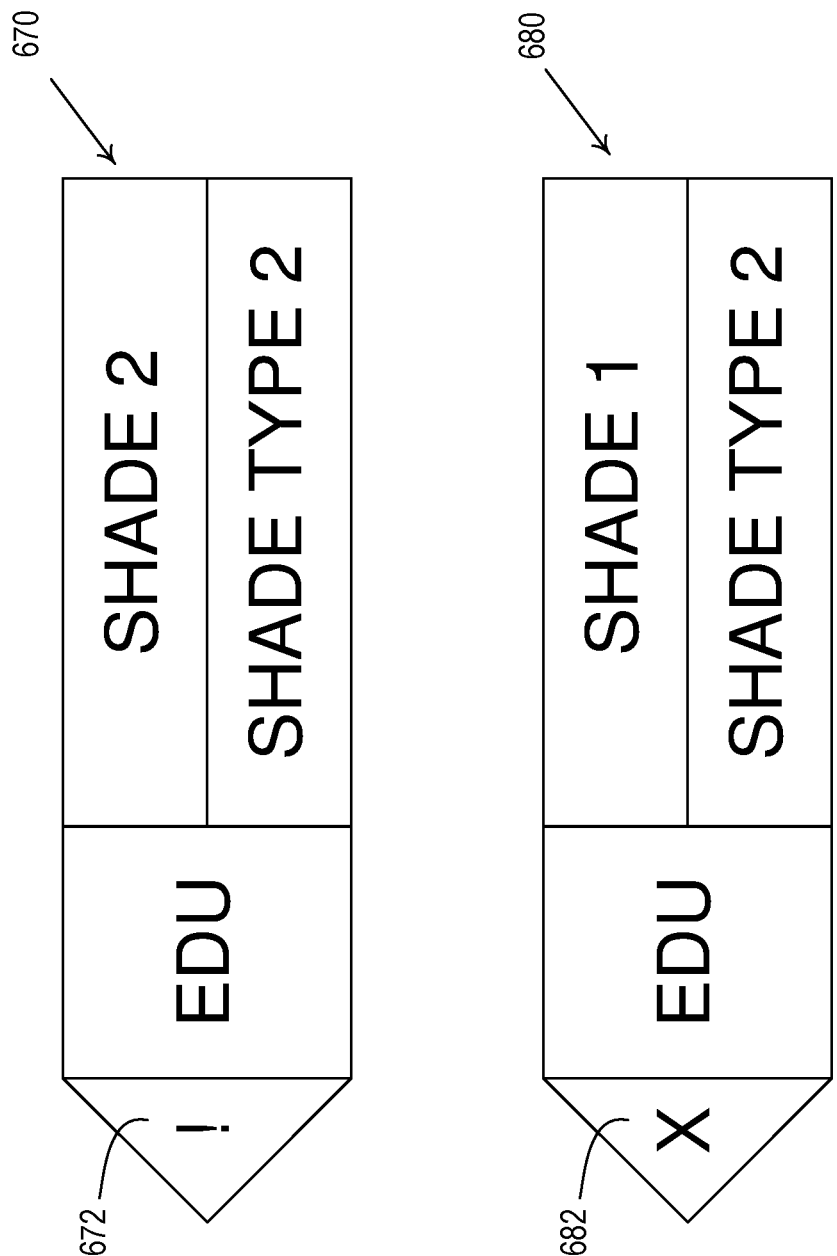

CONFIGURING A LOAD CONTROL SYSTEM

CROSS-REFERENCE TO RELATED APPLICATIONS

This application claims the benefit of U.S. Provisional Patent Application No. 62/446,201, filed Jan. 13, 2017, the entire disclosure of which is incorporated by reference herein.

BACKGROUND

A load control environment, such as a residence or an office building for example, may contain various types of load control systems. For example, a lighting control system may be used to control the lighting loads in the load control environment. A motorized window treatment control system may be used to control the natural light provided to the load control environment. A heating, ventilation, and air-conditioning (HVAC) system may be used to control the temperature in the load control environment.

Each load control system may include various control devices, including control-source devices and control-target devices. The control-target devices may receive messages (e.g., digital messages), from one or more of the control-source devices. The digital messages may include load control messages for controlling an electrical load. The control-target devices may be capable of directly controlling the electrical load. The control-source devices may be capable of indirectly controlling an electrical load via a respective control-target device by sending digital messages to the control-target device that include control instructions for controlling the electrical load controlled by the control-target device. Examples of control-target devices may include lighting control devices (e.g., dimmer switches, electronic switches, ballasts, or light-emitting diode (LED) drivers), motorized window treatments (e.g., motorized roller shades, cellular shades, and/or draperies), temperature control devices (e.g., thermostats), plug-in load control devices, and/or the like. Examples of control-source devices may include remote control devices, occupancy sensors, daylight sensors, temperature sensors, window sensors, and/or the like. To enable a control-target device to recognize instructions received from a control-source device, the control-target device and the control-source device may be associated with one another, such that the control-target device may recognize the digital messages received from the control-source device.

FIG. 1 depicts an example load control environment 102 in which control-source devices and control-target devices of a load control system 100 may be installed and associated. As shown in FIG. 1, the load control environment 102 is a room in a building. The load control system 100 includes control-target devices that are capable of directly controlling an electrical load. For example, the load control system 100 includes a lighting control device 112. The lighting control device 112 may be a ballast, a light emitting diode (LED) driver, a dimmer switch, and/or the like. The lighting control device 112 is capable of directly controlling an amount of power provided to lighting load 114. The load control system 100 includes additional control-target devices, such as a motorized window treatment 116 for directly controlling the covering material 118 (e.g., via an electrical motor), a plug-in load control device 126 for directly controlling a floor lamp 128, a desk lamp, or other electrical load that may be plugged into the plug-in load control device 126, and/or a temperature control device 124 (e.g., thermostat) for directly controlling an HVAC system.

The control-source devices of the example load control system 100 include a remote-control device 122, an occupancy sensor 110, a daylight sensor 108, and a window sensor 120. The control-source devices may send messages (such as wireless or wired digital messages) to associated control-target devices for indirectly controlling a respective electrical load by transmitting messages, such as load control messages, to the control-target devices. The remote-control device 122 may send messages for controlling a control-target device upon actuation of one or more buttons. The occupancy sensor 110 may send messages to a control-target device based on an occupancy or vacancy condition (e.g., movement or lack of movement) that is sensed within its observable area. The daylight sensor 108 may send messages to a control-target device based on a measured amount of light within its observable area. The window sensor 120 may send messages to a control-target device based on the detection of an amount of light received from outside of the load control environment 102. For example, the window sensor 120 may detect when direct sunlight is directly shining into the window sensor 120, is reflected onto the window sensor 120, or is blocked by external means, such as clouds or a building, and may send a message indicating the detected light level. The control-source and target devices may communicate using wireless signals, such as the radio frequency (RF) signals 156.

The control-source devices and/or the control-target devices may be in communication with a system controller 150. The system controller 150 may be capable of transmitting messages (such as wireless or wired digital messages) to and/or receiving messages from control devices, such as control-source devices and control-target devices. The messages may include association information for associating control-source devices and control-target devices. The system controller 150 may store an association table of associated devices locally thereon. The system controller 150 may control the communication of messages from control-source devices to associated control-target devices. Some control devices may be capable of one-way communication, while other control devices may be capable of two-way communication. The system controller 150 may communicate with the control devices using wireless signals, such as the radio frequency (RF) signals 154.

The control-source devices of the load control system 100 may be associated with the control-target devices using various association techniques. For example, in a first association procedure, the control-source devices may be associated with the control-target devices by the user 142 actuating a respective button on the control-source device and the control-target device. The actuation of the buttons on the control-source devices and the control-target devices may put the control-source devices and the control-target devices in an association mode for being associated with one another. In the association mode, the control-source devices may transmit an association message to the control-target devices. The association message from a control-source device may include a unique identifier of the control-source device that the control-target devices store locally thereon, such that the control-target devices are capable of recognizing subsequent messages from the control-source device that include load control instructions. The control-target devices may be capable of responding to the messages from the associated control-source device by controlling a corresponding electrical load according to the load control instructions received in the messages.

In a second example association procedure, control-source devices and control-target devices may be associated by the user 142 creating an association table at a computer 144. The association table may include a table that associates each control-target device with control-source device(s) on the computer 144. The user 142 may upload the association table to the system controller 150. The system controller 150 may then upload the association information for each control-target device in the association table to the control-target device, such that the control-target device may recognize digital messages (such as wireless messages) from the associated control-source devices programmed by the user at the computer 144. The system controller 150 may receive the association table from the computer 144 via WI-FI® signals 152 for example.

SUMMARY

It may be desirable to provide systems that enable and assist a user to define, design, layout, and/or configure a load control system (such as system 100) for a load control environment (such as environment 102).

A method may include displaying to a user on a display terminal a design window that may include a canvas and a palette. The canvas may include a workspace that allows a user to define and design a graphical representation of a load control system. The palette may include a shades pane. The method may include displaying to the user in the shades pane an indication of a shade type, and detecting that the user selects the shade type from the shades pane. The selecting of the shade type may enable the user to define in the canvas a graphical representation of a physical shade of the selected shade type. Subsequent to determining that the user selects the shade type, the method may include determining that the user places a cursor at a first location in the canvas, and determining that the user enters a first command relative to the first location. The first command may include an indication that the user is defining a graphical representation of a physical shade of the selected shade type at the first location. Responsive to the user entering the first command, the method may include displaying to the user in the canvas at the first location an operator icon that represents an operator of the physical shade, and subsequent to displaying the operator icon, determining that the user moves the cursor to a second location in the canvas that is different from the first location. Responsive to determining that the user moves the cursor to the second location, the method may include displaying to the user a first panel icon. The first panel icon may represent a first panel of the physical shade, and the first panel icon may extend from the operator icon to the cursor at least in part. The method may include displaying to the user a numerical value that represents a length of the first panel of the physical shade. The numerical value may change as the cursor moves from the first location to the second location. The method may include determining that the user enters a second command. The second command may include an indication that the user is terminating a defining of the first panel. Subsequent to the second command, the method may include determining whether the user is terminating the defining of the physical shade or is adding a second panel to the physical shade. Responsive to determining that the user is terminating the defining of the physical shade, the method may include displaying to the user in the canvas a tag associated with the graphical representation of the physical shade.

An apparatus may include at least one processor, and may further include at least one tangible non-transitory memory device communicatively coupled to the at least one processor. The at least one tangible non-transitory memory device may have software instructions stored thereon that when executed by the at least one processor direct the at least one processor to display to a user on a display terminal a design window that may include a canvas and a palette. The palette may include a shades pane. The software instructions, when executed by the at least one processor, may further direct the at least one processor to display to the user in the shades pane an indication of a shade type, and to detect that the user selects the shade type from the shades pane. The selecting of the shade type may enable the user to define in the canvas a graphical representation of a physical shade of the selected shade type. Subsequent to determining that the user selects the shade type, the software instructions, when executed by the at least one processor, may further direct the at least one processor to determine that the user places a cursor at a first location in the canvas, and to determine that the user enters a first command relative to the first location. The first command may include an indication that the user is defining a graphical representation of a physical shade of the selected shade type at the first location. Responsive to the user entering the first command, the software instructions, when executed by the at least one processor, may further direct the at least one processor to display to the user in the canvas at the first location an operator icon that represents an operator of the physical shade, and subsequent to displaying the operator icon, to determine that the user moves the cursor to a second location in the canvas that is different from the first location. Responsive to determining that the user moves the cursor to the second location, software instructions, when executed by the at least one processor, may further direct the at least one processor to display to the user a first panel icon. The first panel icon may represent a first panel of the physical shade, and the first panel icon may extend from the operator icon to the cursor at least in part. The software instructions, when executed by the at least one processor, may further direct the at least one processor to display to the user a numerical value that represents a length of the first panel of the physical shade. The numerical value may change as the cursor moves from the first location to the second location. The software instructions, when executed by the at least one processor, may further direct the at least one processor to determine that the user enters a second command. The second command may include an indication that the user is terminating a defining of the first panel. Subsequent to the second command, the software instructions, when executed by the at least one processor, may further direct the at least one processor to determine whether the user is terminating the defining of the physical shade or is adding a second panel to the physical shade. Responsive to determining that the user is terminating the defining of the physical shade, the software instructions, when executed by the at least one processor, may further direct the at least one processor to display to the user in the canvas a tag associated with the graphical representation of the physical shade.

Such methods and systems may have several advantages, such as allowing a user to define graphical representations of load control systems that are easier to read, that create load control system designs that assist installers of such systems, that detect problems and issues with the load control systems as they are being defined, as compared to when they are being manufactured and/or installed, etc. Such advantages may create user efficiencies, for example.

The above advantages and features are of representative embodiments only. They are not to be considered limitations. Additional features and advantages of embodiments

DETAILED DESCRIPTION

Figure 1:
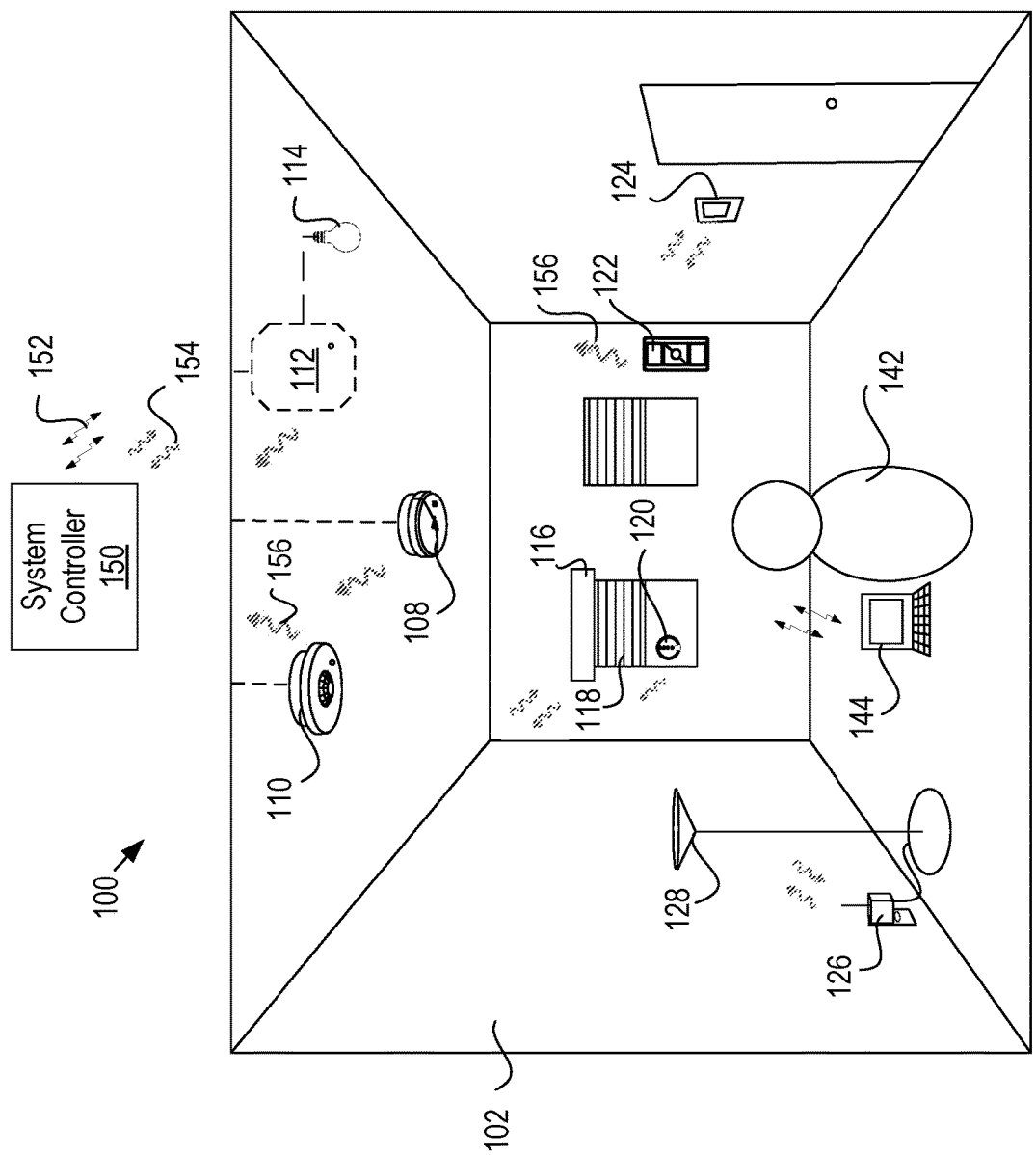
FIG. 1 is a system diagram that illustrates an example load control environment that includes control devices.

A load control system (such as system 100 shown in FIG. 1) for controlling power delivered from a power source, such as an alternating-current (AC) power source or a direct-current (DC) power source, to an electrical load may include control devices, such as control-target devices and control-source devices. A control-target device may be operable to be associated with at least one control-source device. The control-source device may be operable to send association information configured to associate the control-source device with the control-target device (e.g., during an association procedure). For example, the control-source device may send an association message to the control-target device that includes association information, such as a unique identifier (e.g., serial number) of the control-source device for being stored on the control-target device. The control-target device may store the unique identifier of the control-source device and subsequently recognize messages (e.g., wired or wireless digital messages) received from the control-source device that may be transmitted to the control-target device for performing load control. The control-source devices may send control information to the associated control-target devices to control the electrical loads of the control-target devices. Examples of load control systems are described in greater detail in commonly-assigned U.S. Pat. No. 5,905,442, issued May 18, 1999, entitled METHOD AND APPARATUS FOR CONTROLLING AND DETERMINING THE STATUS OF ELECTRICAL DEVICES FROM REMOTE LOCATIONS, and U.S. Pat. No. 8,417,388, issued Apr. 9, 2013, entitled LOAD CONTROL SYSTEM HAVING AN ENERGY SAVINGS MODE, the entire disclosures of which are hereby incorporated by reference.

The load control system may include a system controller that may be operable to receive the association information and may maintain the association between the control-target device and the control-source device when the system controller is integrated into the load control system. The system controller may maintain the association between devices to enable control of the control-target devices by the associated control-source devices after integration of the system controller into the load control system. In some instance, control-source devices may send control information directly to associated control-target devices to control the electrical loads of the control-target devices. In other instances, the system controller may facilitate communication of control information from control-source devices to associated control-target devices using the association information. The system controller may also send control information to control-target devices to control the electrical loads of the control-target devices. The system controller may be a gateway device, a network bridge device, an access point, and/or the like. Examples of load control systems having system controllers are described in greater detail in commonly-assigned U.S. Patent Application Publication No. 2014/0001977, published Jan. 2, 2014, entitled LOAD CONTROL SYSTEM HAVING INDEPENDENTLY-CONTROLLED UNITS RESPONSIVE TO A BROADCAST CONTROLLER, and U.S. Patent Application Publication No. 2015/0185752, published Jul. 2, 2015, entitled WIRELESS LOAD CONTROL SYSTEM, the entire disclosures of which are hereby incorporated by reference.

A user may define, design, layout, and/or configure a load control system (such as system 100) for a load control environment (such as environment 102) using a design system as described herein. For example, a user may use the design system to define a graphical representation of the load control environment (e.g., a room, a floor with one or more rooms, several floors with several rooms, etc.), to define particular electrical devices for the load control system (e.g., electrical loads/fixtures and/or control devices, such as control-source devices and/or control target devices), to select defined electrical devices, to place graphical representations (e.g., icons) of the selected electrical devices within the graphical representation of the load control environment at desired locations within the environment, and to configure selected electrical devices (which may include generating graphical representations of connections (e.g., electrical and/or communication connections) and/or associations between selected electrical devices) to thereby create the load control system.

A user may also use the design system described herein to define particular window treatments, including motorized window treatments (e.g., shades, such as roller shades and/or cellular shades, blinds, such as venetian blinds, draperies, etc.) for the load control system, to select defined window treatments, to place graphical representations (e.g., icons) of the selected window treatments within the graphical representation of the load control environment at desired locations within the environment, and to configure selected window treatments (which may include generating graphical representations of connections and/or associations between selected window treatments and other electrical devices). For description purposes, the design system will be described hereinafter using the term shade or shades to refer to window treatments, but is applicable to other types of window treatments and the use of the term shade or shades is not meant to limit the applicability of the design system. Such a design system may have multiple uses for various types of users of the design system. For example, the graphical representation of the load control environment together with the graphical representation (e.g., icons) of the electrical devices and shades may allow a designer to design and/or layout a load control system and visually convey the resulting design and/or layout to a customer. The design system may generate a list of components (e.g., a bill of materials listing electrical devices, shades, etc.) needed to build the load control system. The graphical representation of the load control system together with the graphical representation of the electrical devices and shades may assist installers/electricians/builders, for example, in installing the actual load control system within the physical/real world load control environment. The connections and/or associations between electrical devices including shades generated by the design system may define the operation of the load control system once the load control system is installed in the physical load control environment and thus assist installers in configuring the load control system once installed. The design system may also generate warnings and errors as a user designs and/or configures a load control system. These are only some example benefits of the design system described herein and one will recognize that the design system need not provide all these benefits and may also provide additional benefits.

The design system described herein may include a design software, which may include computer-based instructions. The design software may include one more software-based modules, including for example, a graphical user interface (GUI) software and a software-based logic engine, which may each include one or more software-based modules. The GUI software may provide a GUI-based interface and/or GUI-based "window(s)" to a user and may allow the user to interact with the design system. The software-based logic engine may provide features of the GUI software and features of the design system in general as described herein, and may further include a database/database system for the storing of design, layout, and/or configuration information, for example, as defined by a user. The design software in whole or in part may reside in one or more computer readable tangible and non-transitory memory devices and may execute from one or more memory devices. Features of the design software may also be provided by firmware and/or hardware in addition to/as an alternative to software-based modules.

The design system may further include one or more computing systems having one or more processors and/or graphic processors that may execute the design software, in addition to other software, such an operating system(s) and/or database management system(s), to provide the features and functions described herein (hereinafter, reference to the design system providing the features and functions described herein may be understood to mean the computing system(s) executing software-based instructions, including the design software, for example, to provide the features and functions described herein). Such computing system(s) may include one or more visual display screen(s)/terminal(s) and/or touch sensitive visual display screen(s) for the displaying of information to a user, and may include one or more input/output devices (e.g., a keyboard, a touch sensitive screen, a touch-sensitive pad, a mouse, a trackball, audio speaker, audio receiver, etc.) for the user to interact with/control the design system. The computing system(s) may further include one or more transceivers and/or communication circuits for communicating over wired and/or wireless commination systems/networks. Example computing system(s) may include a personal computer (PC), a laptop, a tablet, a smart phone, etc. The design system may be a standalone system or in other words, a system where the GUI software, logic engine, and database(s)/database management system(s), for example, execute on a single computing system. The design system may be a distributed system or in other words, a system where the GUI software executes in whole or in part on a first computing system(s), the logic engine executes in whole or in part on another/second computing system(s), and the database(s)/database management system(s) execute in whole or in part on a third computing system(s) with each of the computing systems being networked over a wired and/or wireless communication system/network, and/or some combination thereof. The design system may be a web-based system. The design system may also interface via a communications system/network with one or more other systems (e.g., database(s)/database management system(s)) that may provide, for example, standard electrical devices and shade components that a user may select and thus use to define and thus build/install the actual load control system.

For purposes of description only, user interactions with the design system will be described herein from the perspective of a keyboard and a mouse/mouse cursor (e.g., a pointer), and actuations of one more mouse buttons (e.g., the user using a mouse to move a cursor over a desired icon/feature of a GUI window and activating the feature/icon through one or more mouse clicks/actuations). Nonetheless, one will recognize that the design system is not limited to user interactions via a keyboard and mouse and a user may interact with the design system in other manners including voice commands, touchscreen, etc. In addition, movement of a mouse pointer, actuation of a mouse buttons and/or key board keys may be viewed as the user entering commands to the design system, and the design system detecting or receiving such commands or indications thereof.

Figure 2A:
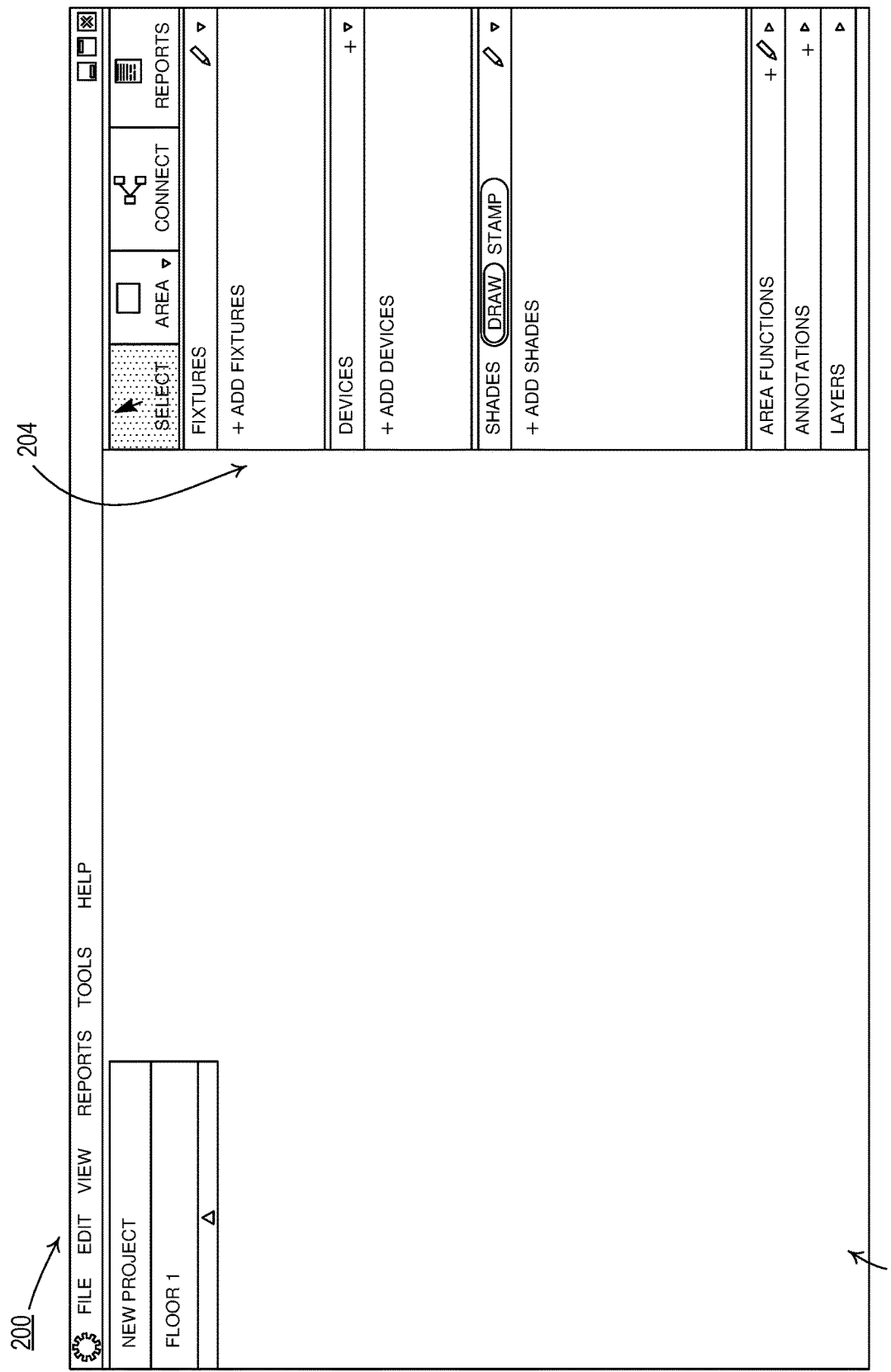
FIGS. 2A-12 illustrate example screenshots of a design system for defining, designing, laying out, and/or configuring a load control system, for example.

Turning to FIG. 2A, there is illustrated an example GUI-based design window 200 that may be displayed on a visual display of the design system by the design software to a user. The design window 200 may include a canvas 202 and a palette 204. The palette 204 may allow and/or enable a user to define/configure electrical loads and/or fixtures (hereinafter referred to as fixtures), to define and/or configure control devices (hereinafter referred to as devices), and to define/configure as shades. The pallet 204 may also allow the user to select defined fixtures, devices, and shades, and to place graphical representations (hereinafter generally referred to as icons, although other representations may be used) of selected fixtures, devices, and/or shades within canvas 202 for defining a graphical representation of a load control system. The canvas 202 may be a workplace and/or workspace on which a user may define, design, layout, and/or configure a graphical representation of a load control system by placing icons of fixtures, devices, and shades selected from the palette 204, and by further configuring such fixtures, devices, and shades (such configuration may include, for example, generating graphical representations of connections and/or associations between selected fixtures, devices, and shades). Hereinafter, the terms canvas, workplace, and workspace will be used interchangeably refer to canvas 202. In general, the fixtures, devices, and shades placed within the canvas 202 and the configuration thereof may define at least in part a desired load control system for a load control environment. Again, a user may interact with the design window 200 (e.g., define, select, place, and configure fixtures, devices, and shades) using one or more of a mouse, trackball, touch sensitive screen, keyboard, speaker/receiver, etc.

With further reference to the canvas 202, the design system may allow or enable a user to import from a database/database management system, for example, one or more graphical representations of a floor plan(s) of a load control environment (e.g., a reflected ceiling or floor plan of a room, of a floor, of several floors, etc.) for which a load control system is being designed. The floor plan(s) may be a top down view of a room(s) or floor(s) (such as from the ceiling looking down) although other representations may be used. As one example, s top down view of a floor plan may be a reflected ceiling view in that fixtures within the room, for example, may be shown on top of/over the floor of the room, or structures within the room, such as tables and desks, etc. Upon selection by the user, the design system may display one or more floor plans selected by the user within the canvas 202. The floor plan(s) may cover all or only part of the canvas 202. The design system may display the floor plan as a background over which a user may define a load control system for the load control environment. In other words, the background may provide a frame of reference for the user to work on. As a user selects fixtures, devices, and shades from palette 204, for example, the user may place the icons representing these selections within the canvas 202 over the displayed floor plan at specific desired locations. The placement of the icons over the floor plan may be viewed as a layout or design in that it may visually show where on a floor plan the fixtures, devices, and shades may need to go once physically installed within a physical/real world load control environment. As indicated, a user may also use the design system to define connections and/or associations between fixtures, devices, and shades. Graphical representations of these connections and/or associations also may be graphically displayed over the background (e.g., through icons depicted as lines). Similarly, the user may define notes and/or annotations and/or the design system may provide warnings, for example, which may also be displayed over the floor plan.

Figure 3A:
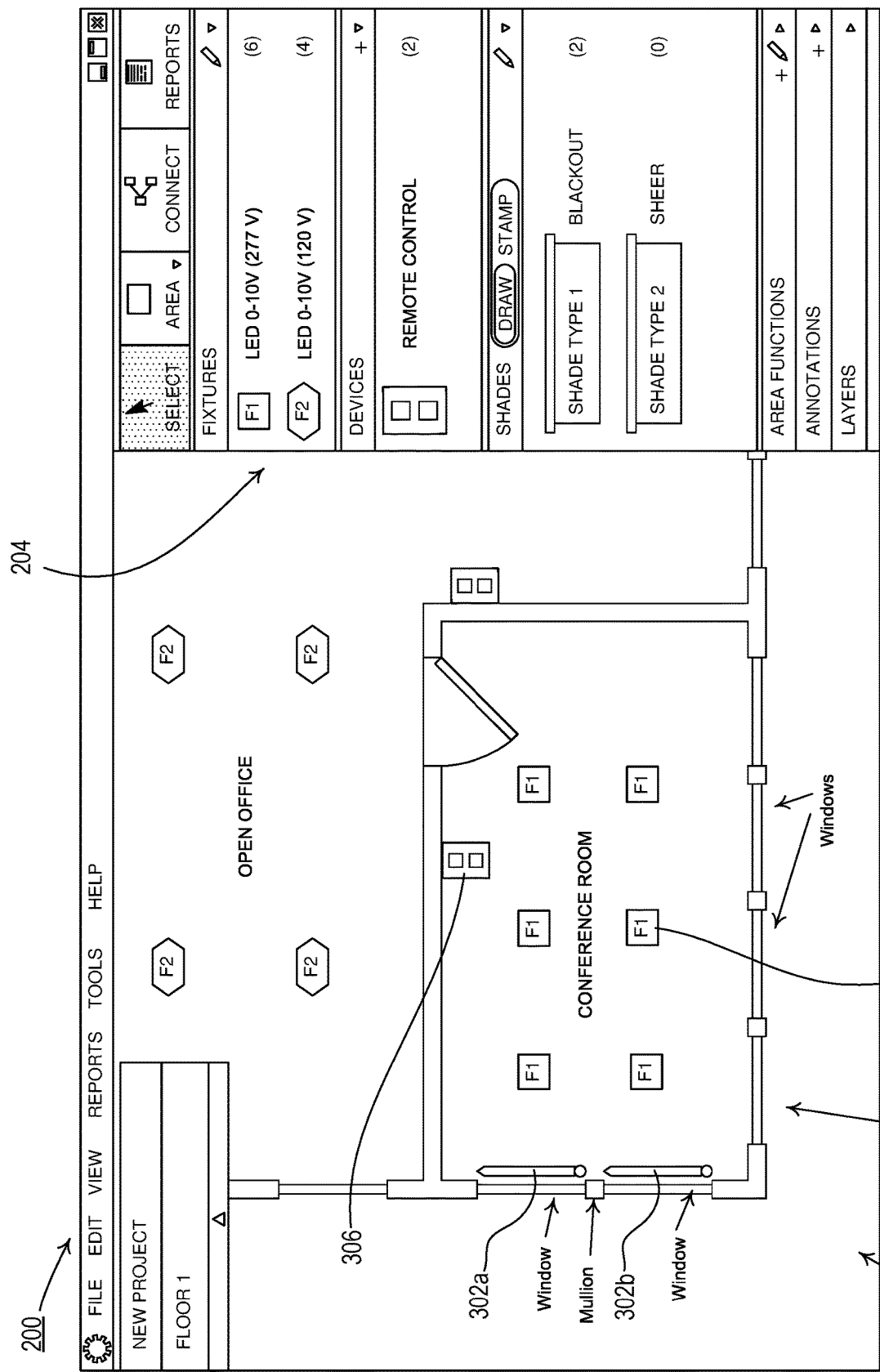

FIG. 3A shows an example of the design window 200 with an imported floor plan 300 shown on the canvas 202, and example graphical representations of devices (e.g., shades 302a and 302b, fixture 304, and device 306). The design system may allow a user to print a graphical representation of a load control system together with a floor plan as defined within the canvas 202. The design system may also allow a user to save (to a database, for example) a load control system defined within the canvas 202 together with a floor plan and at a later time recall the defined load control system and display the load control system and floor plan in the canvas 202. Nonetheless, a user does not necessary need to import/use a floor plan to define a load control system.

Figure 2B:
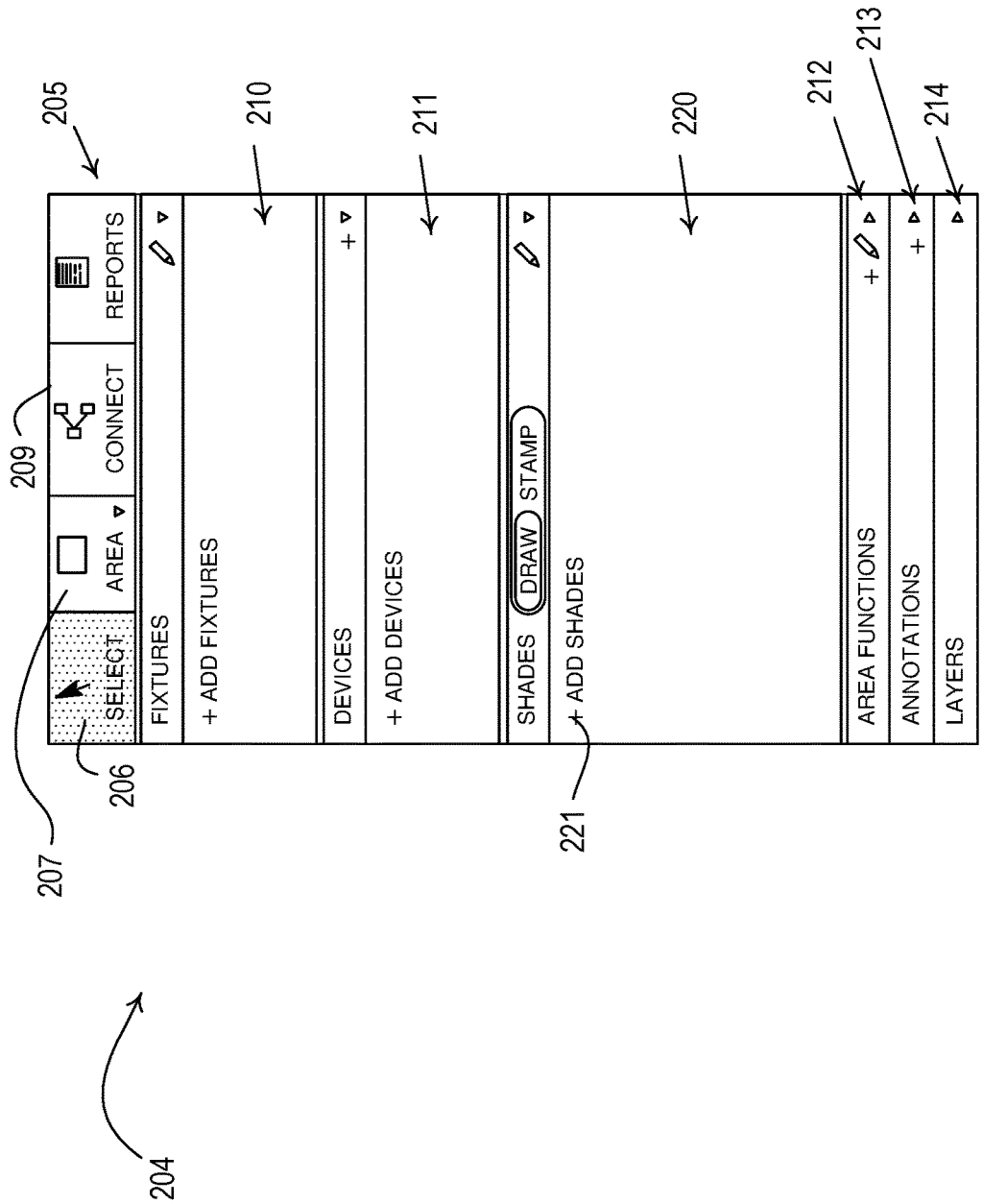

FIG. 2B shows an expanded view of the palette 204 from FIG. 2A. The palette 204 may include multiple sections, including a control pane 205, a fixtures pane 210, a devices pane 211, a shades pane 220, an area functions pane 212, an annotations pane 213, and a layers pane 214, although fewer and/or additional sections may be included. The sections may be individually expanded and contracted, with the fixtures pane 210, the devices pane 211, and the shades pane 220 being shown as expanded and the area functions pane 212, the annotations pane 213, and the layers pane 214 being shown as contracted. The fixtures pane 210 and the devices pane 211 may allow a user to define and/or configure specific fixtures and load control devices for the load control system, to select instances of defined fixtures and devices, and to place icons representing the selected fixtures and devices within the canvas 202, where the icons represent instances of physical fixtures and devices to be installed within the load control system. The shades pane 220 may allow a user to define and/or configure specific shades for the load control system, to select instances of defined shades, and to then place icons representing selected shades within the canvas 202, where again the icons represent instances of physical shades to be installed within the load control system. Again, the canvas 202, in addition to defining the components of the load control system as the user places selected icons within the canvas 202, may also show and thereby define the layout of the load control system because the icons may be placed at specific locations within the canvas 202 with respect to a displayed background, for example. One will recognize the design system does not need to include, for example, the fixtures pane 210, the devices pane 211, and the shades pane 220 and may only include shades pane 220 and thus be a shades design tool, for example.

The control pane 205 may include a select control tool 206 that, when the design system determines is activated by a user (e.g., by mouse), may allow a user to select a particular icon(s), for example, within the canvas 202. Once selected, the design system may allow a user to move the icon, redefine features of the fixture, device, or shade that may be represented by the icon, copy the icon to place an addition fixture, device, or shade within the canvas 202, delete the icon, etc.

Figure 3B:
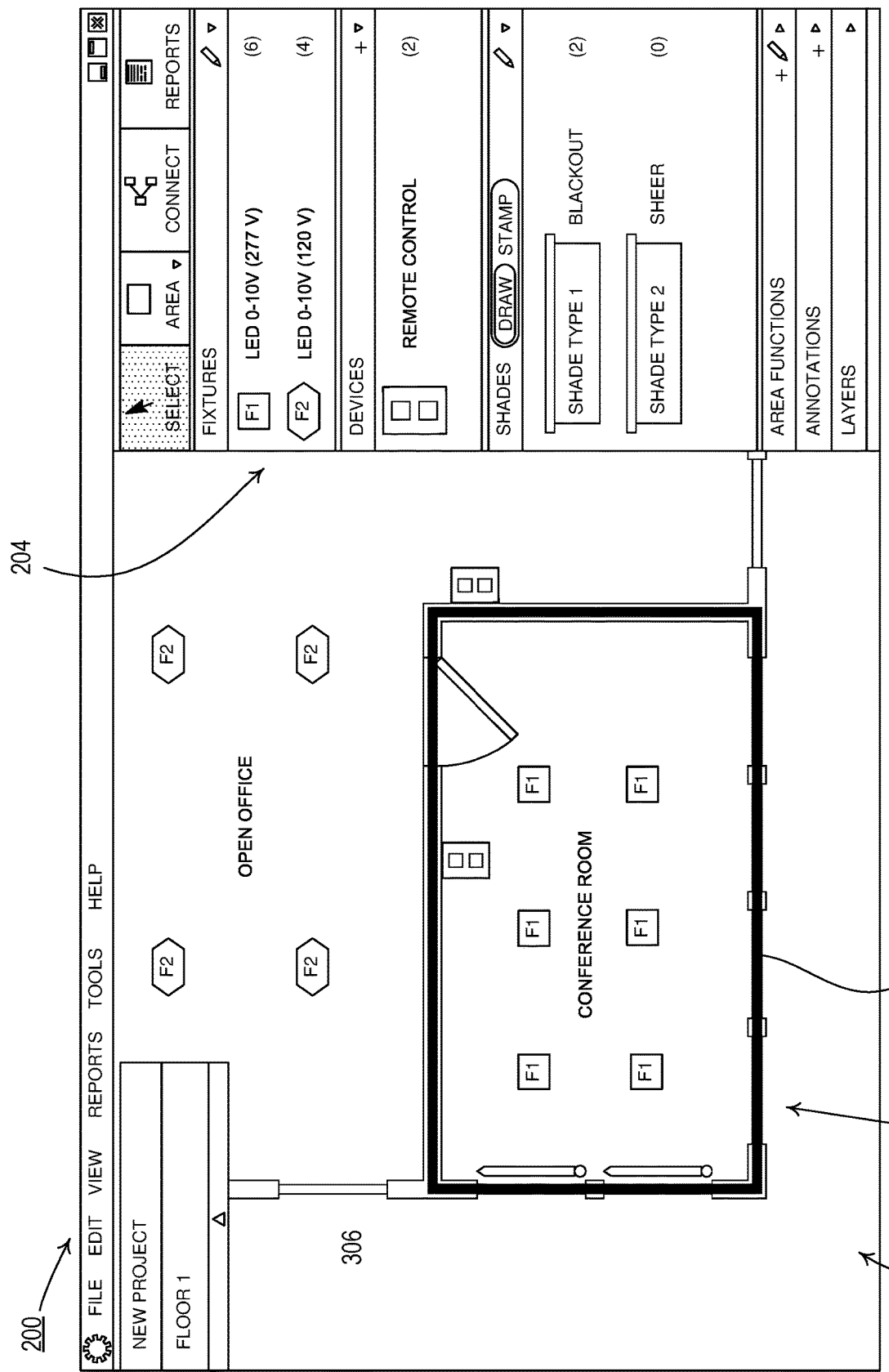

The control pane 205 may also include an area control tool 207 that, when the design system determines is activated by a user, may allow the user to define and/or draw an area within the canvas 202. An area may be a geometric shape that may allow the user to define a space or room, for example, within a load control environment that is of particular interest to the user. The design system may allow the user to define the size and shape of an area. The shape of an area may include a box or rectangle or oval, although a user may define any shape. The user may use area control tool 207 to define and/or draw a geometric shape within the canvas 202, such as by drawing the shape over a specific area (e.g., a room) of a displayed floor plan. For example, as shown in FIG. 3B, the canvas 202 includes a defined area (named "Conference room") 302 imposed over the floor plan 300. Nonetheless, a floor plan does not necessarily need to be displayed in the canvas 202 to draw an area. Hence, a user may use an area to define a particular space or room within a load control environment (here a conference room).

Once an area(s) is defined through area control tool 207, the design system may allow the user to then define fixtures, devices, and shades, for example, for each area using fixtures pane 210, devices pane 211, and the shades pane 220 by placing icons of selected fixtures, devices, and shades within the defined area. In other words, the area control tool 207 may be viewed as a tool to subdivide a load control environment into subspaces or subareas and to then define the load control system on a subspace or subarea perspective. Specifically, once an area is defined (and possibly named by a user) and once selected fixtures, devices, and/or shades are placed in the defined area, the design system may associate the defined area and the selected fixtures, devices, and shades together such that a user may view and examine the components of the load control system from a per area perspective—for example, what fixtures, devices, and/or shades are in a particular room. For ease of viewing, the figures herein may be shown as including a defined area without showing a floor plan background. Again, a floor plan may or may not be shown within the canvas 202, as a user may desire. One will also recognize that a once an area is defined, it may be modified or deleted by the user at any time. In addition, a user does not need to define an area for the design system to allow the user to define fixtures, devices, and shades. Furthermore, if an area is used, it may be defined first and then fixtures, devices, and/or shades defined. Alternatively, fixtures, devices, and/or shades may be defined first and then an area defined, or some combination thereof.

The control pane 205 may also include a connect control tool 209 that, when the design system determines is activated by a user, may allow the user to define and/or generate graphical representations of connections (e.g., electrical and/or communication connections) and/or associations between fixtures, devices, and shades for example, that are defined in the canvas 202 to the thereby create the load control system.

Examples of how the design system discussed herein may be used to define and/or configure a load control system using the fixtures pane 210 and the devices pane 211, for example, are described in commonly-assigned U.S. Patent Application Publication No. 2017/0228110, published Aug. 10, 2017, entitled CONFIGURING A LOAD CONTROL SYSTEM, the entire disclosure of which is hereby incorporated by reference.

Turning now to the shades pane 220, this pane may allow a user to define, design, layout, and/or configure one or more shades for a load control system of a load control environment. As indicated, the design system may support different styles of shades including, for example, roller shades, cellular shades, roman shades, venetian blinds, draperies, etc. (again, the term shades being used herein to generally refer to various types of window treatments). For ease of description, the design system will be described using roller shades (which may also be referred to herein shades) but is applicable to other types of window treatments and the use of the term roller shade or shade is not meant to limit the applicability of the system. Before describing the shades pane 220, a description of roller shades will first be provided.

In general, a roller shade may be considered to include one or more roller tubes (which may also be referred to herein as rollers), one or more panels (e.g., sections of shade fabric), an operator (which may also be referred to herein as a drive unit or motor drive unit), and one or more couplers, in addition to hardware that may be needed to connect the roller tube and the operator to a physical structure (such as mounting hardware and mounting brackets, etc.). One will recognize that a shade may include other components (such as hembars, top treatments, etc.).

In a simplest form, a roller shade may include one roller tube (roller tube and roller may be used interchangeably herein), one panel, and an operator. A panel may be the physical covering material (e.g., shade fabric) that is used to cover a window of a building or a portion thereof. The material from which a panel is made may include any material such as fabric, plastic, metal, wood, etc. (hereinafter, the term fabric will be used to generically refer to the material out of which panels may be made). For a given load control system, a user may define multiple roller shades having different fabrics, as further discussed below. Different fabrics may have varying openness (e.g., fabrics may be sheer, blackout, etc.). For a given application, multiple shades may be mounted over a given window, with the panel of one shade being made from one material and the panel of another shade being made from another material, for example. Such shade combinations may be situated one in front of the other and independently operated. A panel may have a horizontal length/width and vertical height, depending on the window the shade is designed to cover for example. Panels may have different weights depending upon the fabrics/material from which they are made.

A panel may be connected to and supported and/or carried by a roller tube, which may be a cylindrical tube or rod, although other shapes may be used. A roller tube may have the same physical length or approximate same physical length as the horizontal length of the panel that it carries. A shade may be constructed such that the roller rotates in opposite directions (e.g., clockwise and counterclockwise) with the panel wound around/upon the roller. In this fashion, as a roller is spun or rotated, a panel may be raised and lowered as it is wound and unwound from around the roller thereby opening and closing the shade, respectively. The material from which a roller is constructed and/or the diameter of a roller may depend upon the weight of the panel it carries, the length/height of the panel, and/or the style of the shade, although other factors may also dictate the material and/or diameter.

A shade my also include an operator that may be connected to the roller tube and that may be used to control the shade, i.e., to open and close the shade by the raising and lowering of the panel. The operator may be a manual operator that allows a user to manually control the panel. The operator may be an AC motor or a DC motor that allows a user to electrically control a panel using a control device for example. A motor-type operator may be externally powered via an external power source, and/or may be battery-powered. A motor-type operator may also allow a user to manually control a panel. A motor-type operator may be controllable via wireless and/or wired-based communication networks. Different operators may be used depending on the length and/or weight and/or style of the panel, roller, and/or shade that the operator is meant to operate. The operator may be located at one end (e.g., left or right side) of the roller. Regardless of the end at which the operator is situated, it may reside external to the roller, or it may be situated at least partially within the roller itself. The side at which the operator is placed may depend on the physical space/room in which the shade is being installed and/or on the desires of a user. From a nomenclature perspective, once a shade is installed on a window and a user is facing the window from the inside of a space, area, and/or room looking out the window, the operator may be a left side operator if the operator is on the left side (i.e., end) of the shade from the perspective of the user. Similarly, the operator may be a right side operator if the operator is on the right side (i.e., end) of the shade from the perspective of the user. Other shades may have the operator located within the roller, such as at the middle of the roller.

Depending on a particular application (e.g., number of windows, length of a window(s), etc.), a shade may be a multi-panel shade and include multiple roller and/or panel combinations connected in a linear configuration using one or more couplers. Not all rollers and/or panels of the multi-panel shade need be the same horizontal length. Preferably, each panel is the same height but do not need to be. Here, couplers may be placed at the ends of rollers to connect adjacent roller and/or panel combinations. For example, a first coupler may be used to connect a right side (i.e., end) of a first roller and/or panel to a left side (i.e., end) of a second roller and/or panel, a second coupler may be used to connect the right side of the second roller and/or panel to left side of a third roller and/or panel etc. An operator may then be placed at either the left side of the first roller and/or panel or at the right side of the third roller and/or panel, for example. Using the couplers, the operator may simultaneously control all rollers/panels of the shade. Again, the same nomenclature as described above may be used to indicate whether the operator is a left or right side operator. In addition, the materials, diameters, and/or types of rollers and operator used to make a multi-panel shade may depend on the shades weight, length, and/or style, for example.

One will recognize that other shade styles may operate in a similar fashion. For example, a venetian blind style of shade may be constructed from multiple sections of venetian blinds each connected by a coupler and with one of the sections having an operator (e.g., manual or electric) that controls all sections.

Figure 2C:
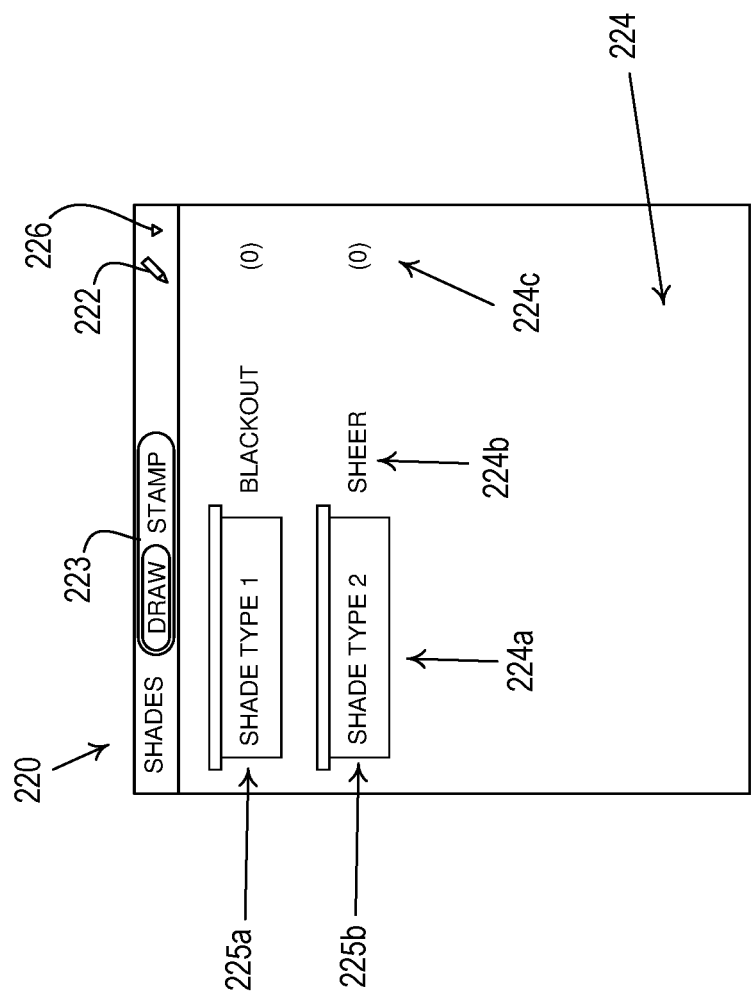
Figure 4:
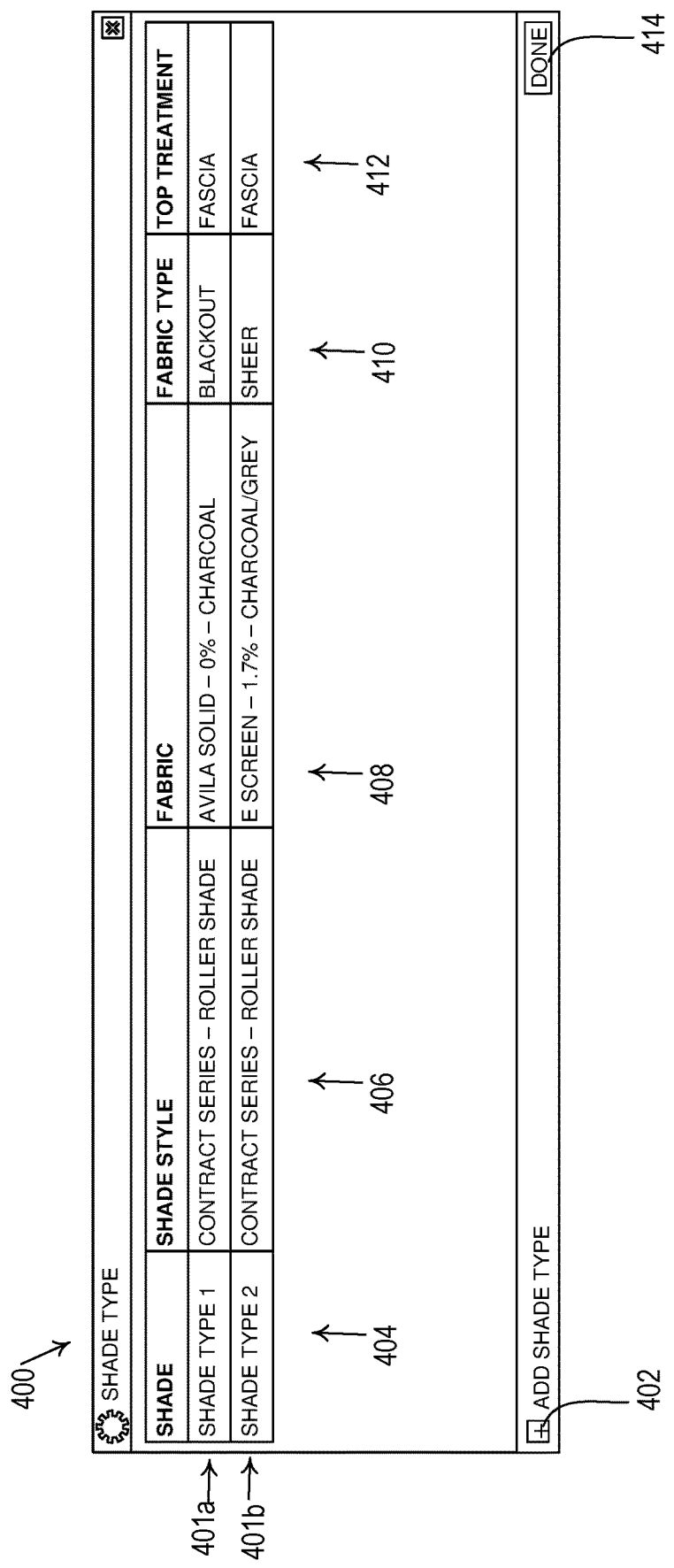

Turing now to FIG. 2C, there is shown an expanded view of the shades pane 220 of the palette 204. The shades pane 220 may include a draw/stamp icon 223, a shade definition or edit icon 222, a shade type section 224, and an expand contract icon 226. The shade definition icon 222 may allow a user to define one or more shade types with a shade type being for example, a shade style with a defined type of material used to cover a window (which is further explained below regarding FIG. 4). A shade definition icon 221 on the shades pane 220 shown in FIG. 2B may also provide a similar function as the shade definition icon 222 shown in FIG. 2C. Once defined, a shade type may appear in the shade type section 224, with each row (225a, 225b, etc.) of the shade type section representing and/or providing an indication of a defined shade type. For example, in FIG. 2C, two shade types have been defined (e.g., using a window 400 as shown in FIG. 4 and discussed below). The design system may be configured to define, at least partially, one or more default shade types that may appear in the shade type section 224 when a user starts up the design system and/or begins designing a new load control system. As another example, the design system may allow a user to define (at least partially) one or more default shade types that may appear in the shade type section 224 each time the user uses the design system. As another example, as a user uses the design system and defines different shade types, these may be automatically saved and appear in the shade type section 224 each time the user uses the design system. Other examples and variations are possible.

A user may select one of the defined shade types in the shade type section 224 and then place an instance of that shade type in the canvas 202 as described below. For each shade type 225a and 225b, the shade type section 224 may include a shade type name 224a (as provided by the design system and/or user), the type of material from which the shade is made (e.g., the type of fabric from which the panel is made for a roller shade, such as sheer or blackout; the type of material from which the slates are made for a roman or venetian shade, such as metal, plastic, or wood), and the number 224c of that shade type the user has included thus far in the load control system and placed in the canvas 202. Other and/or fewer fields may be used. According to a further aspect, the design system may associate a different color with each shade type, such as by showing the shade type name 224a in a different colored box, different gray scale, etc., for example. As further discussed below, as a user selects a given shade type from the shade type section 224 and places the shade in the canvas 202, a representation of that shade may be shown in the shade type section 224. Selection of the expand contract icon 226 by the user may cause the design system to expand and contract the shades pane 220.

Assuming the design system detects that the user has selected the shade definition icon 222 or 221 (e.g., by mouse actuation), the design system may display to the user an example shade definition window 400 as shown in FIG. 4. The shade definition window 400 may allow the user to define one or more shade types (as shown by example rows 401a and 401b) with each row of the window representing a different shade type. Shades that have already been defined (and that therefore appear in the shade type section 224) may be shown by the design system in the shade definition window 400, thereby allowing the user to modify a previously defined shade type. Through selection of an add shade type icon 402 by the user, the design system may add an additional row to the shade definition window 400, thereby allowing the user to define a new shade type. The user may provide the following information with respect to each shade type.

The user may provide the shade type with a name (as represented by column 404) or the design system may provide a default name. As an example, this name value may be used by the design system as the shade type name 224a of FIG. 2C.

The user may select from one or more shade styles (as represented by column 406), which may be a drop-down menu from which the user may select a shade style (e.g., a roller shade, a cellular shade, a roman shade, a venetian blind, a drapery, etc.). In selecting a shade style for the shade type, a user may select an operator type, such as motorized or manual. When the operator is a motorized operator, in selecting a shade style a user may select whether the motorized operator is controllable via wireless or wired communication networks, etc.

The user may select from one or more shade fabrics (as represented by column 408), which may be a drop-down menu of shade fabrics for a user to select from and with all shade styles not necessarily having this option.

The user may select from one or more fabric types (as represented by column 410), which may be a drop-down menu from which the user may select a fabric type (e.g., sheer or blackout for shades made of fabric; aluminum or wood slates for venetian blinds; etc.). As another alternative, the design system may determine this field based on the shade style 406 and/or selected fabric 408.

The user may select from one or more top treatment types (as represented by column 412), which may be a drop-down menu from which the user may select top treatment types (e.g., none, fascia, top-back cover, etc.).

The shade definition window 400 may allow a user to define other fields (such as hem bar style) and/or may include only a subset of the fields shown in FIG. 4. The shade definition window 400 may also allow a user to delete/remove one or more rows and thus remove one or more shade types from the shade type section 224. Upon selection of a done icon 414 by the user for example, the design system may save the shade types defined, updated, and/or removed by the user, close the shade definition window 400, and update the shade type section 224 appropriately (e.g., display new shade types).

Figure 5:
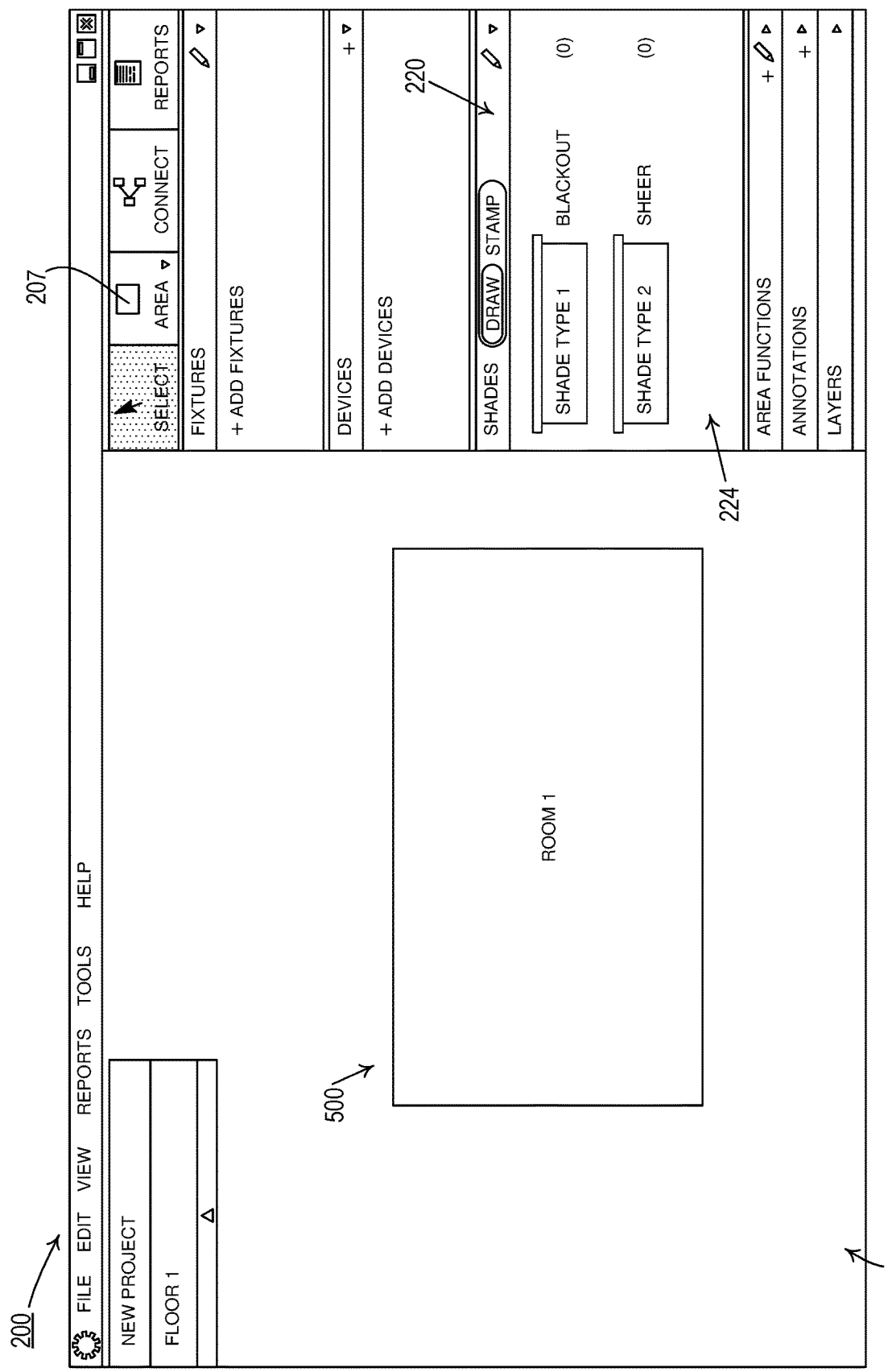

After completing the definition of one or more shade types, a user may next select (e.g., by mouse) the area control tool 207, may move a mouse cursor to the canvas 202, and then through movement of the mouse and possibly through actuation of a mouse button may define and/or draw an area within the canvas 202, thereby representing an area (e.g., a space, and/or room) to which the user wishes to add shades (again, the user may draw this area over a displayed background of a floor plan, such as shown in FIGS. 3A and 3B). FIG. 5 shows an example area 500 that a user may define and/or draw in the canvas 202. Again, one will recognize that the area 500 may be drawn in other fashions. Again, one will recognize that a user does need to define an area to defines shades in the canvas 202.

Figure 6A:
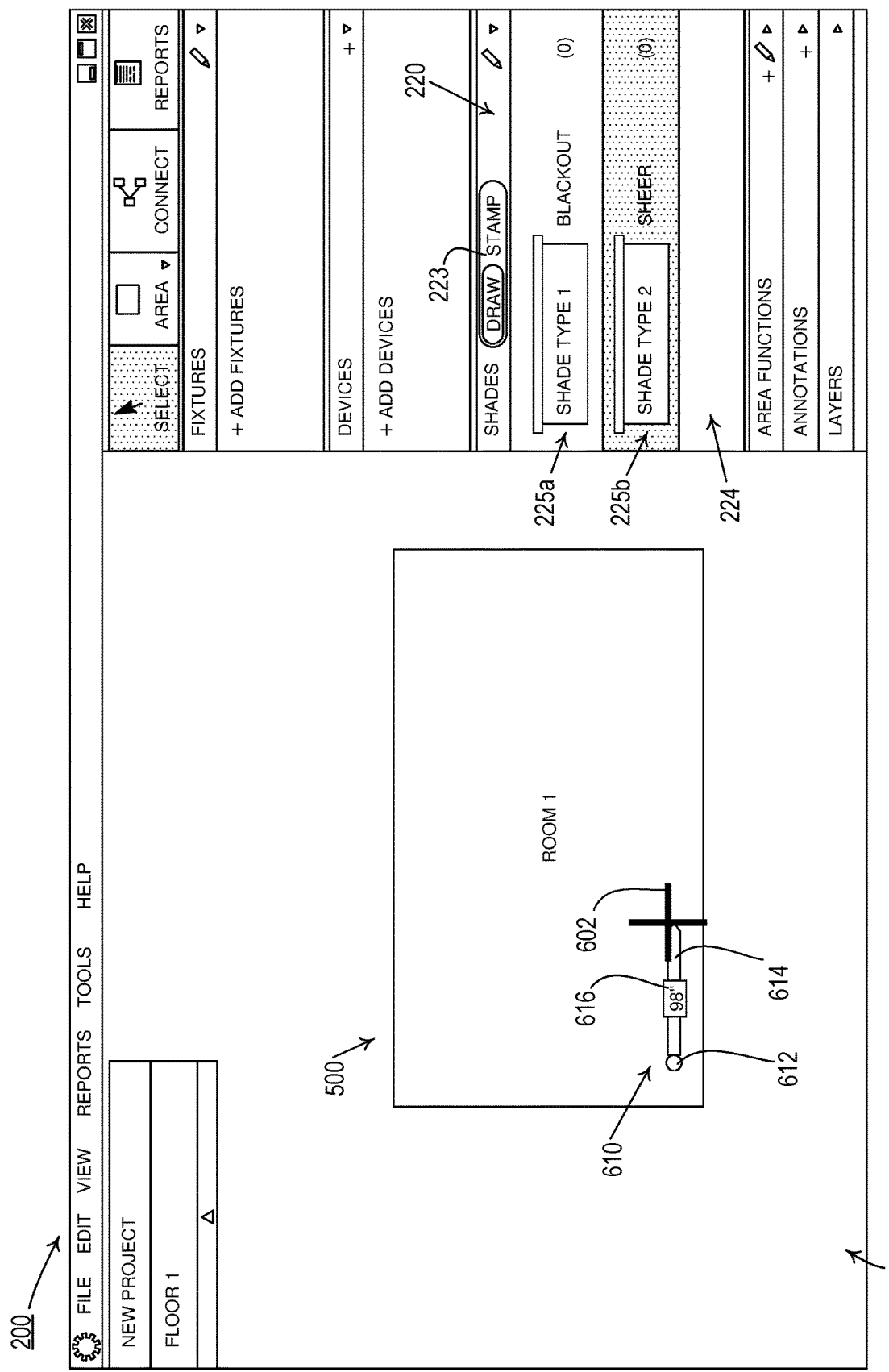

As indicted, the shades pane 220 may include draw/stamp control icon 223 (as shown in FIG. 2C for example). Draw/stamp control icon 223 allows a user to define shades in the canvas 202 in two different fashions—by either drawing the shade (when the "draw" control is activated) or placing/stamping an icon of a shade (when the "stamp" control is activated). The process for "drawing" shades in canvas 202 will be described first (as shown in FIG. 2C the draw control is active), followed by a process for stamping shades. Turning now to FIGS. 6A-6H, an example procedure for defining a single panel shade (by drawing the shade) for a load control system is described. Beginning with FIG. 6A, a user may select from shade type section 224 a defined shade type 225a or 225b. The design system may highlight to the user the selected shade type upon the user making the selection—here, row 225b is highlighted, for example. Thereafter, the user may move a cursor 602 (e.g., a mouse cursor) to the canvas 202 in the beginning efforts of placing a specific shade of the selected shade type within the load control system under design. Upon detecting the cursor 602 has moved to the canvas 202, the design system may change the cursor to a different form. For example, the system may change the cursor 602 from a pointer/arrow to cross-hairs as shown in FIG. 6A. Thereafter, the user may move the cursor 602 to a desired location at which the user would like to place a shade 610, and actuate the mouse button. The location may be within a specific location of the area 500, for example, adjacent to a window within the defined area. In this fashion, a user may not only be defining a shade for the load control system, but defining a specific location within a load control environment, thereby providing a visual layout of the shade that may be useful to designers, installers, etc.

Upon detecting actuation of the mouse button (which may include, for example, pressing and/or pressing and releasing the mouse button), the design system may display at the location of the cursor 602 an operator icon 612 (here a round circle although any shape may be used). The design system may use the operator icon 612 to represent to the user the location (e.g., left-side or right-side) of the shade operator (e.g., manual or motor drive unit) for the shade 610 the user is presently defining. The operator icon 612 may be of any color, such as red, to help designate/readily show the location of the operator. Thereafter, the user may drag/move the mouse cursor in any direction. As the user drags the cursor, the design system may detect the movement and draw a panel icon 614 (e.g., an elongated rectangular icon such as a line, although shaped icons may be used) extending from the operator icon 612 towards the cursor 602. The panel icon 614 may represent a panel and/or roller of the shade 610. As one example, a user may press and release the mouse button to cause the design system to display operator icon 612, and may thereafter drag or move the mouse cursor without having to press the mouse button, with the design system drawing the panel icon 614 as the cursor is moved. Other examples are possible. The panel icon 614 may be of any color, preferably a color different from the operator icon 612. If a color is associated with a shade type as shown in the shade type section 224 as discussed above, the design system may use the same color for the panel icon 614. This way, a user may easily determine which specific shade types are defined within the canvas 202.

The design system may use the panel icon 614 to represent and/or display to the user the linear length of the panel being defined of the shade 610 and the location of the shade 610 in general. As the user drags the cursor 602, the design system may also display to the user a numerical representation 616 of the length of the panel represented by panel icon 614 of the shade 610 (as shown here by a numerical length of 98"). The numerical representation 616 of the length may be a real-world representation of the length of the shade panel that may be used in the actual physical space the designed shade is to be placed in the real world. In other words, numerical representation 616 may be the length of the physical covering material that is used to cover a window. One will recognize that the length of the shade 610 itself may be longer than the numerical representation 616 in that a completed shade may include a roller that extends beyond the panel, and may further include mounting hardware, etc. According to another example, numerical representation 616 may include any portion of a roller that may extend beyond the panel, and/or may further include mounting hardware, etc. The design system may dynamically increase the numerical representation 616 of the length of the shade panel as the user moves the cursor 602 away from the operator icon 612 (i.e., as the panel icon 614 and thus the shade 610 gets longer), and may similarly dynamically decrease the numerical representation 616 of the shade panel as the user moves the cursor 602 towards the operator icon 612 (i.e., as the panel icon 614 and thus the shade 610 gets shorter). According to one aspect of the design system, the design system may determine the numerical representation 616 of the panel based on a defined scale and/or conversion with the design system detecting and/or determining the length of the panel within the canvas 202 and using the defined scale and/or conversion to convert that length to the real-world length as shown by the numerical representation 616. More specifically, the scale and displayed numerical representation 616 may be used to provide the user with and/or for the user to specify an actual real-world length for the panel. The design system may also use the actual real-world length for the panel as represented by the numerical representation 616 to determine if there is an error or issue with the defined shade, as discussed below.

One example scaling system is as follows, although other systems may be used. According to this example, the design system may be configured such that a defined number "x" of linear pixels within the canvas 202 represents a linear length "y" within the design system (e.g., 50 pixels is equal to 0.5 inches) (this conversion may be set by an administrator of the design system and may be dependent on the actual system used to execute the design software). The design system may be further configured such that each linear length "y" within the design system represents a real-world length "z" (e.g., 0.5 inches is equal to 48 inches). In this fashion, as a user draws a shade 610, the design system may determine the number of linear pixels making up the panel icon 614 (i.e., needed to draw and/or represent the shade), and convert that number to a representative real-world length (e.g., as shown by numerical representation 616) using the scale. Any scale-metric may be used (inches, feet, yards, centimeters, meters, etc.). The design system may default the "y" to "z" scale/conversion to pre-set values with the user being allowed to modify the scale.

Figure 6B:
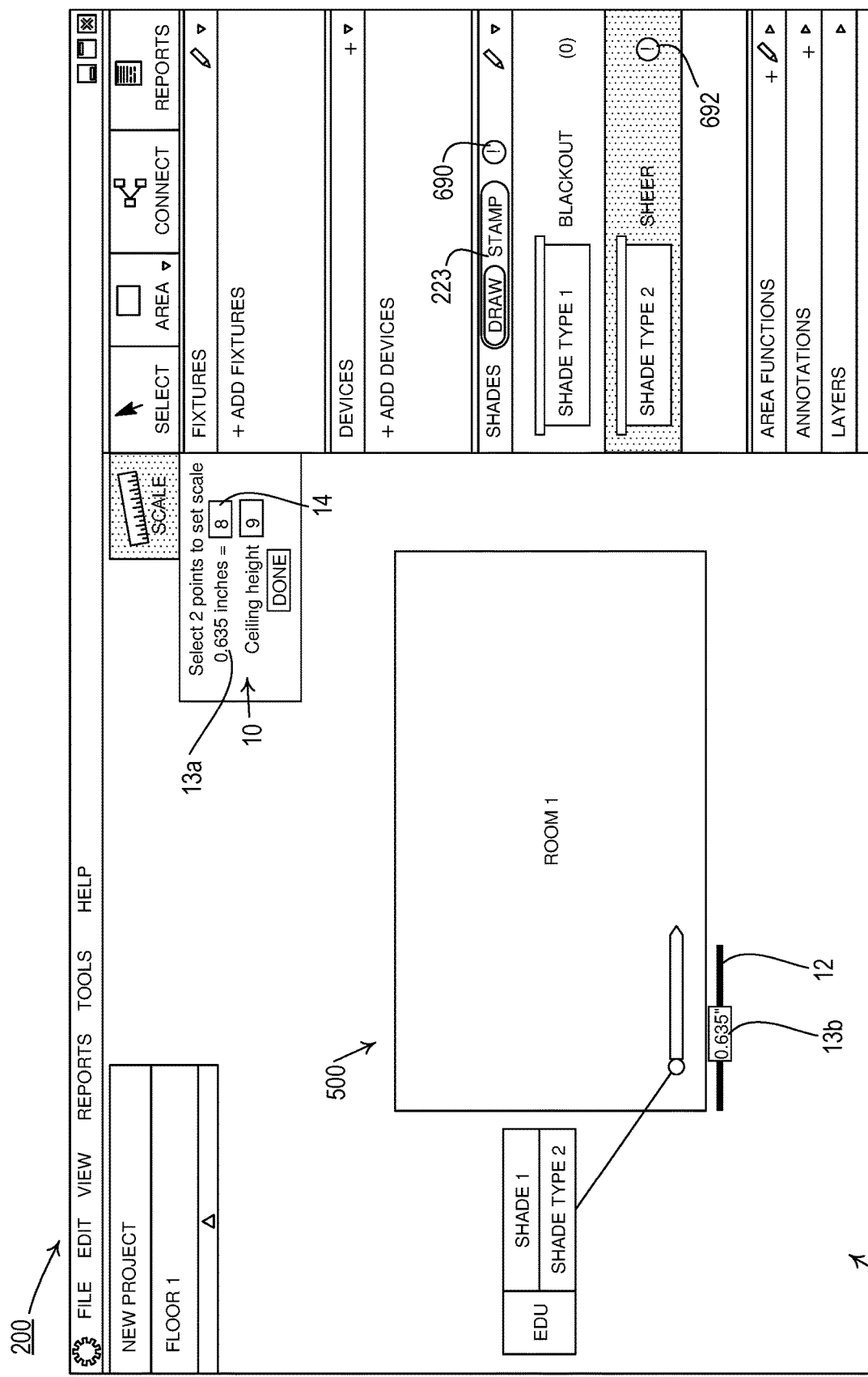

According to one example, as shown in FIG. 6B the design system may provide the user with a scale tool 10 that allows the user to define the "y" to "z" scale. Here, the design system may allow the user through use of a mouse, for example, to draw a linear length 12 with the design system providing a linear measurement of that length as shown by 13a and 13b (which may be the same value). The value shown by 13a and 13b may be determined by the design system based on a pixel to length conversion (defined as the "x" to "y" conversion above) with the value shown by 13a and 13b being the "y" value. Once drawing the length 12 to a desired length, the user may then define (using field 14) a conversion for the value shown by 13a and 13b to a real-world length (i.e., defined as the "y" to "z" conversion above) (in this example, 0.635 inches is equal to 8 inches, for example). Alternatively, when the user activates tool 10, the design system may auto-set the value shown by 13a and allow the user to set a field 14. One will recognize that other scales and conversions may be used, and other means of defining scales and conversions may be used.

Figure 6C:
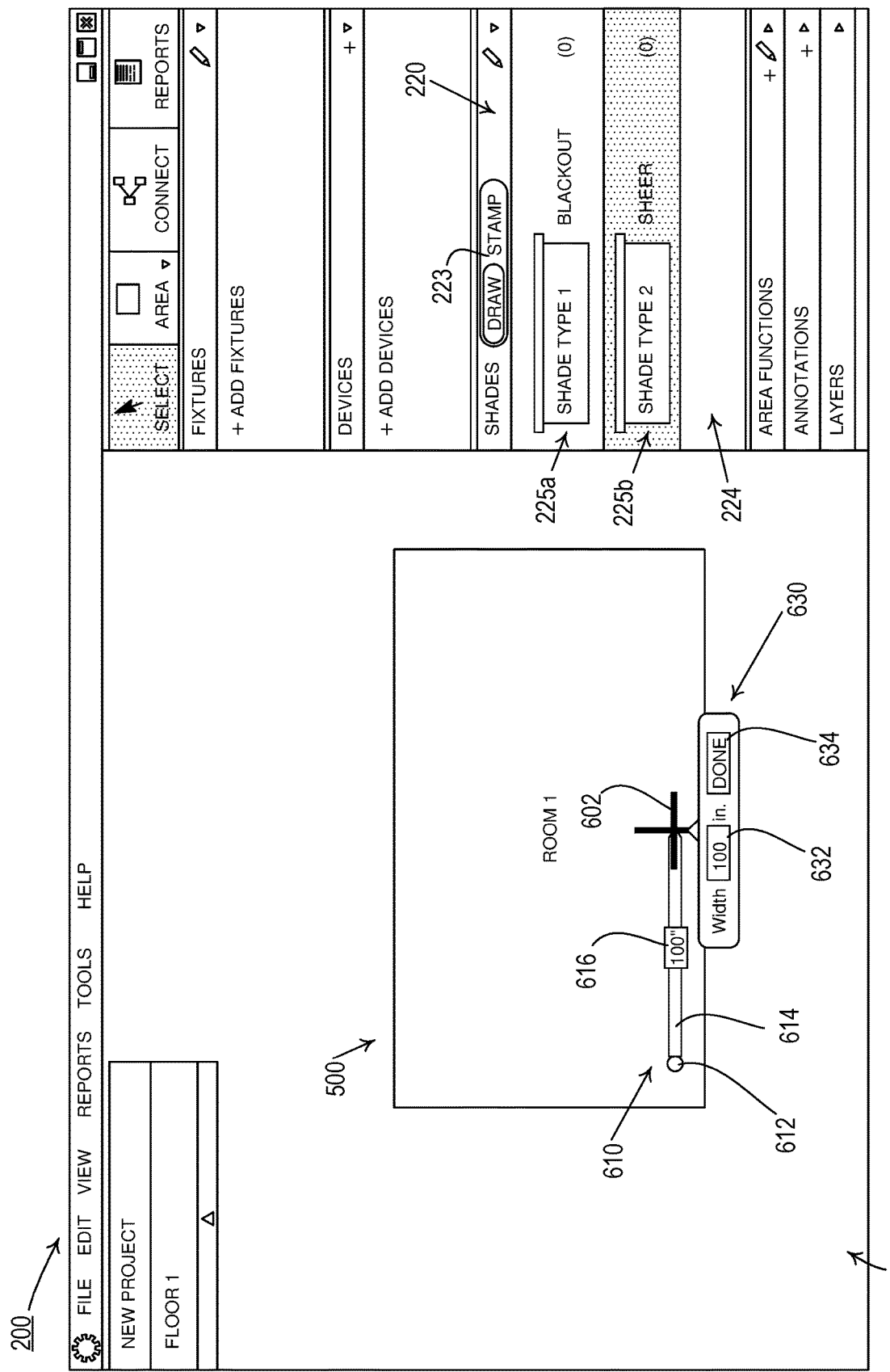

Turning again to the drawing of panel icon 614, to terminate the panel icon 614 and thus the panel being defined by the panel icon 614, the user may next actuate a mouse button and/or press a keyboard key (e.g., the control key), for example. Upon detecting the mouse button actuation and/or key, the design system may determine whether the length of the defined panel of shade 610 (e.g., the numerical representation 616) is a valid length for the shade type being defined. For example, certain shade types may have panels that may only be manufactured in certain lengths (e.g., between 12 and 240 inches). If the length is a not a valid length, the design system may generate and display an error message (not shown) to the user indicating the error, and then resume allowing the user to vary the length of the panel as shown by panel icon 614 of the shade 610. On the contrary, if the length of the panel is a valid length, the design system may display to the user, for example, a window 630 as shown in FIG. 6C (such a window may require the user to actuate both a mouse button and keyboard key). The window 630 may allow the user to refine the length 616 of the panel defined by panel icon 614 of shade 610 by entering a numerical value in a field 632 of the window 630 (which may be a real-world length). The design system may only allow the user to enter valid lengths and/or again may generate an error message if the value entered in the field 632 is not a valid value. When done, the user may actuate a done icon 634, which may cause the design system to close the window 630 and update the length of the panel icon based on the value provided by the user in the field 632 of the window 630, and may adjust the displayed numerical representation 616 of the defined panel based on the value provided by the user in the field 632. This is one example, and other variations may be used to refine the length 616 of the panel defined by panel icon 614 of shade 610.

U.S. Patent Application Publication No. 2017/0279876, published Sep. 28, 2017, entitled CONFIGURING CONTROL DEVICES OPERABLE FOR A LOAD CONTROL ENVIRONMENT, the entire disclosure of which is hereby incorporated by reference, describes example systems that may be used herein for determining whether one or more configuration options for a defined shade (as may defined through shade definition window 400 as shown in FIG. 4, for example), including its length and/or height, are a valid combination. Nonetheless, other systems and procedures may be used.

Figure 6D:
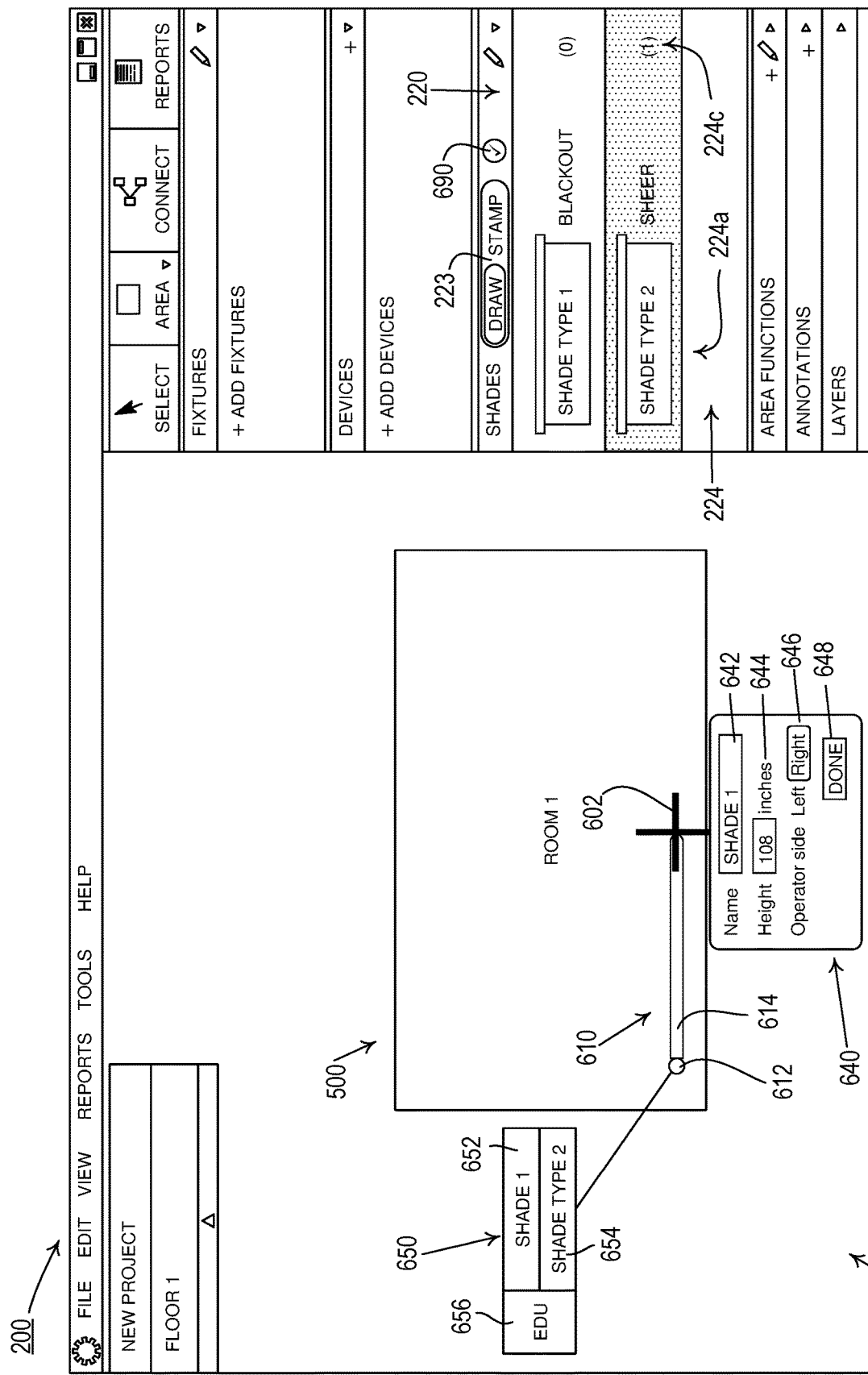

At this stage, a user may have defined a first panel of the shade 610 and may now define additional panels for the shade (as discussed below), or may terminate the defining of the shade. Assuming the user may wish to terminate the defining of the shade 610 within the canvas 202 for example, this may be done by actuating a mouse button one or more times (e.g., a "double-click"), and/or by pressing a keyboard key such as a return key, etc. Upon detecting that the user is finished defining the shade 610, the design system may display a window 640 as shown in FIG. 6D. The window 640 may include a field 642 for the user to name the defined shade 610 (e.g., the design system may provide a default name—here "Shade 1"), may include a field 644 for the user to specify a height for the defined panel of the shade 610, and may include a field 646 for the user to specify whether the operator as show by operator icon 612 of the shade 610 is a left-side or right-side operator. When done, the user may actuate a done icon 648, for example, which may cause the design system to close the window 640.

As a user terminates the defining of the shade 610 within the canvas 202, the design system may also generate and display to the user a tag 650 for the shade 610, as shown in FIG. 6D. The tag 650 may include one or more fields including, for example, a name field 652 (e.g., which may match the name provided to the shade 610 in the field 642 of the window 640), a shade type field 654, e.g., which may correspond to the shade name 224a of the shade type as shown in the shade type section 224 (see also FIG. 2C), and an operator field 656, e.g., which may indicate what type of operator (e.g., manual or motorized) is being used to control the shade 610.

Figure 6F:
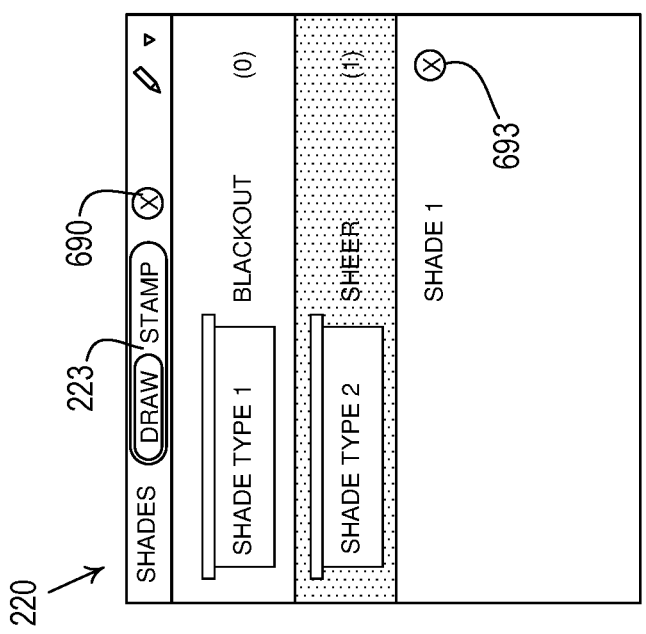

In addition, as a user terminates the defining of the shade 610, the design system may also update in the shade type section 224 of the shade pane 220 an indication that a new shade has been added to the canvas 202. The indication may include incrementing the number 224c of the shade type just defined (e.g., as shown in FIG. 6C and FIG. 6D, the number has changed from 0 to 1). The indication may also or alternatively include the design system adding the name of shade 610 (as defined by name the field 642 of the window 640) to the shade type section 224 of the shade pane 220 under, for example, the shade name 224a of the shade type just defined (this feature is shown in FIG. 6F). The design system may also allow the user to select with the mouse, for example, the name of the shade 610 in the shade pane 220 (as shown in FIG. 6F), which may cause the design system to highlight the shade 610 within the canvas 202.

As a user terminates the defining of the shade 610, the design system may execute several rules against the defined shade to determine whether there are issues and/or problems with the shade. Different problems may be categorized into different levels of severity such as warnings and/or errors, although additional or fewer categories may be used. Such issues may be the result of the dimensions of the shade 610, the fabric type used to make the panels, the roller dimensions, the operator size, etc. Warnings may be issues that will not affect the actual manufacturing of the shade 610 but may affect the aesthetic appearance of the shade, for example, once manufactured. Warnings may include a determination that not all features of the shade have been defined (e.g., that the user left one or more fields in the shade definition window 400 blank), that the shade may sag/have a "V" shape because of its length, that the panel fabric may show wrinkles (e.g., the diameter of the roller may cause such issues). Errors, for example, may be issues that may include a determination that the shade cannot be manufactured, and/or that if manufactured the shade will not operate properly, etc. Again, U.S. Patent Application Publication No. 2017/0279876, published Sep. 28, 2017, entitled CONFIGURING CONTROL DEVICES OPERABLE FOR A LOAD CONTROL ENVIRONMENT, the entire disclosure of which is hereby incorporated by reference, describes example systems that may be used herein for determining such warning and/or error problems. Nonetheless, other systems and procedures may be used.

According to a further aspect of the design system, the design system may convey warnings and errors, for example, to a user through a modified form of the tag 650. For example, FIG. 6E shows a tag 670 that includes a warning indicator 672, for example, an exclamation point (e.g., "!"), although other indicators may be used. The warning indicator 672 may indicate to the user that the design system has determined one or more warnings for the defined shade. Similarly, FIG. 6E shows a tag 680 that includes an error indicator 682, for example, an "X" although other indicators may be used. The error indicator

682 may indicate to the user that the design system has determined one or more errors for the defined shade. The warning indicator 672 and the error indicator 682 may be, for example, yellow and red respectively, although other colors may be used.

According to a still further aspect of the design system, a user may move, for example, a mouse cursor (e.g., the cursor 602) over the tag 670 or the tag 680. Upon detecting the presence of the cursor 602 over the tag 670 or the tag 680, the design system may display a text window (not shown) to the user indicating the warning and/or error and how the warning and/or error may be corrected. The design system may provide via this window an icon (not shown) that may be actuated by the user to correct the error or warning.

According to a still further aspect of the design system, when there are warnings and/or errors with defined shades, the design system may also convey this information to the user through the shade pane 220. For example, as shown in FIG. 6F, the design system may provide an indicator 690 to show in general the status of all defined shades (e.g., a check mark if there are no issues, an exclamation point if there is at least one warning but no errors, and an "X" if there is at least one error, although other indicators may be used). See FIG. 6B where the indicator 690 is an exclamation point to indicate a warning, and FIG. 6D where the indicator 690 is a check mark to indicate that there are no issues. The design system may provide further information by showing the issue for the shade type, as shown by an indictor 69 in FIG. 6B, or on a per defined shade basis, as shown by the indicator 693 in FIG. 6F.

Figure 6G:
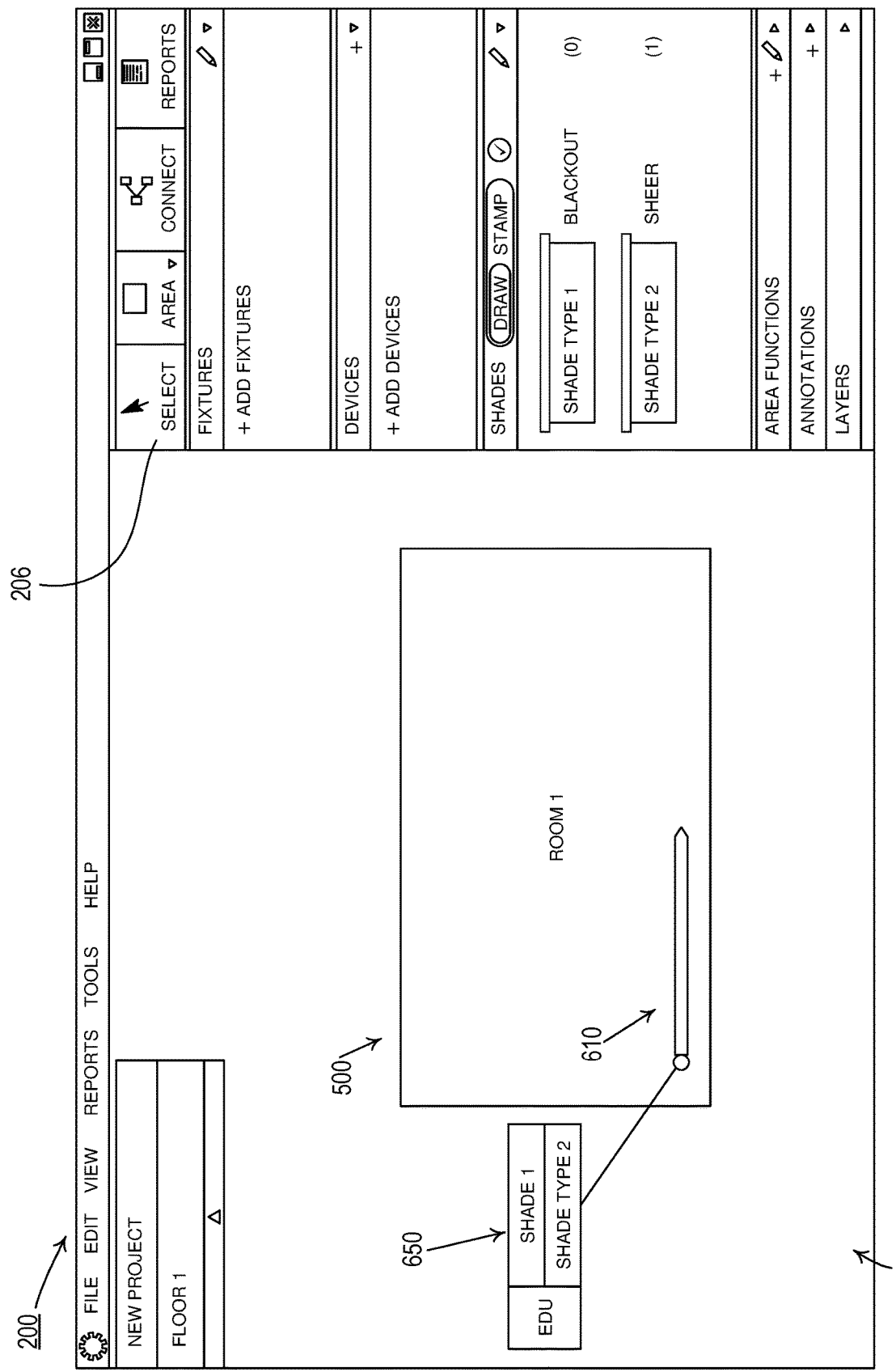
Figure 6H:
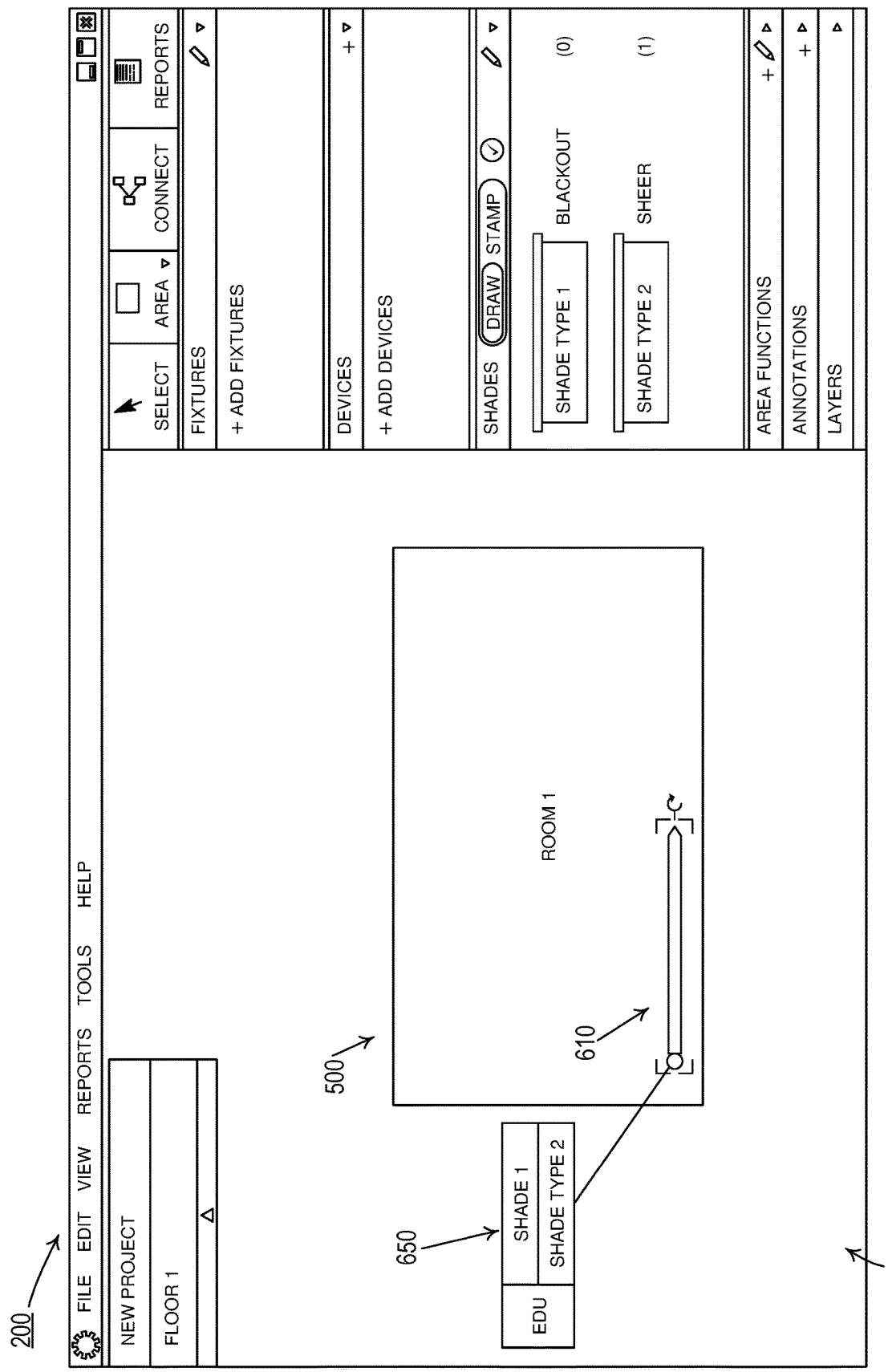
Figure 7A:
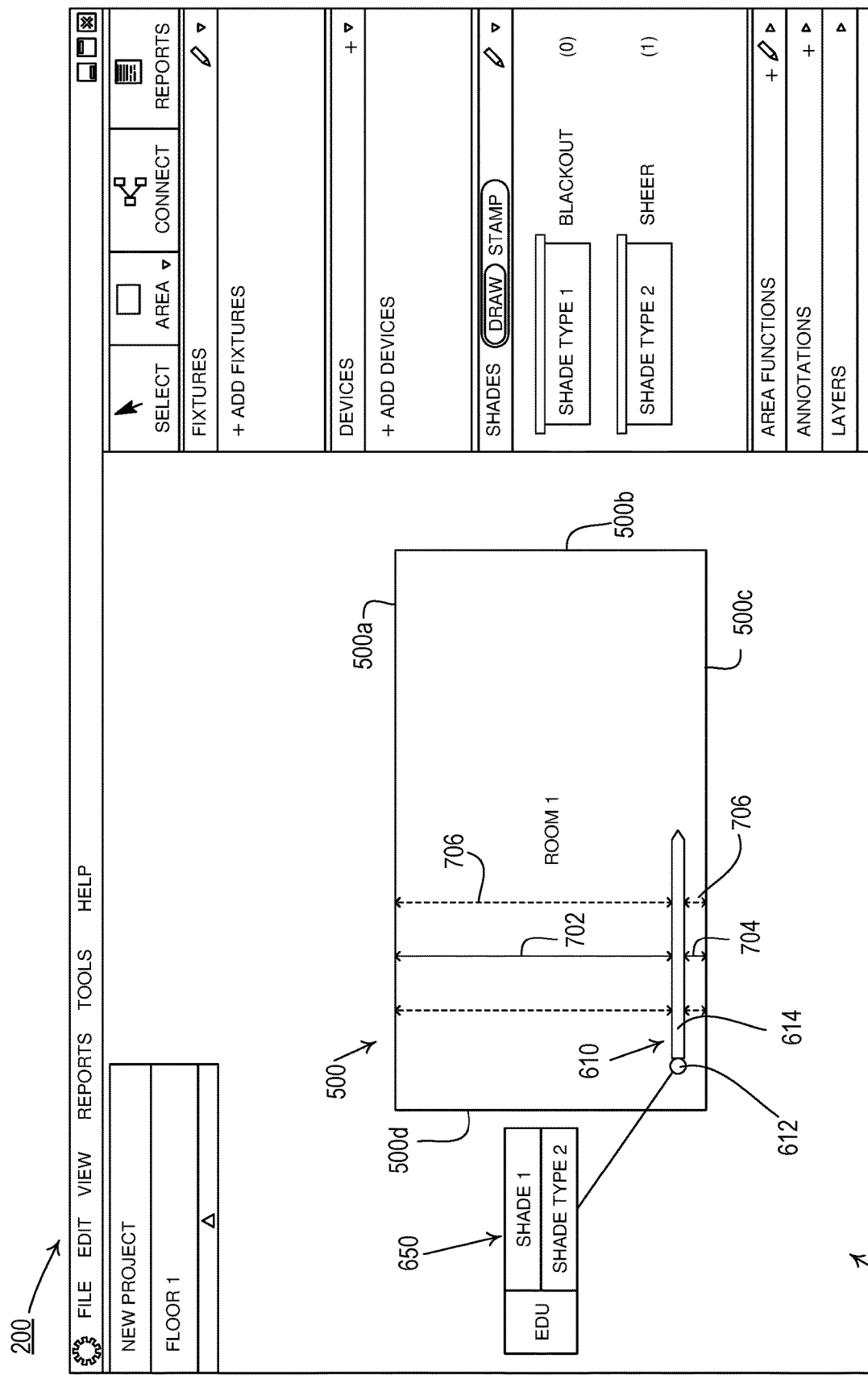
Figure 7B:
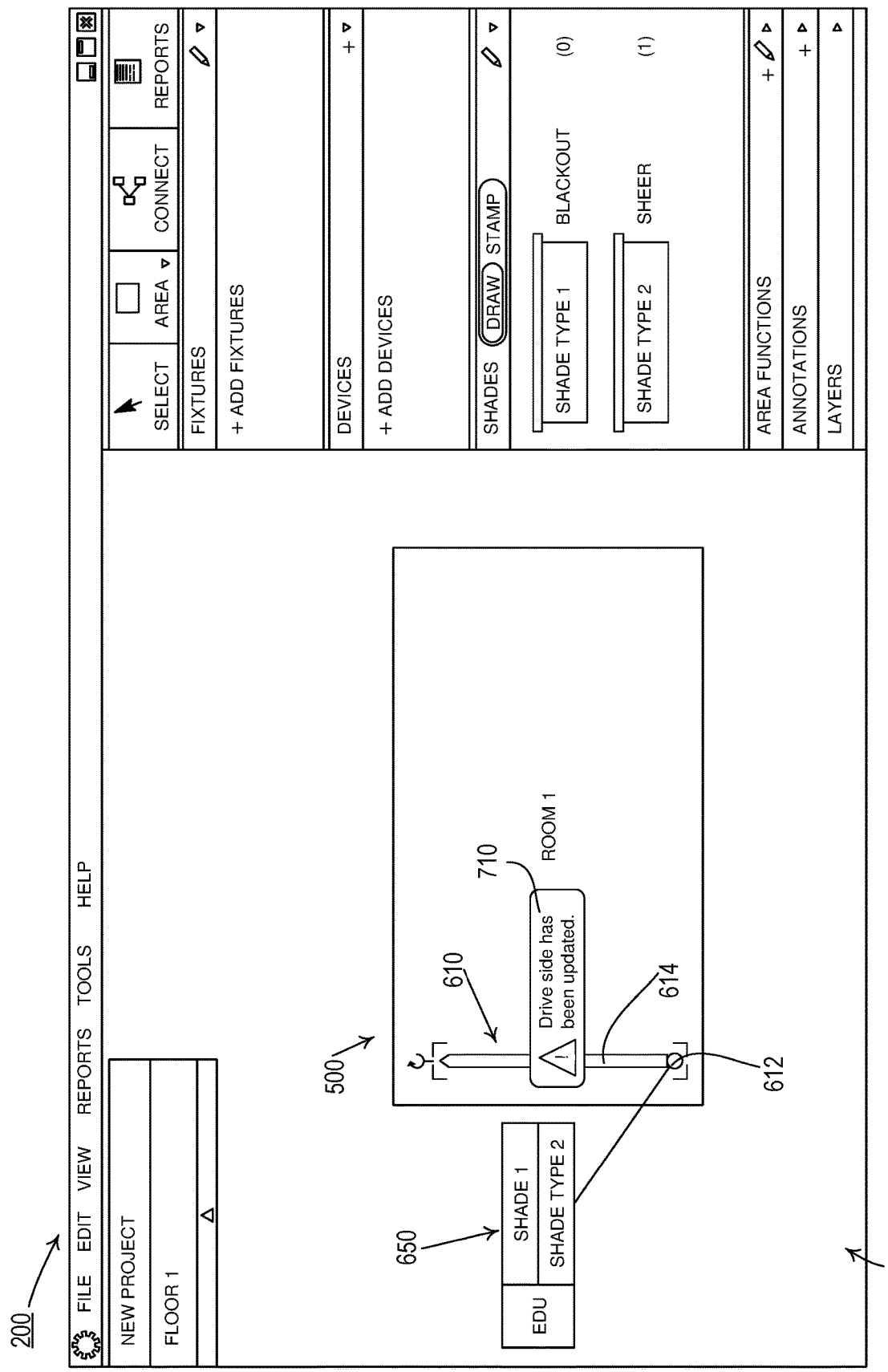

FIG. 6G shows the shade 610 (with no errors or warnings) once completed. As shown, shade 610 includes two icons, one for an operator and one for a panel, which together may be referred to herein as shade icon. By way of example, a user may redefine the shade 610 by selecting the shade using the select control tool 206. FIG. 6H shows an example of the shade 610 once it has been selected. Once shade 610 is selected, the design system may allow the user to move it within canvas 202, rotate it (such as relative to the operator icon 612) as shown in FIG. 7B, change its length and height dimensions, change its name, copy it, etc. As indicted herein, a user may define a shade in canvas 202 adjacent to a window(s) as such windows may appear in an imported floor plan. For example, as shown in FIG. 3A with shades 302a and 30b, a user may position a shade next too and along the length of a window.

Turing again to FIG. 6D and the window 640, the field 646 may allow the user to specify whether the operator (e.g., represented by the operator icon 612) of shade 610 is a left-side or right-side operator. According to another aspect of the design system, the design system may automatically make this determination for the user. Turning to FIG. 7A, there is shown one example of how the design system may make this determination. FIG. 7A shows the defined area 500 with the defined shade 610 having the operator icon 612 and the panel icon 614. The design system may assume that all edges (here 500a, 500b, 500c, and 500d) of the area 500 may include one or more windows. Thereafter, the design system may project one or more perpendicular lines from the panel icon 614 in each direction until each hits an edge of area 500 (in other words, lines that are perpendicular to the panel icon 614, such as perpendicular line segments 702 and 704 shown in FIG. 7A for illustrative purposes). Thereafter, the design system may determine the length of each resulting line segment 702 and 704. The design system may next assume the user desired to place the shade 610 next to one of the edges 500a-500d that is determined to be closest to the panel icon 614 (closest being determined by which of the line segments 702 and 704 is shorter). Here, the design system may determine that the line segment 704 is shorter than the line segment 702 and that the edge 500c is closest to the panel icon 614. Next, the design system may take the perspective that a user is standing within area 500 looking out though the "closest edge" (here the edge 500c) and determine whether the operator (e.g., represented by the operator icon 612) is on the left side or the right side of the shade 610 based on the user's left or right side, and so designate that determination in the field 646 of the window 640. In FIGS. 6A-6D, 6G-6H, and 7A, the operator is a right-side operator. The design system may allow a user to over-ride the design system's determination using the window 640. Upon over-riding the design system, the design system may move icon 612 to the other side of the shade 610 as shown in canvas 202. According to one specific example, the design system may project two perpendicular line segment 702 and 704, one in each direction from the center of the panel icon 614 until each hits a respective edge of area 500 as shown in the FIG. 7A. Alternatively, the design system may draw one perpendicular line though the center of panel icon 614, resulting in two perpendicular line segments 702 and 704 formed by the panel icon and edges of area 500. Again, the system may determine the length of each line/line segment and proceed as above. As another example, the design system may also project multiple perpendicular line segment from the panel icon 614 (as shown by dashed line segments 706) and compute lengths for each line, etc., and determine which line is shorter. When a shade includes multiple panels as described below, the design system may view the multiple panels as one panel, draw a perpendicular line through the center of the panel, again resulting in two line segments as discussed above and proceeding accordingly. One will recognize other mechanisms may be used to determine the operator side.

According to a further aspect of the design system, the design system may allow a user to select a defined shade and move the location of that shade within the canvas 202 and/or rotate the shade, etc. When the user does this, the design system may again automatically determinate the operator side as similarly discussed above and if the side has changed, update information for that shade. The design system may also provide an indication to the user that the design system has updated the operator side. FIG. 7B shows an example of the shade 610 being rotated and the design system updating the operator side (e.g., as shown by a message window 710). According to a still further aspect of the design system, the design system may allow a user to select a defined shade (e.g., using select control tool 206), copy the defined shade, and paste an instance of that shade within the canvas 202. In addition to adding the shade 610 to the shade panel 220, the design system may again determine the operator side of the new shade as similarly discussed above.

Figure 8A:
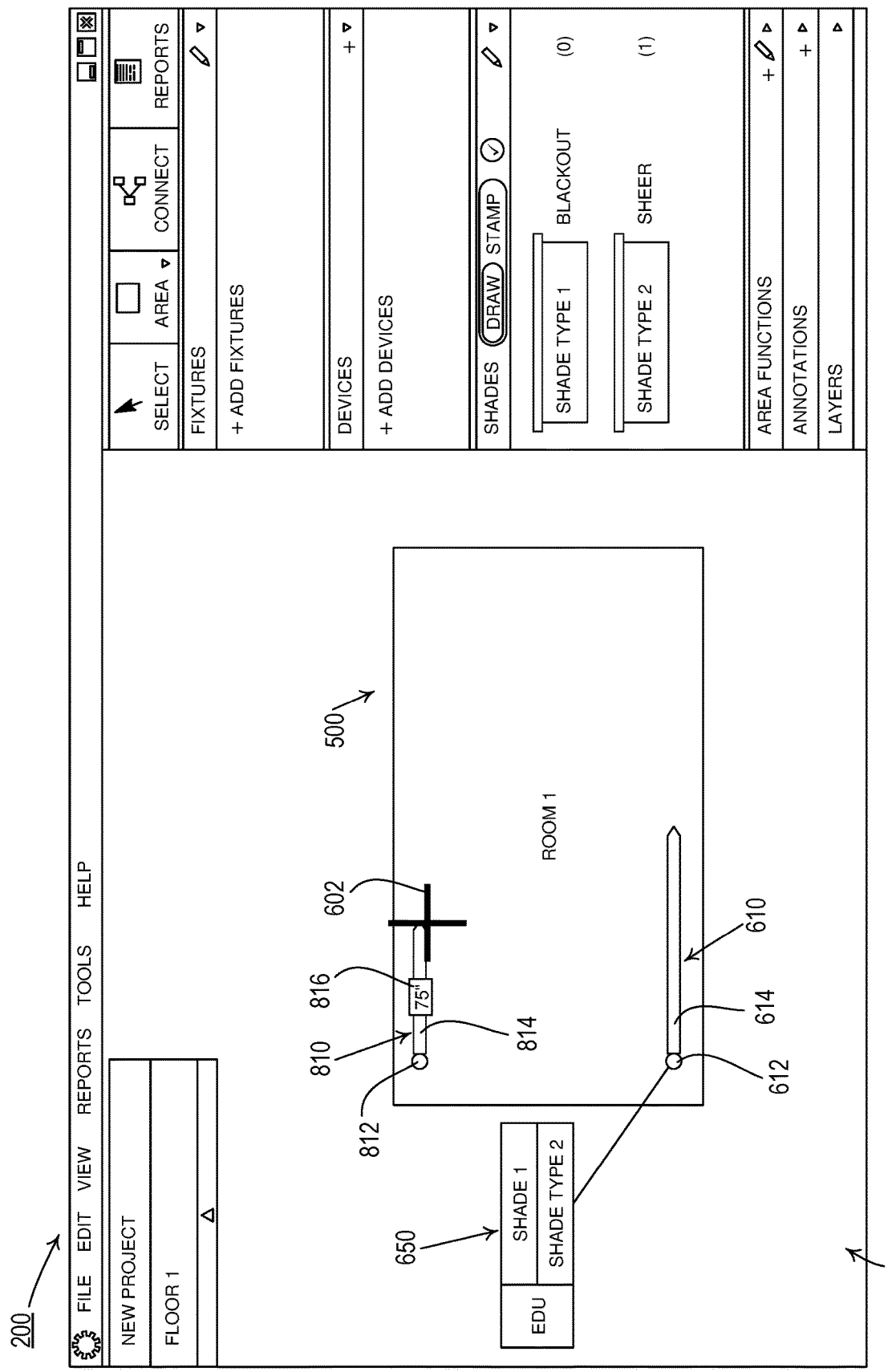

According to another aspect of the design system, as a user defines shades within the canvas 202, the design system may maintain and/or save as default values the lengths of the panels for each shade (e.g., the numerical representation 616 of the length of the panel). Thereafter, the design system may use these default values and/or lengths as a user defines new shades within the canvas 202. For example, referring to FIGS. 8A-8D, assume a user has defined the shade 610 to have a panel length of 100 inches. The design system may now store this panel length as a default value for the user. Assume next the user is defining a new shade 810 in the canvas 202, with the shade 810 having an operator icon 812 and a panel icon 814 with a numerical representation 816 of the length of the panel. As shown in FIG. 8A, as the user moves and/or drags the cursor 602, the panel icon 814 may track the cursor 602 (i.e., the panel icon 814 may start at the operator icon 812 and extend to the cursor 602), with the numerical representation 816 of the length showing the current length (e.g., 75") as discussed above.

Figure 8B:
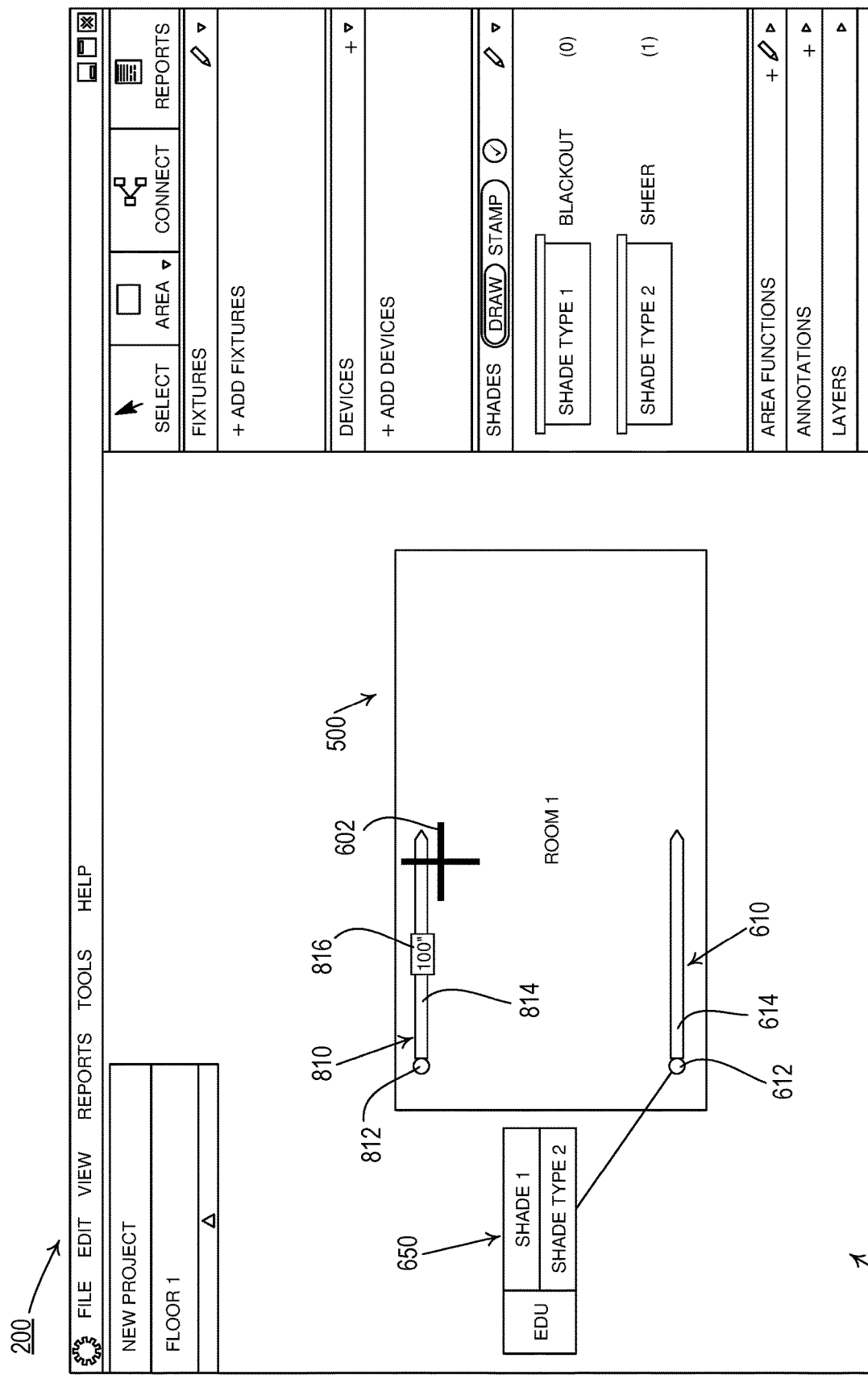

As this is occurring, the design system may determine whether the length of the panel being defined is approaching the default length (here, 100 inches as defined above). For example, the design system may determine when the length of the panel is within a defined percentage of the default length. For example, the design system may determine when the length of the panel is within 20% of the default length, in other words at 80 inches in this example. One will recognize other metrics may be used. For example, the design system may determine when the length of the panel is within a constant length (e.g., 15 inches) of the default length. At this time, and as shown in FIG. 8B, the design system may auto-extend panel 814 to 100 inches. For example, as shown in the FIG. 8B, panel 814 now starts at the operator icon 812 and extends beyond the cursor 602 to now have the same length as the panel icon 614 of the shade 610, and numerical representation 816 of the length of the panel shows 100". One will recognize that the design system need not use 100 inches to make this determination and that other metrics may be used. For example, the design system may use the number of pixels in the panel icon 614 as the default length, and use the number of pixels in the panel icon 814 as a means for determining when the length of the new shade panel is approaching a default value, etc. At this time, the user may terminate the defining of the shade 810 by actuating a mouse button one or more times (e.g., via a "double-click"), and/or by pressing a return key, etc., with the process continuing as discussed above with FIGS. 6A-H with the user being able to name the shade 810, the design system checking for warnings and errors, etc.

Figure 8C:
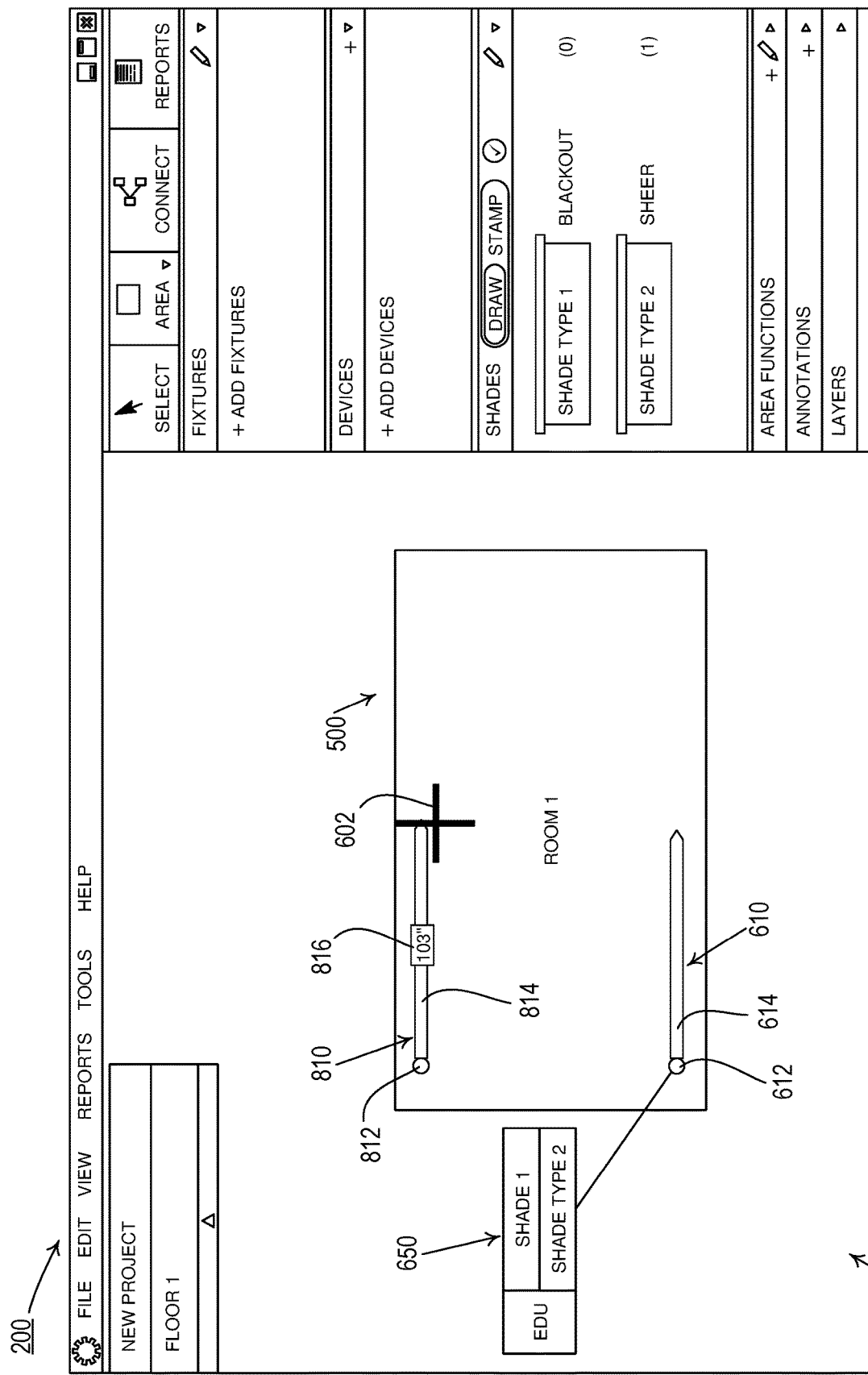
Figure 8D:
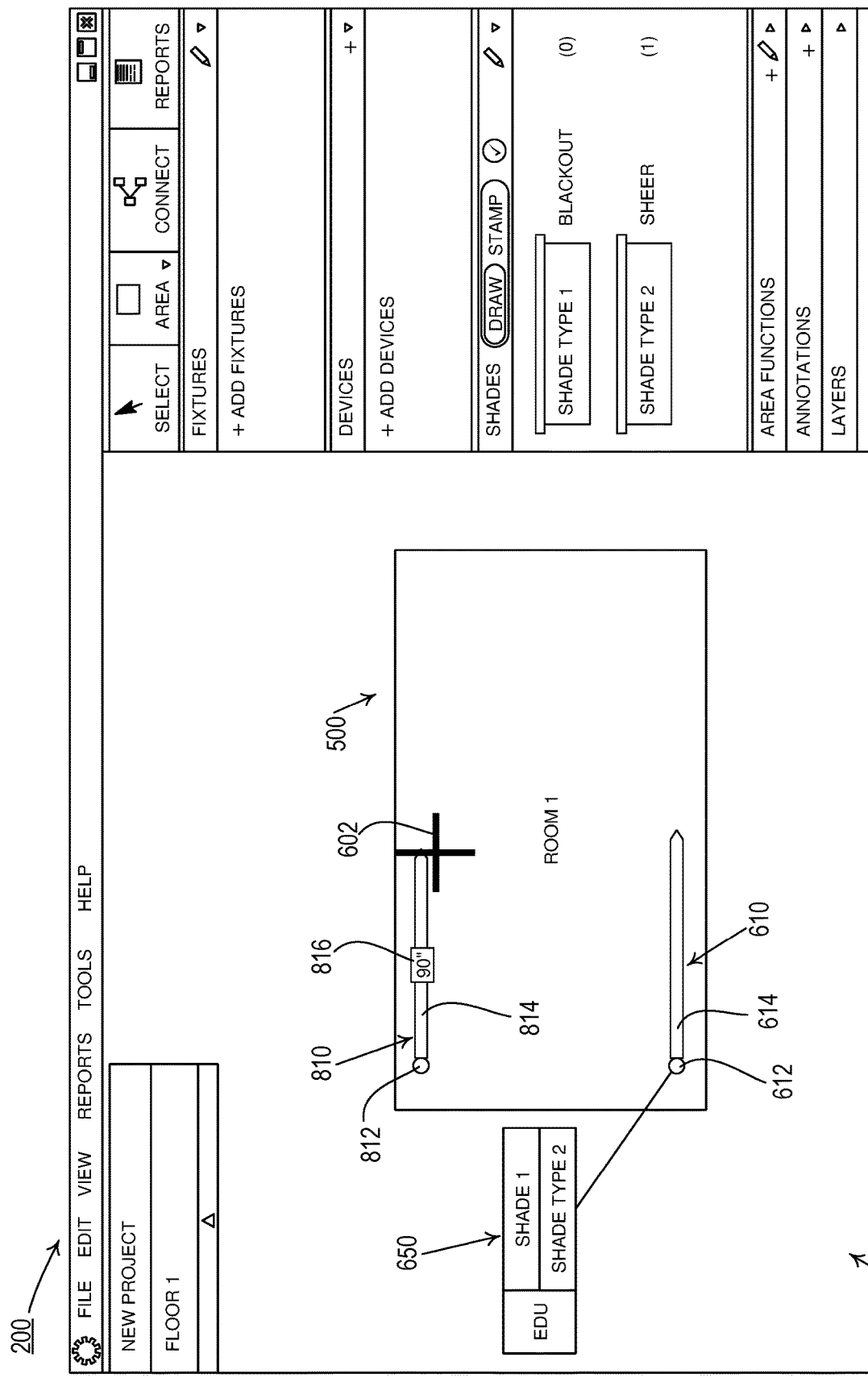

Additionally or alternatively, as shown in FIG. 8C if the user wishes to define shade 810 to have a longer length for panel 814, the user may continue to move and/or drag the cursor 602. As the design system detects the cursor 602 extending beyond the 100-inch mark, for example, the design system may continue to extend the length of the panel 614 with the cursor 602 (e.g., the panel may track with the cursor), and the numerical representation 816 of the length of the panel may again increase (here, to 103"). With this feature, a user may easily and more efficiently define shades of similar lengths. According to a further aspect of this feature, a user may override the auto feature and define a shade having a panel length within the default region (in the above example, between 80 and 100 inches) by, for example, holding a keyboard key (e.g., control key) while dragging the cursor 602, although other means may be used. FIG. 8D shows an example of this feature, with the panel icon 814 again tracking the cursor 602 and the numerical representation 616 showing a length between 80 and 100 inches (here, 90 inches). Turning to FIG. 8C, assuming the design system has stored multiple default lengths (e.g., 100 inches and 150 inches), as the user continues to move the cursor 602 beyond 103 inches and thus extend the panel icon 814, as the design system detects the length of the panel is within for example 20% of the default length 150 (in other words at 120 inches, although a different metric may be used than for 100 inches), the design system may again auto-extend the panel icon 814 to 150 inches, etc. One will recognize that the design system may allow a user to define default panel lengths in other and/or additional manners. For example, the design system may provide the user with a graphical window that allows the user to create a list of defined lengths. The window may further allow the user to define a first set of lengths for a first shade type and a second set of lengths for a second shade type where the lengths in each set may differ. Regardless of how default lengths are defined, the design system may store the lengths with respect to the current load control system being defined, and/or may allow the user to create library that may be used for any load control system the user may define.

As discussed above in reference to FIGS. 6A-6H for example, as a user defines a new shade and places the operator icon 612 in the canvas 202 and then drags/moves the cursor 602 to define a panel icon 614, the user may move the cursor in any direction. Assuming an X-Y axis is imposed over canvas 202, the examples discussed herein show defined shades that are parallel to the X-axis (e.g., FIG. 6G) and parallel to the Y-axis (e.g., FIG. 7B). Shades may also be defined at an angle to the X and Y axes by moving the cursor 602 at an angle to the axes. As one example, the design system may allow the user to define a shade at any angle to the axes. According to another example, the design system may automatically adjust a drawn shade to set angular intervals relative to the X and/or Y axes. For example, using the X axis as orientation, the design system may allow drawn shades to be defined at 15 degree intervals (this is merely an example, and any interval may be used). The design system may allow a user to define the interval. Hence, a shade may be defined at 0 degrees (i.e., parallel to the X axis), 15 degrees, 30 degrees, 45 degrees, 60 degrees, 75 degrees, 90 degrees (i.e., parallel to the Y axis), 105 degrees, etc. As an example, as a user defines a panel by moving cursor 602, the design system may determine the angle between the X axis and a line extending through the direction of movement of the cursor. If the angle is equal to or greater than 0 degrees and less than 7.5 degrees, the design system may draw panel icon 614 as being horizontal to the X-axis (i.e., auto-adjust the shade to 0 degrees). If the angle is equal to or greater than 7.5 degrees and less than 22.5 degrees, the design system may draw panel icon 614 as being at 15 degrees to the X-axis (i.e., auto-adjust the shade to 15 degrees). If the angle is equal to or greater than 22.5 degrees and less than 37.5 degrees, the design system may draw panel icon 614 as being at 30 degrees to the X-axis (i.e., auto-adjust the shade to 30 degrees). The design system may display to the user an indication of the interval the shade is being adjusted to. This is merely an example, and other examples are possible. As one example, the design system may adjust the shade once a user stops defining the panel icon 614. The design system may continue to also auto-extend panel icon 614 to default lengths, as discussed above. According to a further example, once a shade is defined, if a user thereafter selects the shade (e.g., using select control tool 206) and rotates it, the design system may again automatically adjust the shade to a set interval as it is rotated. According to a still further example, once a shade is defined, if a user thereafter selects the shade (e.g., using select control tool 206), copies it, and then pastes a new instance of the shade in canvas 202, the new shade may be at the same orientation as the copied shade.

Figure 9:
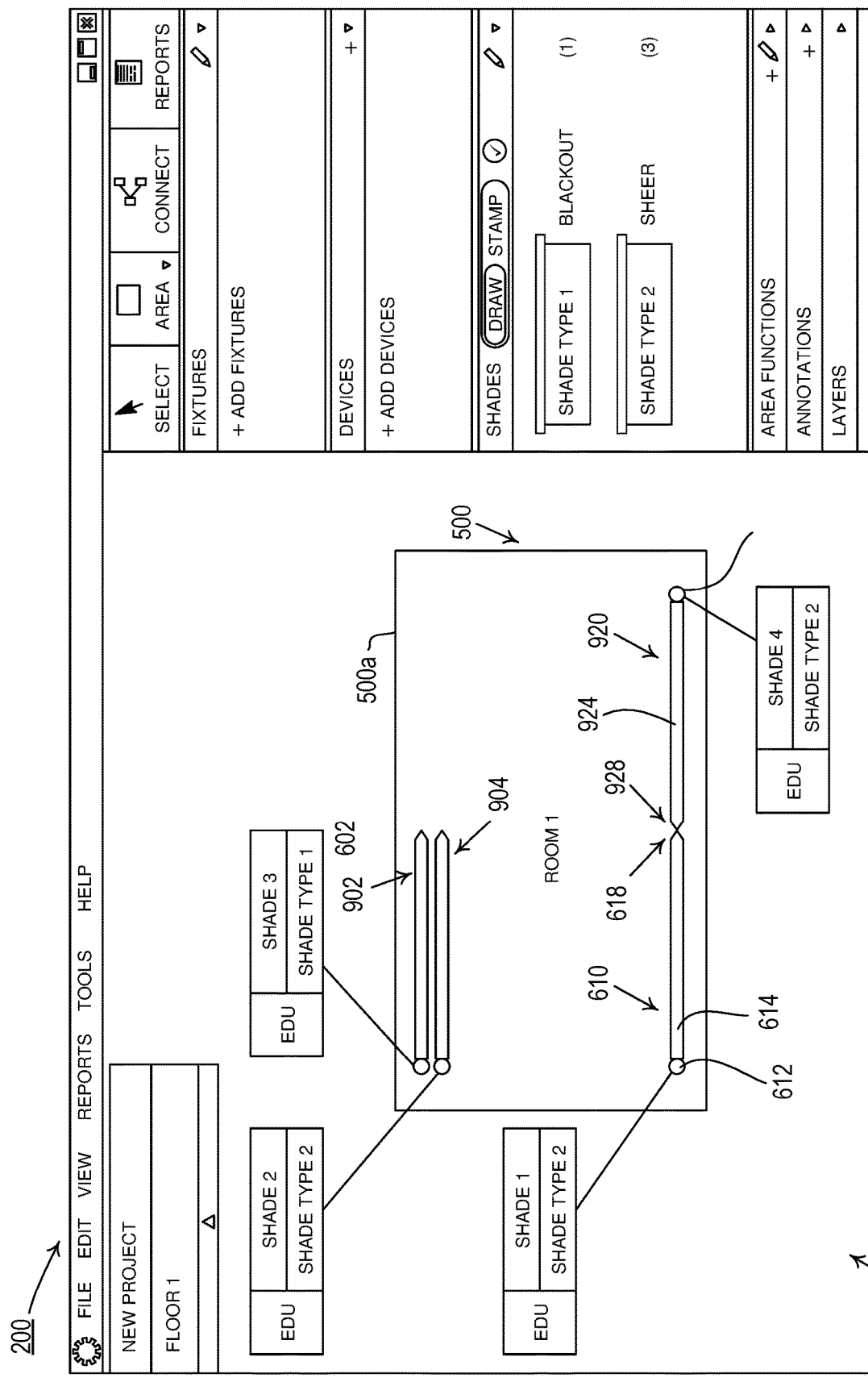

Referring now to FIG. 9, there is shown a further example use of the design system. According to this example, the design system may allow a user to define shades of multiple shade types within the canvas 202 in close proximity. In this example, the area 500 includes a first shade 902 and a second shade 904 that is parallel to the first shade 902. Assuming the edge 500a of the area 500 includes a window, such a configuration may be used to show and/or define the first shade 902 as a blackout shade type and define the second shade 904 as a sheer shade type. The design system may allow a user to define each of the shades 902 and 904, one after the other, using process as similarly discussed herein.

FIG. 9 also shows a further example of two separate shades 610 and 920. The shade 610 may have the operator icon 612 and the panel icon 614. Similarly, the shade 920 may have an operator icon 922 and a panel icon 924. Here, the shades 610 and 920 are configured in a row (e.g., arranged linearly), represent separate shades (e.g., each having its own operator), and are not physically connected to each other. To assist a user in visually understanding that the shades 610 and 920 are separate shades, the design system may represent ends 618 and 928 of each shade in a fashion to show they are not connected. Here, the ends 618 and 928 are shown with arrow configurations, although other configurations may be used, including the design system displaying an icon (e.g., a square or triangle at each end to show the end of each shade). Note that the shades 902 and 904 are also shown with similar types of ends.

Described thus far is how the design system may assist a user in defining, designing, laying out and/or configuring load control systems having shades with a single panel. According to a further aspect of the design system, the design system may allow a user to include multi-panel shades (e.g., shades having two or more panels) in the load control system. FIGS. 10A-D show an example process for defining multi-panel shades.

Figure 10A:
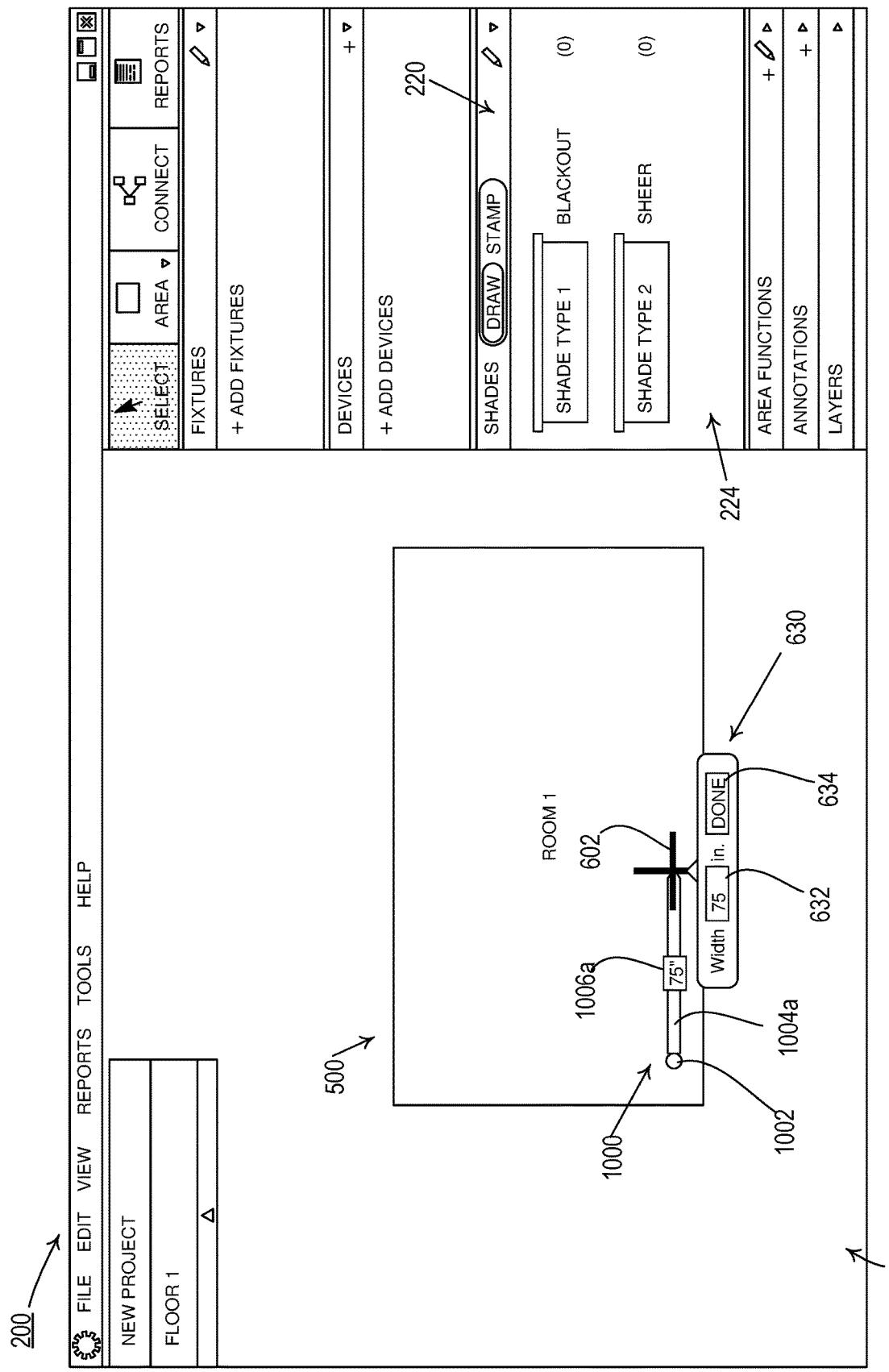

Beginning with FIG. 10A, a user may select from the shade type section 224 of the shade pane 220 a defined shade type, may move cursor 602 to the canvas 202, locate the cursor 602 to a desired location within the area 500 in which the user would like to place the shade, and actuate the mouse button (as similarly discussed with respect to FIGS. 6A-H). Upon detecting actuation of the mouse button, the design system may display at the location of the cursor 602 an operator icon 1002 that may represent an operator for the shade 1000. Thereafter, the user may drag and/or move the cursor 602 in any direction. As the user drags the cursor 602, the design system may draw a panel icon 1004a extending from the operator icon 1002 towards the cursor 602, with the panel icon 1004a tracking the cursor. The pane; icon 1004a may represent a first panel and roller of the shade 1000. The panel icon 1004a may be of any color, preferably a color different from the operator icon 1002 and the design system may use the same color associated with the shade type currently being used as shown in the shade type section 224.

The design system may use the panel icon 1004a to represent the horizontal length of the first panel of the shade 1000. As the user drags the cursor 602, the design system may also display to the user a numerical representation 1006a of the length of the first panel as represented by panel icon 1004a of the shade 1000 as similarly discussed above. The design system may convert the length of the first panel of the shade 1000 to a real-world length using a defined scale. If a panel length has been defined and stored by the design system as a default value, the design system may also auto-extend the panel icon 1004a v and update the numerical representation 1006a of the length of the first panel of the shade 1000 to that length as the user moves the cursor 602 towards the default length, as similarly discussed with respect to FIGS. 8A-D. Similarly, the design system may automatically set panel icon 1004a to a defined angular interval relative to the X axis, for example, as discussed above.

To terminate the adjustment of the length of the first panel as represented by panel icon 1004a of the shade 1000, the user may next actuate a mouse button and/or press a keyboard key (e.g., the control key), for example. Upon detecting the mouse button actuation, the design system may determine whether the length of the first panel of the shade 1000 is a valid length for the shade type being defined. If the length of the first panel of the shade 1000 is a not a valid length, the design system may generate and display an error message to the user indicating the error, and then resume allowing the user to vary the length of panel icon 1004a as discussed. On the contrary, if the length of the first panel of the shade 1000 is a valid length, the design system may display to the user, for example, the window 630 (as similarly discussed with respect to FIG. 6C) to thereby allow the user to refine the length of the first panel of the shade 1000. When done, the user may actuate the done icon 634, which may cause the design system to close the window 630 and update the length of the first panel of the shade 1000 to the value provided by the user in the field 632, and may adjust the displayed length of the first panel as represented by panel icon 1004a of the shade 1000 to track the value provided by the user in the field 632.

Figure 10B:
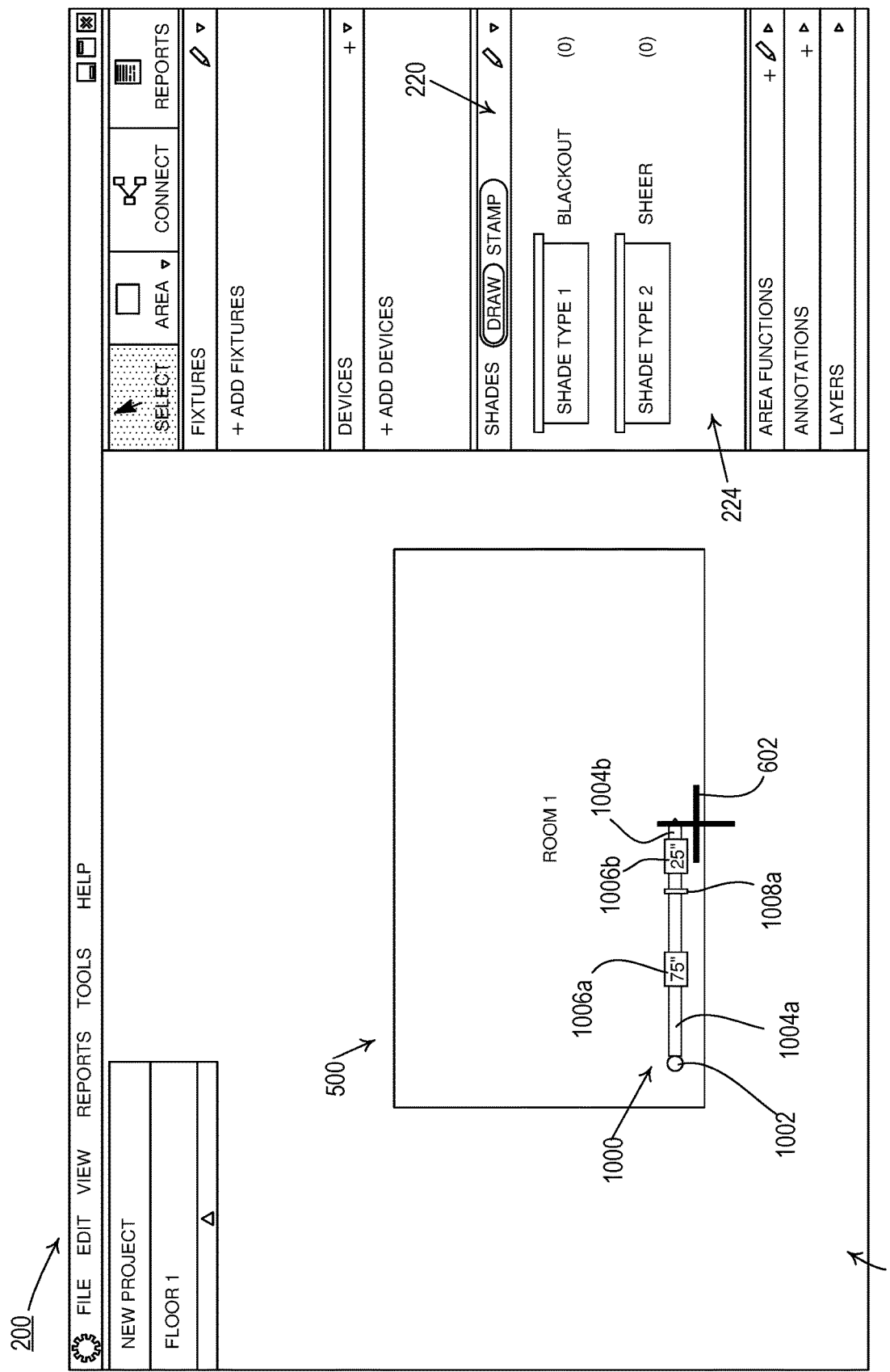

As discussed with respect to FIGS. 6A-H, the user may terminate the defining of shade 1000 within the canvas 202 by, for example, actuating a mouse button one or more times (e.g., a "double-click"), and/or by pressing a keyboard key such as a return key, etc. On the contrary, the user may next define a second panel icon 1004b that represents a second panel of the shade 1000 as shown in FIG. 10B. Specifically, upon not detecting a shade termination action by the user and detecting a continued movement and/or dragging of the cursor 602, the design system may determine that the user is now defining the second panel of the shade 1000 and display to the user a coupler icon 1008a at the end of the first panel icon 1004a. Alternatively, the design system may display the coupler icon 1008a upon determining the user terminated the panel icon 1004a, and either may maintain the coupler icon 1008a upon not detecting a shade termination action by the user and detecting a continued movement and/or dragging of cursor 602, etc., or removing the coupler icon 1008a upon detecting a shade termination action by the user. The design system may use the coupler icon 1008a to represent to the user a coupler (for connecting two panels). The coupler icon 1008a may be any shape (here a rectangle) and of any color, such as red, to help designate and/or readily show the location of the coupler. Thereafter, the user may drag and/or move the cursor 602 in any direction. As the user drags the cursor 602, the design system may draw and/or display the second panel icon 1004b extending from the coupler icon 1008a towards the cursor 602, with the panel icon 1004b tracking the cursor. The second panel icon 1004b may be of any color, preferably the same color as the first panel icon 1004a. As indicated, in one example, the design system may allow the user to drag and/or move the cursor 602 in any direction such that the second panel icon 1004b may be at an angle to the first panel icon 1004a. According to another example, the system may automatically cause the second panel icon 1004b to follow in the same angular direction as the first panel icon 1004a regardless of the direction the user may move the cursor 602.

The design system may use the second panel icon 1004b to represent the horizontal length of the second panel of the shade 1000. As the user drags the cursor 602, the design system may also display to the user a numerical representation 1006b of the length of the second panel as defined by panel icon 1004b of the shade 1000 as similarly discussed above. The design system may convert the length to a real-world length using a defined scale. Because a panel length has been defined for the first panel of the shade 1000, the design system may store the length of the first panel of the shade 1000 as a default value. As the user moves the cursor 602 towards that length, the design system may auto-extend the second panel icon 1004b to the same length as the first panel icon 1004a and update the numerical representation 1006b of the length of the second panel of the shade 1000 to have the same value as the length of the first panel of the shade 1000. Nonetheless, the user does not need to use the same lengths for the first panel and the second panel of the shade 1000.

Figure 10C:
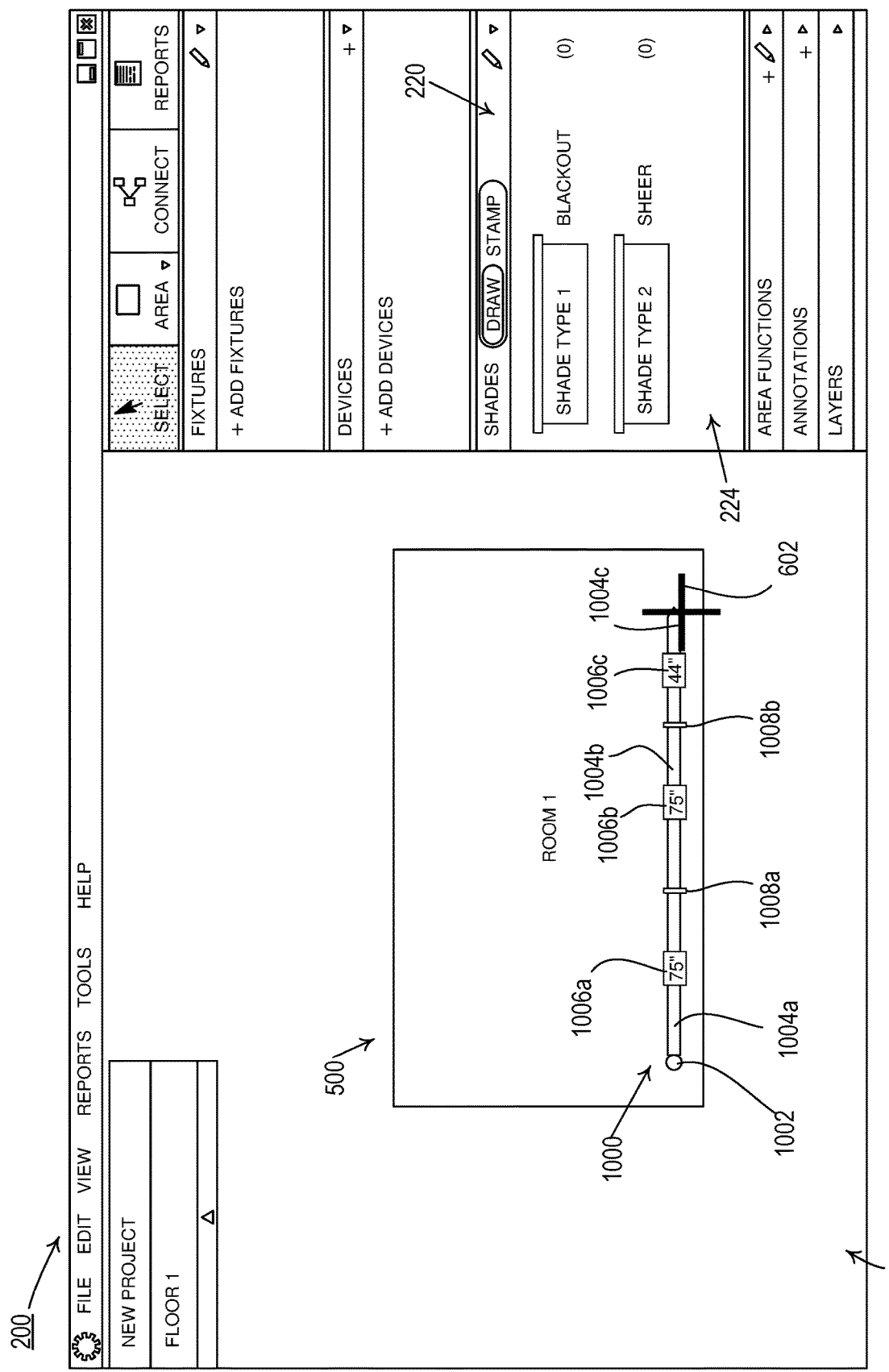
Figure 10D:
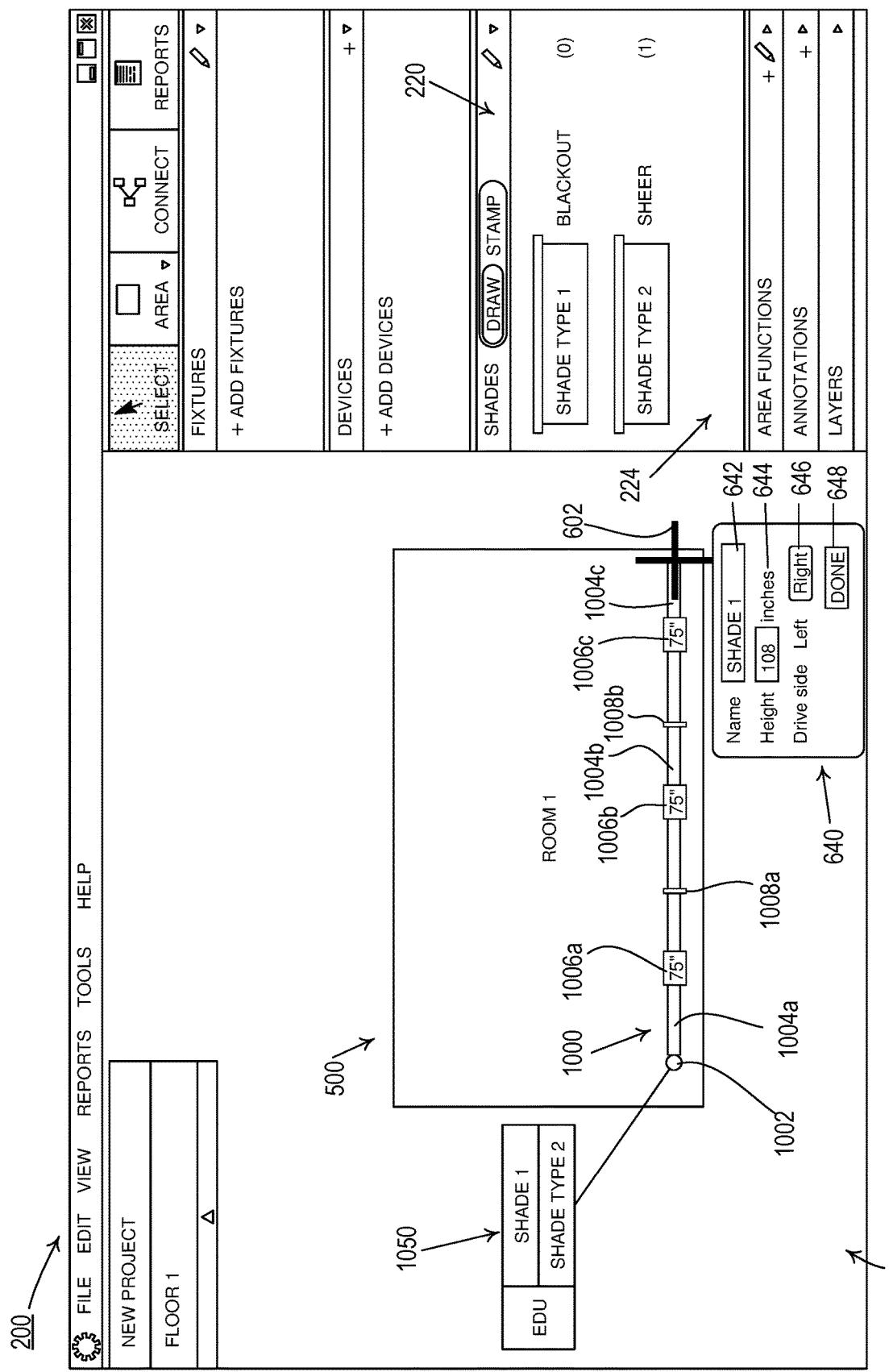

The process may continue for defining the second panel of the shade 1000 as similarly discussed for the first panel (possibly detecting length errors, displaying window 630, etc.) with the user then adding a third panel icon 1004c that represents a third panel of the shade 1000 as shown in FIG. 10C. Again, the design system may display a coupler icon 1008b at the end of second panel icon 1004b as the user defines the third panel of the shade 1000. The process may continue for third panel icon 1004c as similarly discussed for the first panel icon 1004a (possibly detecting length errors, displaying window 630, etc.). The user may add additional panel icons to the shade 1000 (although the user may stop at two panel icons).

Assuming next that the user may wish to terminate the defining of shade 1000 within the canvas 202, the user may for example, actuate a mouse button one or more times (e.g., a "double-click"), and/or press a keyboard key such as a return key, etc. Upon detecting that the user is finished defining the shade 1000, the design system may display a window 640 as similarly discussed above and as shown in FIG. 10D. The user may use the window 640 to name the shade 1000, to specify a height for the three panels of the shade 1000, and to specify whether the operator of the shade 1000 is a left-side or right-side operator. Again, the design system may automatically make this determination (i.e., operator side) for the user. When done, the user may actuate the done icon 648, which may cause the design system to close the window 640. The design system may then similarly proceed as discussed with respect to FIGS. 6A-6H, generating a tag 1050 for the shade 1000, updating the shade type section 224 of the shade pane 220, and checking and/or displaying any warnings and/or errors for the shade 1000. As shown, shade 1000 includes several icons, including one for an operator, one or more for one or more couplers, and two or more for panels, which together may be referred to herein as a shade icon. As indicted herein, a user may define a shade in canvas 202 adjacent to a window(s) as such windows may appear in an imported floor plan, such as shown in FIG. 3A with shades 302a and 30b. Rather than defining two shades as shown in this FIG. 3A, a user may have defined one shade with one operator icon, and multiple pane icons connected by a coupled icon located at the mullion, for example.

Figure 11:
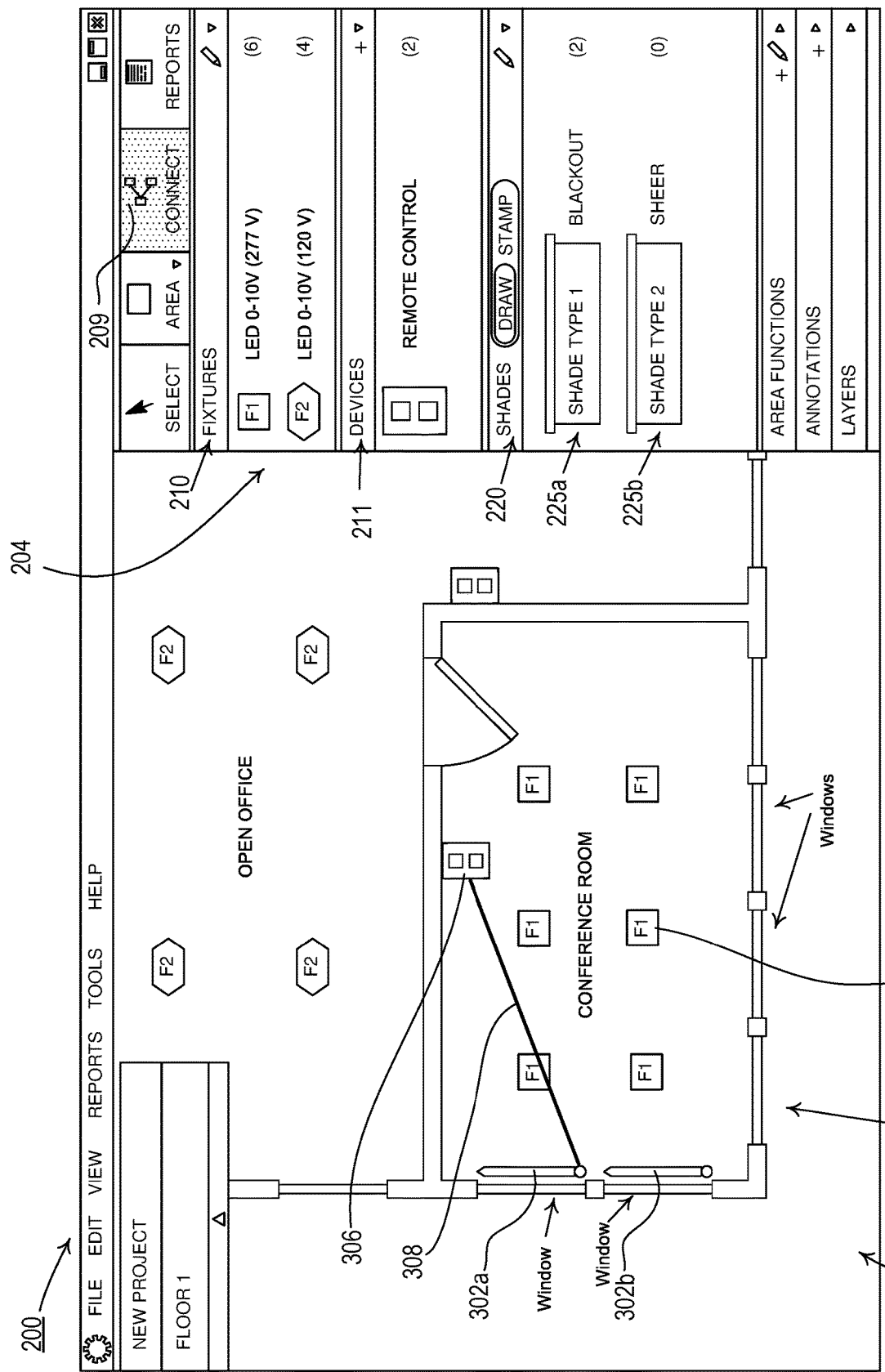

According to a further aspect of the design system, a user may use the design system to generate graphical representations of connections (e.g., electrical and/or communication connections) and/or associations between selected devices and shades as similarly described in commonly-assigned U.S. Patent Application Publication No. 2017/0228110, published Aug. 10, 2017, entitled CONFIGURING A LOAD CONTROL SYSTEM, the entire disclosure of which is hereby incorporated by reference. In this manner, the user may define the operation of the load control system. For example, referring to FIG. 11 there is shown the example of the design window 200 of FIG. 3A, with an imported floor plan 300 shown on the canvas 202. In this example, the shades pane 220 has been used to add two shades (represented by shades 302a and 302b) of shade type 225a to the load control system as described herein. The fixtures pane 210 has been used to add ten fixtures of type F1 and F2 to the load control system. And the devices pane 211 has been used to add two remote control devices to the load control system, including a remote control represented by remote control icon 306. Remote control icon 306 may represent a control-source device that is capable of controlling a control target device via wireless signals. In this example, shades 302a and 302b may represent shades that include electrical motor drives that are capable of being controlled via wireless signals, such as wireless signals from devices represented by remote control icon 306. A user may desire to graphically show that the shade represented by shade 302a should be controlled by a remote control 306. To do this, the user may select connect control tool 209 and thereafter move a cursor to, for example, remote control icon 306, and select the icon such as by actuating a button of a mouse. Thereafter, the user may move the cursor to, for example, the operator icon and/or panel icon of shade 302a, and select the icon. Upon detecting the selections, the design system may draw a communications connection icon 308 representing that shade 302a is associated with and controlled by remote control 306. In a similar fashion, a power supply may be defined and a representative icon added to the canvas 202. Thereafter, a user may use connect control tool 209 to create a power or electrical connection between the power supply icon and shade 302a to show that the shade is powered by the power supply. Other examples are possible.

Figure 12:
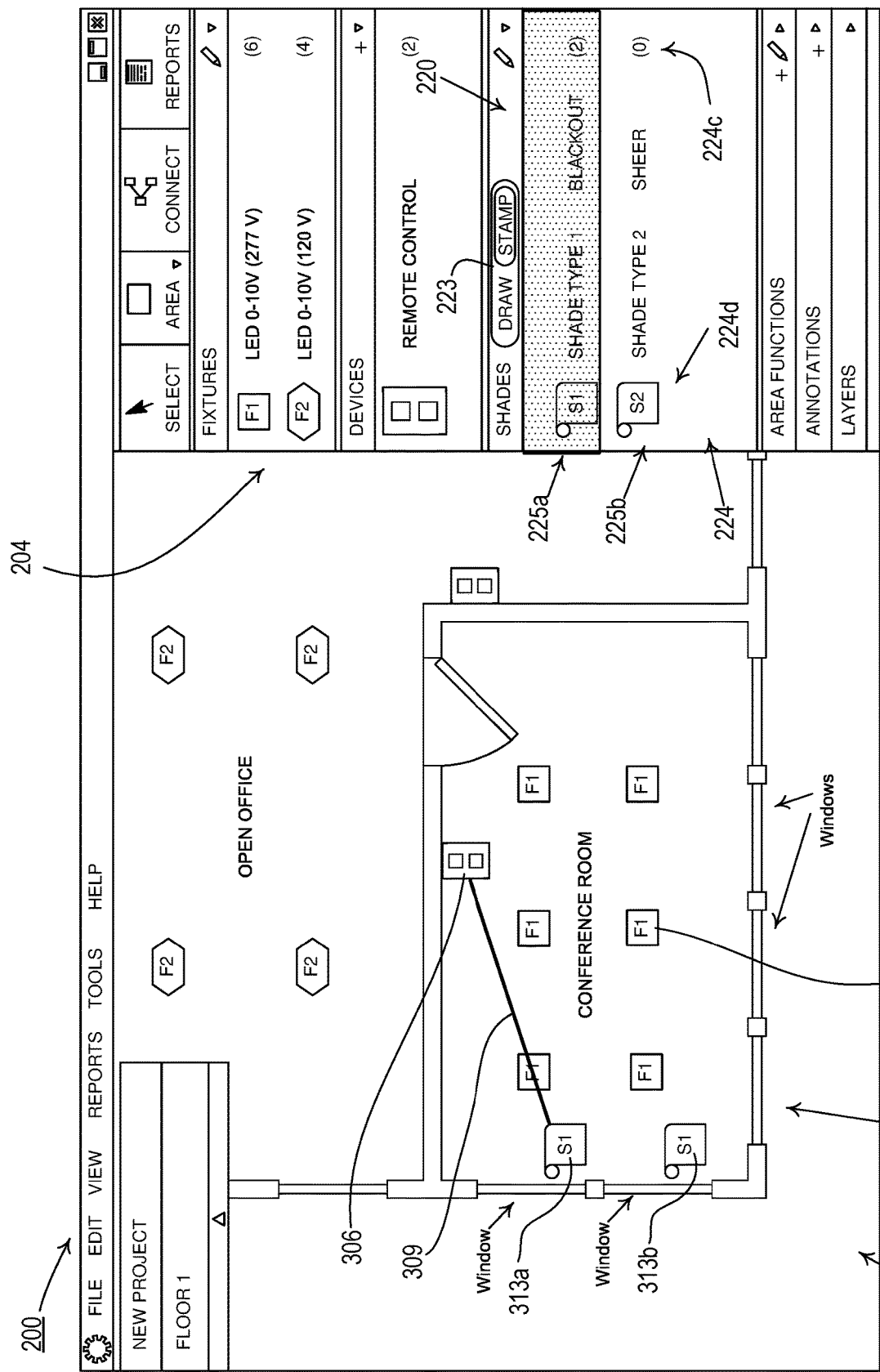

As indicted, the shades pane 220 may include draw/stamp control icon 223 that allows a user to define shades in the canvas 202 in two different fashions—by either drawing the shade (when the "draw" control is activated) as discussed above, or by placing/stamping an icon of a shade (when the "stamp" control is activated). Thus far an example process for "drawing" shades in canvas 202 has been described. Turning now to FIG. 12, there is shown an example of the design window 200 with the "stamp" control of the draw/stamp control icon 223 now activated. When activated, shade type section 224 may change appearance with icons 224d now being added for each defined shade type 225a and 225b. As indicated, the design system may associate a different color with each shade type. Each respective icon 225a and 225b may be of a color that matches the color of its shade type. A name (here "S1" and "S2") may also be associated with each icon. The name may be defined by a user or the design system. According to this example, a user may select from shade type section 224 a defined shade type 225a or 225b, as discussed above. The design system may highlight to the user the selected shade type upon the user making the selection (here, shade type 225a is highlighted). Thereafter, the user may move a cursor to the canvas 202. Upon detecting the cursor has moved to the canvas 202, the design system may change the cursor to a different form as discussed above. Thereafter, the user may move the cursor to a desired location at which the user would like to place a shade, and actuate the mouse button for example. Upon detecting actuation of the mouse button, the design system may display at the location of the cursor an icon corresponding to the icon 224d of the selected shade type. In this example, two shade icons 313a and 313b have been added to the canvas 202. In addition, as a user adds shades to the canvas, the design system may also update in the shade type section 224 of the shade pane 220 an indication that a new shade has been added to the canvas 202. The indication may include incrementing the number 224c of the shade type just defined (e.g., here the value "2" is shown). As similarly discussed above, the design system may also allow or enable the user to select with the mouse, for example, the shade icons 313a and 313b in canvas 202. Once selected, the user may move the selected shade icon within the canvas 202, delete the shade icon from the canvas (with the number 224c decrementing), copy and paste another instance of the icon in the canvas (with the number 224c incrementing), etc. In addition, as similarly discussed with respect to FIG. 11, a user may define graphical representations of connections (e.g., electrical and/or communication connections) and/or associations between the shades added to the canvas 202 and other devices, etc., such as shown by connection 309. One will recognize that a user may both "draw" and "stamp" shades in the canvas 202.

As compared to drawing shades, when stamping shades in canvas 202, the shade lengths and/or heights for the added shades may not be defined. Similarly, the design system may not determine errors or problems for such shades.

At any time, the design system may allow a user to save the configuration information of the load control system within a database, for example. The design system may allow the user to later recall the configuration information of the load control system from the database, display the configuration information of the load control system on the canvas 202, and update the configuration information of the load control system. The design system may allow the user to print the configuration information of the load control system as shown on the canvas 202. According to a further aspect of the design system, the design system may allow a user to create a parts list from the configuration information of the load control system, and to save and print this list. Such a parts list may be useful for quote generation and for order generation. For each shade defined for the load control system, the parts list may include for each shade the shade style, fabric style, shade length, number of panels and length and height of each panel, roller dimensions, operator type, etc. The design system may also determine additional information from a shade as defined by a user, such as types and amount of hardware needed to install the shade. The design system may also provide as part of the parts list any determined errors or warnings for each shade. If the user has defined two shades, for example that may be installed on the same window (e.g., a sheer and blackout as shown in FIG. 9), the design system may detect this configuration and include in the parts list any special hardware to mount two shades to the same window. One will recognize that other information may be determined and stored and produced.

Figure 13:
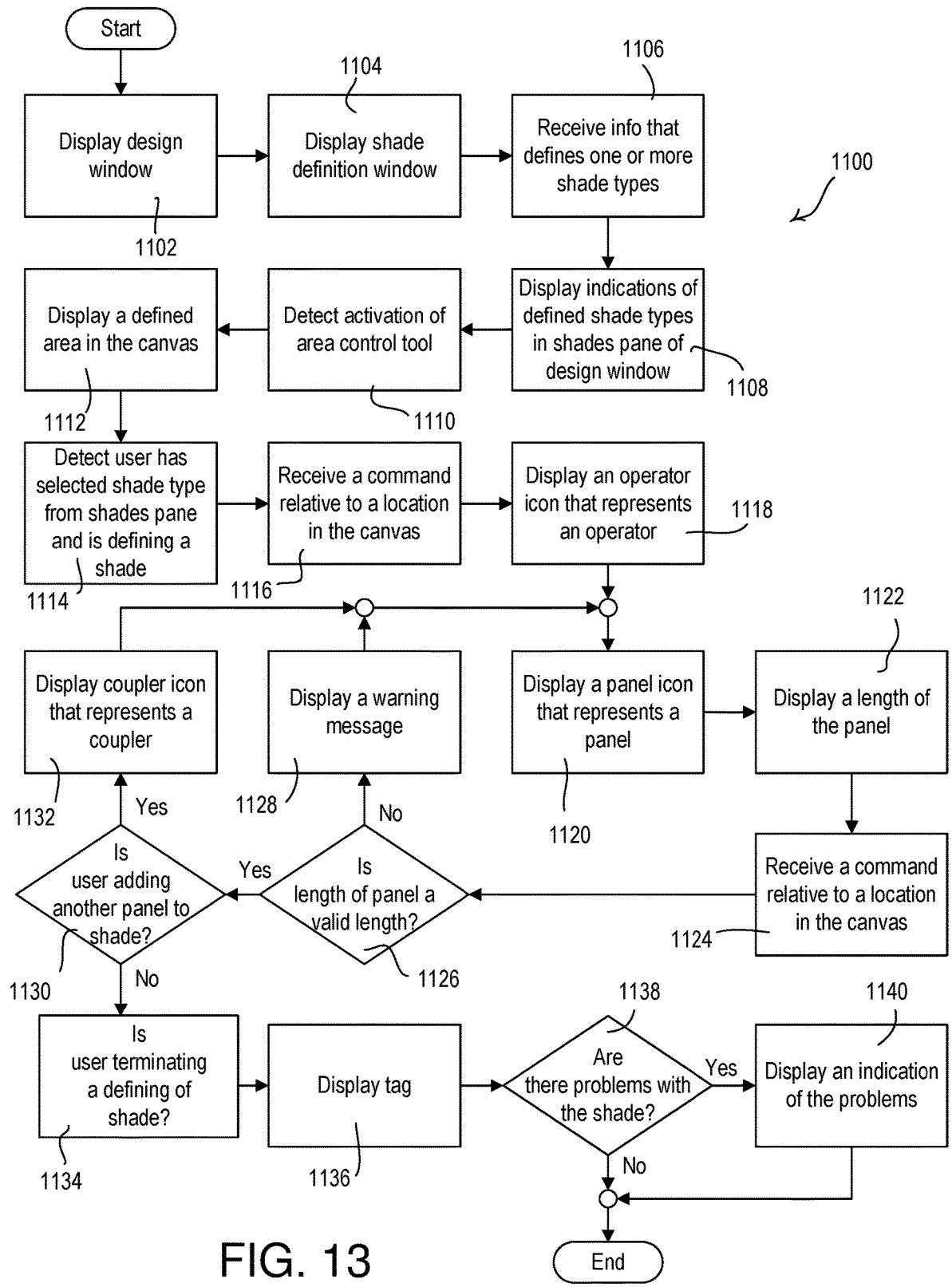
FIG. 13 is an example process for defining, designing, laying out, and/or configuring a load control system.

Referring now to FIG. 13, there is shown an example process 1100 for defining a load control system that includes shades, for example. At step 1102, the design system may display to a user on a display terminal the design window 200 that may include the canvas 202 and the palette 204. The palette 204 may include the control pane 205 and the shades pane 220. The control pane may include the area control tool 207. At step 1104, the system may display to the user on the display terminal the shade definition window 400. This displaying may be the result of the user actuating icon 222, for example. The shade definition window 400 may be configured to enable the user to provide information for defining shade types. At step 1106, the design system may receive from the user information entered by the user in the shade definition window 400. The information received from the user may define at least one shade type. Responsive in part to receiving from the user the information that defines the shade type(s), at step 1108 the design system may display to the user in the shades pane 220 an indication of the shade type(s) (e.g., in the shade type section 224).

At step 1110, the design system may detect that the user activates the area control tool 207. Responsive in part to detecting that the user activates the area control tool 207, at step 1112 the design system may next determine that the user defines a graphical representation of an area in the canvas 202, and display the defined area (e.g., area 500) to the user in the canvas 202. Again, it may not be necessary to define an area/space to define shades.

At step 1114, the design system may detect that the user selects a defined shade type from the shade pane 220. The selecting of the shade type may enable the user to define in the canvas 202 a graphical representation (e.g., icon 610) of a physical shade of the selected shade type. Subsequent to determining that the user selects a shade type, at step 1116 the design system may determine that the user places the cursor 602 at a first location in the canvas 202 (such as in the defined area 500), and may determine that the user enters a first command relative to the first location. The first command may include an actuation of a mouse button at the first location, for example. The first command may be an indication that the user is starting a defining of a graphical representation of a physical shade at the first location. Responsive to the user entering the first command, at step 1118 the design system may display to the user in the canvas 202 at the first location an operator icon (e.g., the operator icon 612) that represents an operator for the physical shade.

At step 1120, the design system may next determine that the user moves the cursor to a second location in the canvas 202 that is different from the first location. Responsive to determining that the user moves the cursor to the second location, the design system may display to the user a first panel icon (e.g., the panel icon 614). The first panel icon may be an elongated rectangular icon that represents a first panel of the physical shade, although other shaped icons may be used. The first panel icon may extend from the operator icon (e.g., the operator icon 612) to the cursor (e.g., the cursor 602). Subsequent to determining that the user moves the cursor to the second location, the design system may determine that the user moves the cursor to a third location in the canvas 202 that is different from the first and second locations. Responsive to determining that the user moves the cursor to the third location, the design system may update the display of the first panel icon to extend from the operator icon to the cursor at the third location.

As step 1122, the design system may display to the user a numerical value (e.g., the numerical representation 616) that represents a length of the first panel of the physical shade. The design system may change the numerical value as the cursor moves from the first location to the second location and as the cursor moves from the second location to the third location. In displaying to the user the numerical value that represents the length of the first panel of the physical shade, the design system may determine a length of the first panel icon, and using a defined scale, may convert the determined length to the numerical value. The numerical value may represent a real-world value of a physical shade.

At step 1124, the design system may determine that the user enters a second command (e.g., an actuation of a mouse button) relative to the third location, for example. The second command may be an indication that the user is terminating a defining of the first panel. Responsive in part to the second command, at step 1126 the design system may determine whether the length of the first panel is a valid length. If the length of the first panel is determined to be an invalid length, the design system may display to the user a warning at step 1128 and enable the user to continue defining the first panel in the canvas 202 (i.e., return to step 1220). If the design system determines that the length of the first panel is a valid length, at step 1130 the design system may determine if the user is adding another panel to the shade. The design system may make this determination by determining whether the user enters a third command or moves the cursor, etc. Responsive to determining that the user is adding another panel to the shade, at step 1132 the design system may display to the user a first coupler icon. The first coupler icon may represent a first coupler of the physical shade that connects the first panel to the second panel. Thereafter, the process may proceed back to step 1120 for the user to define the second and possibly other panels.

If, at step 1130, the design system determines that the defining of the shade is not adding another panel to the shade, at step 1134 the design system may determine that the user is terminating a defining of the physical shade. Responsive to determining that the user is terminating a defining of the physical shade, at step 1136 the design system may display to the user in the canvas 202 a tag (e.g. the tag 650) associated with the graphical representation of the physical shade, and may determine at step 1136 whether there are one or more problems with the physical shade as defined at least in part by the first panel icon (or additional panels if so added). If not, the process may end. When it is determined there are one or more problems with the physical shade, at step 1140 the design system may display an indication of the one or more problems to the user, such a through the tag and/or the shades pane 220. Thereafter the process may end. Again, this is a merely an example process.

Figure 14:
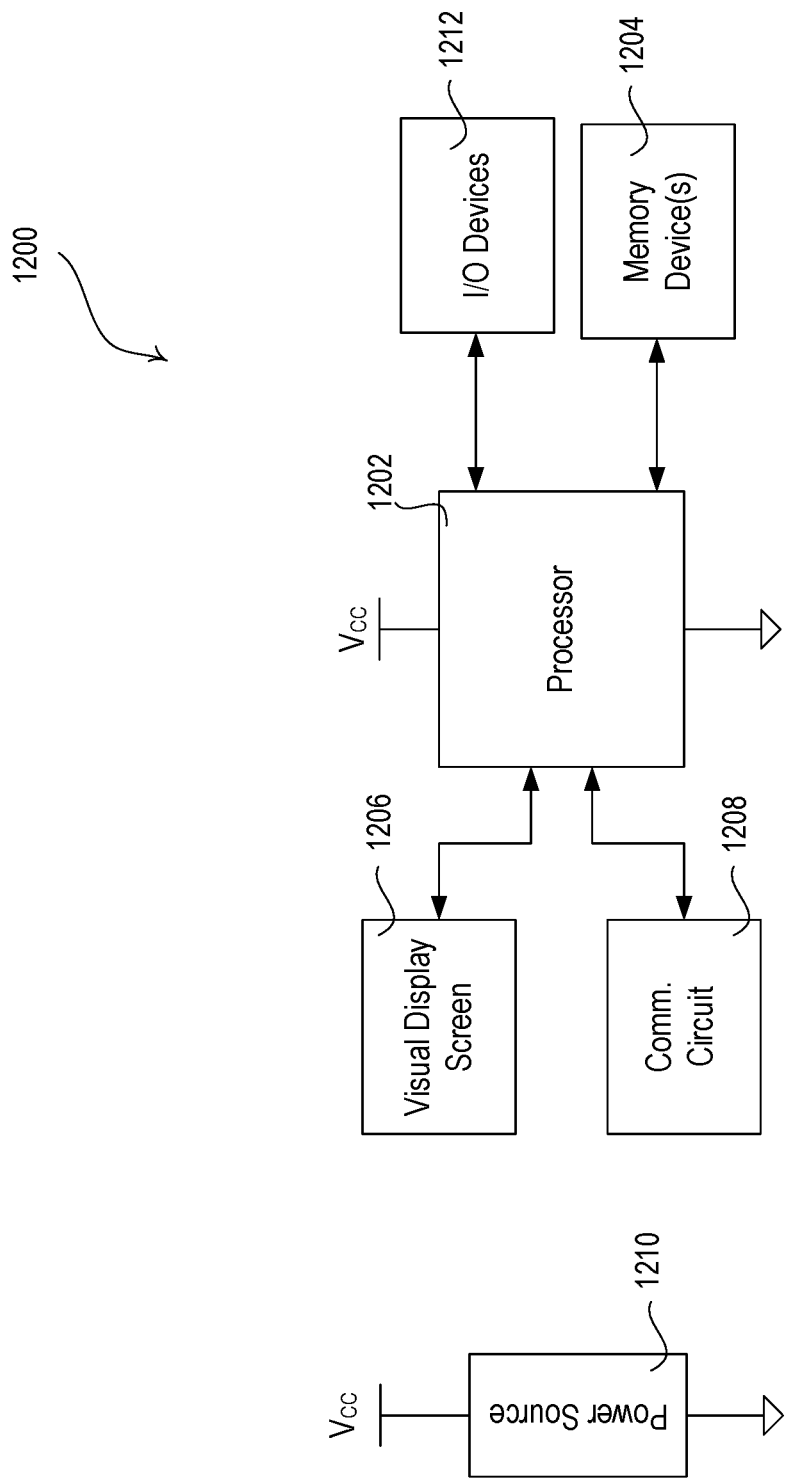
FIG. 14 is a block diagram of an example computing system of a design system for defining, designing, laying out, and/or configuring a load control system.

FIG. 14 shows an example block diagram of a computing system 1200 that may execute the design software, in addition to other software, such an operating system(s), to provide the features and functions described herein. Computing system 1200 may include one or more general purpose processors, special purpose processors, conventional processors, digital signal processors (DSPs), microprocessors, microcontrollers, integrated circuits, programmable logic devices (PLD), application specific integrated circuits (ASICs), or the like and/or may further include other processing element(s) such as one or more graphic processors (hereinafter collectively referred to as processor(s) 1202). Processor(s) 1202 may control the functionality of the computing system and may execute the design software, in addition to other software applications such an operating system(s), database management systems, etc. The processor(s) 1202 may also perform signal coding, data processing, power control, input/output processing, and any other functionality that enables the computing system 1200 to perform as described herein. The computing system 1200 may also include one or more memory modules/devices 1204 (including volatile and non-volatile memory modules/devices) which may be non-removable memory modules/devices and/or removable memory modules/devices. Memory modules/devices 1204 may be communicatively coupled to the processor(s) 1202. Non-removable memory modules/devices 1204 may include random-access memory (RAM), read-only memory (ROM), a hard disk, or any other type of non-removable memory storage. Removable memory modules/devices 1204 may include a subscriber identity module (SIM) card, a memory stick, a memory card, or any other type of removable memory. The one or more memory modules/devices 1204 may store the design software and/or may also provide an execution space as the processor(s) execute the design software. Computing system 1200 may also include a visual display screen(s)/terminal(s) 1206 that may be communicatively coupled to the processor(s) 1202. Together with processor(s) 1202, visual display screen(s) 1206 may display information to the user via GUI based interfaces/GUI based "windows" as described herein. The display screen(s) 1206 and the processor(s) 1202 may be in two-way communication, as the display screen(s) 1206 may include a touch sensitive visual screen module(s) capable of receiving information from a user and providing such information to the processor(s) 1202. Computing system 1200 may also include one or more input/output (I/O) devices 1212 (e.g., a keyboard(s), a touch sensitive pad(s), a mouse(s), a trackball(s), audio speaker(s), audio receiver(s), etc.) that may be communicatively coupled to the processor(s) 1202. The I/O devices may allow the user to interact with the design software as described herein. Computing system 1200 may further include one or more transceivers and/or communications circuits (collectively, communications circuits 1208) for communicating (transmitting and/or receiving) over wired and/or wireless commination networks, for example. The communications circuit(s) 1208 may include an RF transceiver(s) or other circuit(s) capable of performing wireless communications via an antenna(s), light, etc. Communications circuit(s) 1208 may be in communication with processor(s) 1202 for transmitting and/or receiving information. Each of the modules within the computing system 1200 may be powered by a power source 1210. The power source 1210 may include an AC power supply or DC power supply, for example. The power source 1210 may generate a supply voltage Vcc for powering the modules within the computing system 1200.

As indicated, the design software may be one or more software based modules that may include computer based instructions that are stored on, in whole or in part, one or more computer readable tangible and/or non-transitory memory devices/modules and/or that execute from one or more memory devices/modules of the computing system as indicated above. Features of the design software may also and/or alternatively be provided by firmware and/or hardware in addition to/as an alternative to software based modules.

As indicated above, the design system discussed herein may be a standalone system or in other words, a system where the design software (e.g., the GUI software, logic engine, and database(s)/database management system(s)) may execute on computing system 1200, for example. Alternatively and/or in addition, the design system may communicate with one or more database(s)/database management system(s) via communications circuit(s) 1208 of computing system 1200, for example. As another example, the design system may be a distributed system or in other words, a system where the design software (e.g., the GUI software, logic engine, and database(s)) executes on multiple computing systems each having a form, for example, similar to computing system 1200 and with each of the computing systems being networked over a wired and/or wireless communication systems/networks. For example, the GUI software, logic engine, and/or database(s)/database management system(s) may each execute in whole or in part from multiple different computing systems having a form, for example, similar to computing system 1200 and with each of the computing systems being networked over a wired and/or wireless communication systems/networks. In one aspect, such a distributed system may be a web-based system. Again, computing system 1200 is merely an example and the design software may execute on other types of computing systems.

The design system described herein may have several advantages. For example, while adding shade icons to a graphical representation of a load control system, like icons 313a and 313b shown in FIG. 12 for example, allows a user to a define a load control system, such icons do not allow a user to visually understand how such shades may appear as they do not actually run along the length of the windows that may appear in an imported floor plan(s) of a load control environment in the canvas 202. It also makes for a graphical representation of a load control system that is somewhat difficult for a user to quickly locate the shades. This may be problematic for installers, for example. These issues becomes somewhat more problematic when there is a need to define multiple shades for one window, like that shown in FIG. 9. "Drawing" shades, as described herein, allows a user to position a shade icon along the entire length of the window, like icons 302a and 302b shown in FIG. 11 for example, with these icons being more readily understood to be shades. As an alternative to drawing shades as described herein, a system may provide numerous predefined shade icons that "appear" like shade 610 of FIG. 6G, or like shade 1000 of FIG. 10C, and that a user may select and add to canvas 202. However, it may be difficult, inefficient, and timely for a user to determine which icon matches the size of a window as shown in an imported floor plan(s) of a load control environment in the canvas 202, and to create multi-panel shades as the user may need to place numerous icons in the canvas to create a shade. The design system describe herein overcomes these problems. In addition, as noted herein, shades of certain defined lengths (as defined by as user) and/or configurations (as defined through window 400 of FIG. 4, for example) may cause problems, such as not being of a configuration that can be manufactured, that may not operate, that may appear aesthetically bad (be "V" shaped for example), etc. The design system described herein may determine one or more of these problems and issues in real-time as a shade is being added to the load control system, allowing the user to make modifications in real-time. Without such features, a user may define a load control system with shades and thereafter once completed, be told by a manufacture of the shade, for example, that the shade cannot be made or may look aesthetically bad. As a result, the user may need to once again redesign the load control system, again wasting time. Another advantage if the design system described herein is that it may automatically determine a location of an operator (left-side vs right-side) and show the operator in the graphical representation of the load control system. This may have an advantage for electricians as they may readily determine from the load control system where to run electrical and/or communication wires in a physical space. In addition, location of the operator may dictate how a shade is manufactured, including how the panel fabric, for example, is wound on a roller. The design system determining the operator side may prevent manufacturing errors, for example, that may be the result of a user mistakenly defining the wrong side. One will recognize these are merely examples, and the design system described herein may include additional, fewer, and/or other advantages.

While the defining, designing, laying out, and/or configuring a load of a load control system has been described herein as a sequence of steps and features, one will recognize that a design system need not provide all such steps and features, may provide additional steps and features, and may provide discussed steps and features in different orders than described herein.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure. The following sections provide a guide to interpreting the present application.

What is claimed is:

1. A method comprising:
   displaying by at least one processor to a user on a display terminal a design window that comprises a canvas and a palette, wherein the palette comprises a shades pane;
   displaying by the at least one processor to the user in the shades pane an indication of a shade type;
   detecting by the at least one processor that the user selects the shade type from the shades pane, wherein selecting the shade type enables the user to define in the canvas a graphical representation of a physical shade of the selected shade type;
   subsequent to determining that the user selects the shade type, determining by the at least one processor that the user places a cursor at a first location in the canvas, and determining by the at least one processor that the user enters a first command relative to the first location, wherein the first command comprises an indication that the user is defining a graphical representation of a physical shade of the selected shade type at the first location;
   responsive to the user entering the first command, displaying by the at least one processor to the user in the canvas at the first location an operator icon that represents a drive unit of the physical shade;
   subsequent to displaying the operator icon, determining by the at least one processor that the user moves the cursor to a second location in the canvas that is different from the first location;
   responsive to determining that the user moves the cursor to the second location, displaying by the at least one processor to the user a first panel icon, wherein the first panel icon represents a first panel of the physical shade, wherein the first panel icon extends from the operator icon to at least the cursor, and wherein the first panel of the physical shade comprises two different dimensions including a length and a vertical height;
   displaying by the at least one processor to the user a numerical value that represents the length of the first panel of the physical shade, wherein the numerical value changes as the cursor moves from the first location to the second location;
   determining by the at least one processor that the user enters a second command, wherein the second command comprises an indication that the user is terminating a defining of the first panel;
   subsequent to the second command, determining by the at least one processor whether the user is terminating the defining of the physical shade or is adding a second panel to the physical shade; and
   responsive to determining that the user is terminating the defining of the physical shade:
   determining by the at least one processor whether the length of the first panel of the physical shade, as defined by the user through the first panel icon, will cause a problem with the physical shade, wherein the problem includes whether the physical shade will sag because of the length; and when it is determined that the length of the first panel of the physical shade, as defined by the user through the first panel icon, will cause a problem with the physical shade, displaying by the at least one processor an indication of the problem to the user on the display terminal.

2. The method of claim 1,
wherein determining that the user moves the cursor to the second location comprises determining that the user moves the cursor to a third location in the canvas that is different from the first and second locations; and
wherein the method further comprises:
   responsive to determining that the user moves the cursor to the third location, updating by the at least one processor the display of the first panel icon to extend from the operator icon to the cursor at the third location.

3. The method of claim 1, further comprising:
when it is determined that the length of the first panel will not cause a problem with the physical shade, enabling by the at least one processor the user to at least one of terminate the defining of the first panel or terminate the defining of the physical shade.

4. The method of claim 1, further comprising:
responsive to determining that the user is adding the second panel to the physical shade, determining by the at least one processor that the user moves the cursor to a third location in the canvas that is different from the first and second locations; and
responsive to determining that the user moves the cursor to the third location, displaying by the at least one processor to the user a second panel icon, wherein the second panel icon represents the second panel of the physical shade.

5. The method of claim 4, wherein terminating the defining of the first panel comprises terminating the defining of the first panel at the second location; and
   wherein the method further comprises displaying by the at least one processor at the second location a coupler icon, wherein the coupler icon represents a coupler of the physical shade that connects the first panel to the second panel, and wherein the first panel icon extends from the operator icon to the coupler icon.

6. The method of claim 5, wherein displaying to the user the second panel icon comprises displaying the second panel icon as extending from the coupler icon to at least the cursor.

7. The method of claim 6, further comprising:
storing by the at least one processor the length of the first panel as a default length;
as the user moves the cursor with respect to adding the second panel, determining by the at least one processor that a length of the second panel as determined from the second panel icon is within a defined length of the default length; and
automatically extending by the at least one processor a length of the second panel icon as displayed in the canvas to be a same length as the first panel icon as displayed in the canvas.

8. The method of claim 7, further comprising:
enabling by the at least one processor the user to over-ride the automatically extending of the length of the second panel icon;
determining by the at least one processor that the user is over-riding the automatically extending of the length of the second panel icon; and displaying by the at least one processor the length of the second panel icon based at least in part on the user over-riding the automatically extending of the length of the second panel icon.

9. The method of claim 1,
wherein the drive unit of the physical shade is a left-side drive unit or a right-side drive unit; and
wherein the method further comprises:
   responsive to determining that the user is terminating the defining of the physical shade, determining by the at least one processor for the user whether the drive unit of the physical shade is a left-side drive unit or a right-side drive unit, wherein determining whether the drive unit of the physical shade is a left-side drive unit or a right-side drive unit is determined at least in part on the operator icon.

10. The method of claim 9, further comprising:
determining by the at least one processor that the user moved within the canvas a location of the graphical representation of the physical shade; and
responsive to determining that the user moved within the canvas the location of the graphical representation of the physical shade, determining by the at least one processor for the user whether the drive unit of the physical shade has changed from a left-side drive unit or a right-side drive unit to a right-side drive unit or a left-side drive unit respectively.

11. The method of claim 1, wherein displaying to the user the numerical value that represents the length of the first panel of the physical shade comprises:
determining a length of the first panel icon; and
converting the determined length to the numerical value using a defined scale.

12. An apparatus comprising:
at least one processor; and
at least one tangible non-transitory memory device communicatively coupled to the at least one processor and having software instructions stored thereon that when executed by the at least one processor direct the at least one processor to:
display to a user on a display terminal a design window that comprises a canvas and a palette, wherein the palette comprises a shades pane;
display to the user in the shades pane an indication of a shade type;
detect that the user selects the shade type from the shades pane, wherein selecting the shade type enables the user to define in the canvas a graphical representation of a physical shade of the selected shade type;
subsequent to determining that the user selects the shade type, determine that the user places a cursor at a first location in the canvas, and determine that the user enters a first command relative to the first location, wherein the first command comprises an indication that the user is defining a graphical representation of a physical shade of the selected shade type at the first location;
responsive to the user entering the first command, display to the user in the canvas at the first location an operator icon that represents a drive unit of the physical shade;
subsequent to displaying the operator icon, determine that the user moves the cursor to a second location in the canvas that is different from the first location;
responsive to determining that the user moves the cursor to the second location, display to the user a first panel icon, wherein the first panel icon that represents a first panel of the physical shade, wherein the first panel icon extends from the operator icon to at least the cursor, and wherein the first panel of the physical shade comprises two different dimensions including a length and a vertical height;

display to the user a numerical value that represents the length of the first panel of the physical shade, wherein the numerical value changes as the cursor moves from the first location to the second location;

determine that the user enters a second command, wherein the second command comprises an indication that the user is terminating a defining of the first panel;

subsequent to the second command, determine whether the user is terminating the defining of the physical shade or is adding a second panel to the physical shade; and responsive to determining that the user is terminating the defining of the physical shade:

determine whether the length of the first panel of the physical shade, as defined by the user through the first panel icon, will cause a problem with the physical shade, wherein the problem includes whether the physical shade will sag because of the length; and when it is determined that the length of the first panel of the physical shade, as defined by the user through the first panel icon, will cause a problem with the physical shade, display an indication of the problem to the user on the display terminal.

13. The apparatus of claim 12, wherein the software instructions, when executed by the at least one processor, further direct the at least one processor to:

display to the user on the display terminal a shade definition window, wherein the shade definition window is configured to enable the user to provide information for defining shade types; and receive from the user information entered by the user in the shade definition window, wherein the information received from the user defines the shade type shown in the shades pane; and wherein to display to the user in the shades pane the indication of the shade type is responsive in part to receiving the information.

14. The apparatus of claim 12, wherein to determine that the user moves the cursor to the second location comprises to determine that the user moves the cursor to a third location in the canvas that is different from the first and second locations; and wherein the software instructions, when executed by the at least one processor, further direct the at least one processor to:

responsive to determining that the user moves the cursor to the third location, update the display of the first panel icon to extend from the operator icon to the cursor at the third location.

15. The apparatus of claim 12, wherein the software instructions, when executed by the at least one processor, further direct the at least one processor to:

when it is determined that the length of the first panel will cause a problem with the physical shade, enable the user to continue a defining of the first panel in the canvas.

16. The apparatus of claim 15, wherein the software instructions, when executed by the at least one processor, further direct the at least one processor to:

when it is determined that the length of the first panel will not cause a problem with the physical shade, enable the user to at least one of terminate the defining of the first panel or terminate the defining of the physical shade.

17. The apparatus of claim 12, wherein the software instructions, when executed by the at least one processor, further direct the at least one processor to enable the user to correct the problem.

18. The apparatus of claim 12, wherein the software instructions, when executed by the at least one processor, further direct the at least one processor to:

responsive to determining that the user is adding the second panel to the physical shade, determine that the user moves the cursor to a third location in the canvas that is different from the first and second locations; and responsive to determining that the user moves the cursor to the third location, display to the user a second panel icon, wherein the second panel icon represents the second panel of the physical shade.

19. The apparatus of claim 18, wherein terminating the defining of the first panel comprises terminating the defining of the first panel at the second location; and wherein the software instructions, when executed by the at least one processor, further direct the at least one processor to display at the second location a coupler icon, wherein the coupler icon represents a coupler of the physical shade that connects the first panel to the second panel, and wherein the first panel icon extends from the operator icon to the coupler icon.

20. The apparatus of claim 19, wherein to display to the user the second panel icon comprises to display the second panel icon as extending from the coupler icon to at least the cursor.

21. The apparatus of claim 20, wherein the software instructions, when executed by the at least one processor, further direct the at least one processor to:

store the length of the first panel as a default length;

as the user moves the cursor with respect to adding the second panel, determine that a length of the second panel as determined from the second panel icon is within a defined length of the default length; and automatically extend a length of the second panel icon as displayed in the canvas to be a same length as the first panel icon as displayed in the canvas.

22. The apparatus of claim 21, wherein the software instructions, when executed by the at least one processor, further direct the at least one processor to:

enable the user to over-ride the automatically extending of the length of the second panel icon;

determine that the user is over-riding the automatically extending of the length of the second panel icon; and display the length of the second panel icon based at least in part on the user over-riding the automatically extending of the length of the second panel icon.

23. The apparatus of claim 12, wherein the drive unit of the physical shade is a left-side drive unit or a right-side drive unit; and wherein the software instructions, when executed by the at least one processor, further direct the at least one processor to:

responsive to determining that the user is terminating the defining of the physical shade, determine for the user whether the drive unit of the physical shade is a left-side drive unit or a right-side drive unit, wherein determining whether the drive unit of the physical shade is a left-side drive unit or a right-side drive unit is determined at least in part on the operator icon.

24. The apparatus of claim 23, wherein the software instructions, when executed by the at least one processor, further direct the at least one processor to:

determine that the user moved within the canvas a location of the graphical representation of the physical shade; and responsive to determining that the user moved within the canvas the location of the graphical representation of the physical shade, determine for the user whether the drive unit of the physical shade has changed from a left-side drive unit or a right-side drive unit to a right-side drive unit or a left-side drive unit respectively.

25. The apparatus of claim 23,
wherein the palette further includes an area control tool; and
wherein the software instructions, when executed by the at least one processor, further direct the at least one processor to:
  detect that the user activates the area control tool; and
  responsive in part to detecting that the user activates the area control tool, determine that the user defines a graphical representation of an area in the canvas, and display the graphical representation of the area to the user in the canvas.

26. The apparatus of claim 25, wherein:
the graphical representation of the physical shade is located within the graphical representation of the area; and
to determine for the user whether the drive unit of the physical shade is a left-side drive unit or a right-side drive unit is based at least in part on the location of the graphical representation of the physical shade in the graphical representation of the area.

27. The apparatus of claim 12, wherein to display to the user the numerical value that represents the length of the first panel of the physical shade comprises to:
determine a length of the first panel icon; and
convert the determined length to the numerical value using a defined scale.

28. A tangible non-transitory memory device having software instructions stored thereon that when executed by at least one processor direct the at least one processor to:
display to a user on a display terminal a design window that comprises a canvas and a palette, wherein the palette comprises a shades pane;
display to the user in the shades pane an indication of a shade type;
detect that the user selects the shade type from the shades pane, wherein selecting the shade type enables the user to define in the canvas a graphical representation of a physical shade of the selected shade type;
subsequent to determining that the user selects the shade type, determine that the user places a cursor at a first location in the canvas, and determine that the user enters a first command relative to the first location, wherein the first command comprises an indication that the user is defining a graphical representation of a physical shade of the selected shade type at the first location;
responsive to the user entering the first command, display to the user in the canvas at the first location an operator icon that represents a drive unit of the physical shade;
subsequent to displaying the operator icon, determine that the user moves the cursor to a second location in the canvas that is different from the first location;
responsive to determining that the user moves the cursor to the second location, display to the user a first panel icon, wherein the first panel icon that represents a first panel of the physical shade, wherein the first panel icon extends from the operator icon to at least the cursor, and wherein the first panel of the physical shade comprises two different dimensions including a length and a vertical height;

display to the user a numerical value that represents the length of the first panel of the physical shade, wherein the numerical value changes as the cursor moves from the first location to the second location;

determine that the user enters a second command, wherein the second command comprises an indication that the user is terminating a defining of the first panel;

subsequent to the second command, determine whether the user is terminating the defining of the physical shade or is adding a second panel to the physical shade; and responsive to determining that the user is terminating the defining of the physical shade:
determine whether the length of the first panel of the physical shade, as defined by the user through the first panel icon, will cause a problem with the physical shade, wherein the problem includes whether the physical shade will sag because of the length; and
when it is determined that the length of the first panel of the physical shade, as defined by the user through the first panel icon, will cause a problem with the physical shade, display an indication of the problem to the user on the display terminal.

29. The tangible non-transitory memory device of claim 28, wherein the software instructions, when executed by the at least one processor, further direct the at least one processor to:
display to the user on the display terminal a shade definition window, wherein the shade definition window is configured to enable the user to provide information for defining shade types; and
receive from the user information entered by the user in the shade definition window, wherein the information received from the user defines the shade type shown in the shades pane; and
wherein to display to the user in the shades pane the indication of the shade type is responsive in part to receiving the information.

30. The tangible non-transitory memory device of claim 28,
wherein to determine that the user moves the cursor to the second location comprises to determine that the user moves the cursor to a third location in the canvas that is different from the first and second locations; and
wherein the software instructions, when executed by the at least one processor, further direct the at least one processor to:
  responsive to determining that the user moves the cursor to the third location, update the display of the first panel icon to extend from the operator icon to the cursor at the third location.

31. The tangible non-transitory memory device of claim 28,
wherein the software instructions, when executed by the at least one processor, further direct the at least one processor to:
when it is determined that the length of the first panel will cause a problem the physical shade, enable the user to continue a defining of the first panel in the canvas.

32. The tangible non-transitory memory device of claim 31, wherein the software instructions, when executed by the at least one processor, further direct the at least one processor to:

when it is determined that the length of the first panel will not cause a problem with the physical shade, enable the user to at least one of terminate the defining of the first panel or terminate the defining of the physical shade.

33. The tangible non-transitory memory device of claim 28, wherein the software instructions, when executed by the at least one processor, further direct the at least one processor to enable the user to correct the problem.

34. The tangible non-transitory memory device of claim 28, wherein the software instructions, when executed by the at least one processor, further direct the at least one processor to:
responsive to determining that the user is adding the second panel to the physical shade, determine that the user moves the cursor to a third location in the canvas that is different from the first and second locations; and
responsive to determining that the user moves the cursor to the third location, display to the user a second panel icon, wherein the second panel icon represents the second panel of the physical shade.

35. The tangible non-transitory memory device of claim 34,
wherein terminating the defining of the first panel comprises terminating the defining of the first panel at the second location; and
wherein the software instructions, when executed by the at least one processor, further direct the at least one processor to display at the second location a coupler icon, wherein the coupler icon represents a coupler of the physical shade that connects the first panel to the second panel, and wherein the first panel icon extends from the operator icon to the coupler icon.

36. The tangible non-transitory memory device of claim 35, wherein to display to the user the second panel icon comprises to display the second panel icon as extending from the coupler icon to at least the cursor.

37. The tangible non-transitory memory device of claim 36, wherein the software instructions, when executed by the at least one processor, further direct the at least one processor to:
store the length of the first panel as a default length;
as the user moves the cursor with respect to adding the second panel, determine that a length of the second panel as determined from the second panel icon is within a defined length of the default length; and
automatically extend a length of the second panel icon as displayed in the canvas to be a same length as the first panel icon as displayed in the canvas.

38. The tangible non-transitory memory device of claim 37, wherein the software instructions, when executed by the at least one processor, further direct the at least one processor to:
enable the user to over-ride the automatically extending of the length of the second panel icon;
determine that the user is over-riding the automatically extending of the length of the second panel icon; and
display the length of the second panel icon based at least in part on the user over-riding the automatically extending of the length of the second panel icon.

39. The tangible non-transitory memory device of claim 28,
wherein the drive unit of the physical shade is a left-side drive unit or a right-side drive unit; and
wherein the software instructions, when executed by the at least one processor, further direct the at least one processor to:
responsive to determining that the user is terminating the defining of the physical shade, determine for the user whether the drive unit of the physical shade is a left-side drive unit or a right-side drive unit, wherein determining whether the drive unit of the physical shade is a left-side drive unit or a right-side drive unit is determined at least in part on the operator icon.

40. The tangible non-transitory memory device of claim 39, wherein the software instructions, when executed by the at least one processor, further direct the at least one processor to:
determine that the user moved within the canvas a location of the graphical representation of the physical shade; and
responsive to determining that the user moved within the canvas the location of the graphical representation of the physical shade, determine for the user whether the drive unit of the physical shade has changed from a left-side drive unit or a right-side drive unit to a right-side drive unit or a left-side drive unit respectively.

41. The tangible non-transitory memory device of claim 40,
wherein the palette further includes an area control tool;
wherein the software instructions, when executed by the at least one processor, further direct the at least one processor to:
detect that the user activates the area control tool; and
responsive in part to detecting that the user activates the area control tool, determine that the user defines a graphical representation of an area in the canvas, and display the graphical representation of the area to the user in the canvas;
wherein the graphical representation of the physical shade is located within the graphical representation of the area; and
wherein to determine for the user whether the drive unit of the physical shade is a left- side drive unit or a right-side drive unit is based at least in part on the location of the graphical representation of the physical shade in the graphical representation of the area.

42. The tangible non-transitory memory device of claim 28, wherein to display to the user the numerical value that represents the length of the first panel of the physical shade comprises to:
determine a length of the first panel icon; and
convert the determined length to the numerical value using a defined scale.

* * * * *